(12) United States Patent
Hong et al.

(10) Patent No.: US 8,543,177 B2
(45) Date of Patent: Sep. 24, 2013

(54) SUPERCONDUCTING MAGNET SYSTEMS

(75) Inventors: Zhiyong Hong, Guangzhou (CN);
Timothy Arthur Coombs, Cambridge (GB)

(73) Assignee: Mignifye Limited, Cambridge (GB)

( * ) Notice: Subject to any disclaimer, the term of this patent is extended or adjusted under 35 U.S.C. 154(b) by 318 days.

(21) Appl. No.: 13/127,680

(22) PCT Filed: Oct. 15, 2009

(86) PCT No.: PCT/GB2009/051381
§ 371 (c)(1),
(2), (4) Date: May 4, 2011

(87) PCT Pub. No.: WO2010/052482
PCT Pub. Date: May 14, 2010

(65) Prior Publication Data
US 2011/0212840 A1   Sep. 1, 2011

(30) Foreign Application Priority Data
Nov. 4, 2008 (GB) .................................. 0820162.6

(51) Int. Cl.
*H01L 39/00* (2006.01)
(52) U.S. Cl.
USPC ........................................................ 505/150
(58) Field of Classification Search
USPC .......................... 505/150, 211, 879; 335/216
See application file for complete search history.

(56) References Cited

U.S. PATENT DOCUMENTS

| 2005/0110492 | A1 | 5/2005 | Watkins | |
| 2011/0212840 | A1* | 9/2011 | Hong et al. | 505/150 |
| 2012/0135868 | A1* | 5/2012 | Huang et al. | 505/211 |

FOREIGN PATENT DOCUMENTS

WO    WO 01/20756 A    3/2001

OTHER PUBLICATIONS

International Search Report for corresponding PCT/GB2009/051381, completed by Wilhem Volmer of the EPO.
Brideson, M.A., et al., "Winding Patterns for Biplanar MRI shim coils with rectangular and circular target-field regions", Measurement Science & Technology IOP Publishing, UK, vol. 15, No. 5, May 2004, pp. 1019-1025.
Zhao, H., et al., "A Hybrid, inverse approach to the design of magnetic resonance imaging magnets", Medical Physics, vol. 27, No. 3, Mar. 2000.
Zhao, H., et al., "Compact Clinical MRI magnet design using a multilayer current density approach", Magnetic Resonance in Medicine Wiley USA, vol. 45, No. 2, Feb. 2001, pp. 331-340.

* cited by examiner

*Primary Examiner* — Colleen Dunn

(57) ABSTRACT

We describe a superconducting magnet system for generating a uniform magnetic field. The system has at least three magnets in two sets, a first of the sets comprising an oppositely disposed pair of superconducting magnets, a second of the sets comprising at least one further magnet. The further magnet is disposed such that there exists a 3D region in which a magnet field produced by the further magnet is substantially parallel to a magnetic field produced by the pair of superconducting magnets. One of the sets of magnets is configured to produce first, bulk component of the magnetic field in the 3D region and a second of the sets of magnets is configured to produce a correction to the bulk component of the magnetic field in the 3D region to reduce a non-uniformity of the bulk component of the magnetic field in the 3D region.

20 Claims, 45 Drawing Sheets

- ⊙ Red : current flow into the screen (R)
- ⊚ Blue : current flow out of the screen (B)

2nd order polynomial

L/d between 0.5 and 1

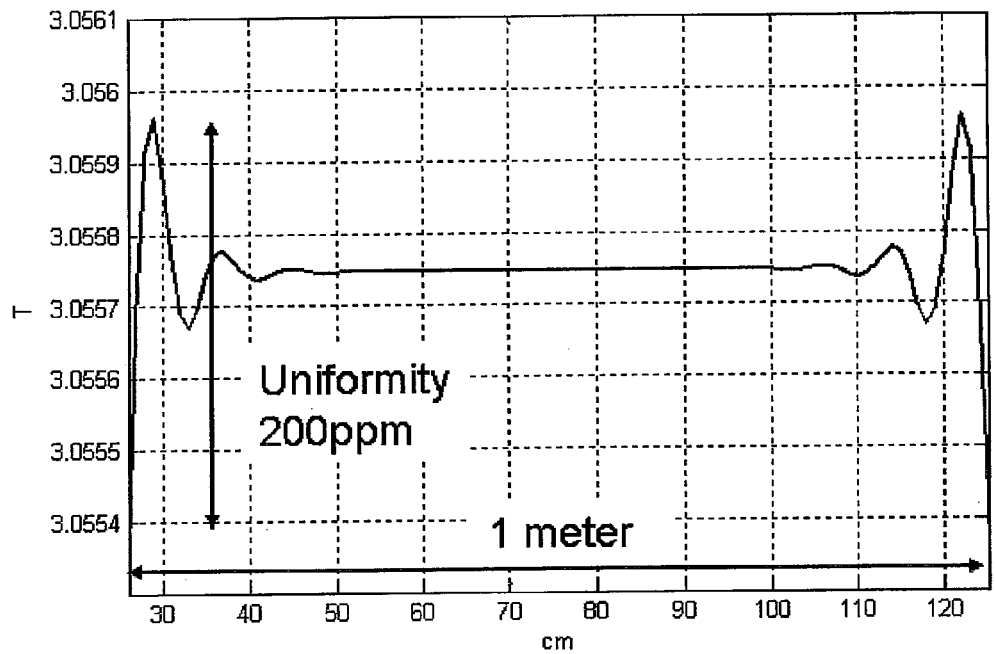
Figure 48
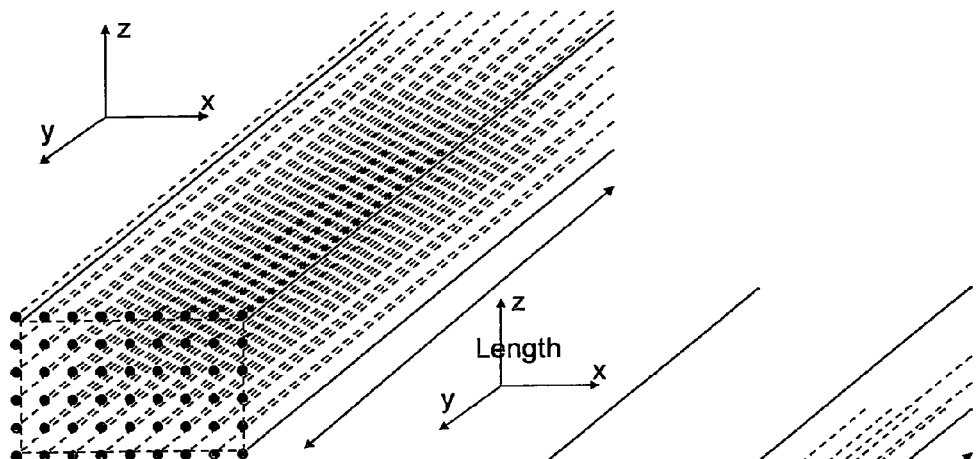
Figure 49
Figure 51

SUPERCONDUCTING MAGNET SYSTEMS

This application corresponds to PCT/GB2009/051381, filed Oct. 15, 2009, which claims the benefit of Patent Application No. GB 0820162.6, filed Nov. 4, 2008, the subject matter, of which is incorporated herein by reference in their entirety.

FIELD OF THE INVENTION

This invention relates to systems and methods for generating magnetic fields, in particular of high uniformity, using superconducting magnets.

BACKGROUND TO THE INVENTION

We will describe methods of creating a dipole magnet using high temperature superconductors as sources of magnetic fields. We take as an example a dipole which is to produce a vertical magnetic field over a total volume of 50×30×1000 mm, as shown in FIG. 1. In the example to, allow space for an electron beam vacuum chamber and room temperature to cold transitions the vertical magnet pole gap should be 60 mm (i.e. the superconductors must be spaced (at least) 60 mm apart). In this example the field is required to be uniform to +/−0.01% and the integrated field is required to be uniform to +/−0.05%). In the example, the minimum flux density for the magnet should be 3 Tesla.

Traditionally a uniform field will be produced using a $\cos \theta$ winding. This approach uses a variable pitched winding in which the current in each winding is the same. This winding is based on spacing conductors around a cylindrical axis according to the cosine of their position thereby producing a field which varies sinusoidally around the cylinder and results in uniform field in the centre of the cylinder.

Background prior art can be found in: US 2006/0261812 A1; GB 2289343 A; US 2007/0146107 A1; GB 2433600; U.S. Pat. No. 5,479,144; U.S. Pat. No. 5,389,907; U.S. Pat. No. 4,683,434; JP 10-328159; JP 63-281411; and GB 2285313 A.

However an alternative approach would be to use bulk superconductors as the source of the magnetic field. YBCO bulks are able to trap significant amount of magnetic field. Currently the highest trapped fields are claimed by the Japanese (Tomita M and Murakami M "high-temperature superconductor bulk magnets that can trap magnetic fields of over 17 T at 29 K "*Nature* 421 517-20) with 17.24 Tesla in a 2.65 cm puck at 29 Kelvin.

SUMMARY OF THE INVENTION

According to a first aspect of the invention there is therefore provided a superconducting magnet system for generating a uniform magnetic field, the system comprising at least three magnets in two sets, at least a first of said sets comprising an oppositely disposed pair of superconducting magnets, a second of said sets comprising at least one further magnet, wherein said further magnet is disposed such that there exists a three dimensional region in which a magnet field produced by said further magnet is substantially parallel to a magnetic field produced by said pair of superconducting magnets, and wherein one of said sets of magnets is configured to produce first, bulk component of said magnetic field in said three dimensional region and a second of said sets of magnets is configured to produce a correction to said bulk component of said magnetic field in said three dimensional region to reduce a non-uniformity of said bulk component of said magnetic field in said three dimensional (3D) region.

In one group of embodiments the oppositely disposed superconducting magnets provide the bulk or majority of the magnetic field, in particular by generating fields which in-between the magnets run substantially perpendicularly from one of the superconducting magnets to the other. This creates a field which is close to uniform and the further magnet is then employed to, in effect, flatten the field in a small region adjacent this magnet. In embodiments this further magnet is also superconducting, and in embodiments is located roughly centrally between the oppositely disposed magnets. However it is not essential for this further magnet to be superconducting since depending upon the configuration (size, shape, spacing, strength and the like) of the oppositely disposed superconducting magnets only a small additional field may be needed to generate a highly uniform local field in the vicinity of the further magnet. This form of open arrangement may be employed, for example, in an MRI (magnetic resonance imaging) machine where, for example, the further magnet may be within or associated with an MRI probe. This provides the possibility of a very open structure for such an MM imaging machine with a probe with a magnetic field flattening magnet used for local imaging in the vicinity of the magnet.

Thus the invention also provides an MRI or NMR machine and/or probe incorporating or configured for use with such a superconducting magnet system.

In other embodiments the further magnet is a superconducting magnet and is used to provide the bulk of the magnetic field and the oppositely disposed pair of magnets are used to provide a correcting or flattening field to reduce non-uniformities in a 3-dimensional region between the oppositely disposed magnets. In this configuration the further, superconducting magnet will generally be disposed to one side of the pair of oppositely disposed magnets, whereas in the alternative configuration described above the further magnet providing the correcting or flattening field will generally be disposed between the oppositely disposed superconducting magnets. In both cases the field lines in the uniform field 3D region will run between the oppositely disposed magnets, generally perpendicular to these magnets. Broadly speaking in embodiments, in the uniform field 3D region the correcting field and bulk component of the field are substantially parallel to one another and directed in either the same direction or in opposite directions, to either "fill in" or "cancel out" non-uniformities in the bulk component of the magnetic field.

In preferred embodiments the superconducting magnets, and optionally also the further (superconducting) magnet, comprise an array of generally cylindrical magnets with a circular or rectangular/square cross-section, these being arranged along a Z- or depth direction, that is perpendicular to a plane in which the field lines of the substantially uniform field lie. In embodiments the superconducting magnets producing the bulk component of the magnetic field comprise generally cylindrical magnets which extend longitudinally substantially parallel to the field lines, in such an arrangement the oppositely disposed (superconducting) magnets providing the correcting field. The oppositely disposed magnets providing the correcting field may also comprise generally cylindrical magnets, although other configurations, for example thin film superconducting magnets, may also be employed. In embodiments the oppositely disposed pair of superconducting magnets may comprise multiple oppositely disposed pairs of superconducting magnets, more particularly more than one (pair) of magnets in a direction extending away from a superconducting magnet providing the bulk component of the magnetic field.

In embodiments a "closed" system of superconducting magnets is employed in which a first pair of oppositely disposed superconducting magnets is employed to provide the bulk component of the magnetic field and a second pair of, preferably superconducting, magnets, arranged orthogonally to the first pair, is employed to provide the uniformity-correction to the bulk magnetic field. As mentioned above, multiple pairs of correcting magnets may be disposed along a line or in a plane between the pair of superconducting magnets creating the bulk field. Again as mentioned above, in some preferred embodiments one or both of the pair of magnets creating the bulk field and the pair(s) of magnets creating the correction field may comprise an array of superconducting magnets extending in the aforementioned Z- or depth direction.

Thus in embodiments the geometry is such that the magnetic field lines between a pair of oppositely directed magnets define a first direction, more particularly a plane comprising the field lines, and the superconducting magnet system extends in a third (Z) direction substantially orthogonal to this first direction. The edges of the cylindrical magnets define planes (looked at in cross-section through a magnetic field plane appearing as substantially straight lines). In embodiments the lines or planes of the magnets creating the bulk component correcting component of the magnetic field are substantially orthogonal to one another.

In a related aspect the invention provides a superconducting magnet system comprising first and second oppositely disposed arrays of superconducting magnets to produce a first set of magnetic field lines and at least one further magnet disposed between or to one side of said oppositely disposed arrays.

Preferably the further magnet is located such that there is at least one (1, 2 or 3 dimensional) region in which field lines from the further magnet are substantially parallel to field lines from the oppositely disposed arrays; these field lines may be in the same or the opposite direction to the field lines from the oppositely disposed arrays.

In some preferred embodiments the further magnet comprises a superconducting magnet or an array of superconducting magnets. Optionally a pair of such further superconducting magnets is disposed opposite to one another, preferably substantially orthogonal to the oppositely disposed arrays of superconducting magnets. Again as previously described, multiple said further magnets or pairs of said further magnets may be arranged along a line between the oppositely disposed arrays.

The invention still further provides a method of creating a uniform magnetic field using a superconducting magnet system, the method comprising providing a majority of said uniform magnetic field using a first, superconducting magnet system and correcting non-uniformities in a 3D region of desired uniform magnetic field using a second magnet system, wherein at least one of said magnet systems comprises oppositely disposed magnets with magnetic field lines extending between substantially perpendicularly between them.

The invention still further provides apparatus comprising means to implement a method as described above.

The skilled person will understand that a superconducting magnet effectively comprises a set of circulating currents. Thus in aspects and embodiments of the above described invention optionally superconducting wire or tape may be employed to provide a superconducting magnet, wound in effect as if it were the magnet. Where reference is made to the possibility of the further magnet providing the correcting field being non-superconducting, this may either be a permanent magnet or a solenoid or other current carrying magnetic device. As we describe later, multiple pairs of superconducting magnets may be employed to provide the correcting field, for example multiple cylindrical magnets each set arranged along a line in the Z or "depth" direction. However in embodiments although these pairs of magnets are adjacent to one another, because there are gaps between pairs of correcting magnets the effects of the circulating currents do not completely cancel one another (illustrated in more detail later).

Thus the invention still further provides a superconducting magnet system for generating a uniform magnetic field, the system comprising: first and second sets of superconducting pucks or solenoids along each of first and second sides of the superconducting magnet system; third and fourth set of superconducting pucks or solenoids along each of third and fourth sides of the superconducting magnet system; and wherein at least one of the said first, second, third and fourth sets of superconducting pucks or solenoids has a magnetisation of said superconducting pucks or solenoids which varies along a longitudinal direction of said superconducting magnet system; wherein said variation has a waveshape which has an amplitude which increases towards an end of said superconducting magnet system; wherein said waveshape has the form of a ringing pulse having an amplitude which decays in a direction away from said end towards a centre of said superconducting magnet system; and wherein said waveshape defines magnetisation values of said superconducting pucks or solenoids at discrete positions at which said superconducting pucks or solenoids are located.

In embodiments by employing superconducting pucks or solenoids along each of the lateral sides and the top and bottom of the superconducting magnet system the magnetisation of each of the pucks/solenoids can be varied to generate a waveshape having the form of a ringing pulse as described. Since the magnetic field of a puck/solenoid $B=J_c d$ where $J_c$ is the current density and d is the diameter of the puck/solenoid and thus either or both of $J_c$ and d may be varied to vary the puck/solenoid magnetisation. Embodiments of this arrangement enable an extremely uniform magnetic field to be generated without the use of a very long channel within the lateral and top and bottom pucks/solenoids. By the use of a polynomial or "ringing"—type waveshape, when moving away from the centre of the magnetic system in the longitudinal direction the magnetisation of each puck/solenoid can be used to flatten the field profile for the inner pucks/solenoids. On approaching the ends the amounts of compensation applied increase, giving rise to a counter-intuitive ringing-type waveshape defined at the discrete positions where the pucks/solenoids are located. This allows the total length of the magnet system to be only 50% or 100% greater than the length of the uniform field region within the system. Thus in embodiments the pucks/solenoids of each of the four sets has a variation in magnetisation defined by the decaying ringing pulse type waveshape, and this magnetisation is preferably applied at both ends of the superconducting magnet system.

In a related aspect the invention provides a method of creating a uniform magnetic field using a superconducting magnet system, the method comprising: providing a majority of said uniform magnetic field using first and second set of superconducting pucks or solenoids along each of first and second sides of the superconducting magnet system, and third and fourth set of superconducting pucks or solenoids along each of third and fourth sides of the superconducting magnet system; and compensating for non-uniformities of said magnetic field in a central region of said superconducting magnet system by applying a variation to a magnetisation of at least one of said first, second, third and fourth sets of superconducting pucks or solenoids along a longitudinal direction of said superconducting magnet system, wherein said variation has a waveshape which has an amplitude which increases towards an end of said superconducting magnet system, wherein said waveshape has the form of a ringing pulse having an amplitude which decays in a direction away from said end towards a centre of said superconducting magnet system, and wherein said waveshape defines magnetisation values of said superconducting pucks or solenoids at discrete positions at which said superconducting pucks or solenoids are located.

The invention further provides a method of designing a superconducting magnet system for generating a uniform magnetic field, the method comprising: modelling first and second set of superconducting pucks or solenoids located along each of first and second sides of the superconducting magnet system; third and fourth set of superconducting pucks or solenoids located along each of third and fourth sides of the superconducting magnet system; determining a 3-D magnetic field profile for a central 3-D region of said superconducting magnet system; and adjusting a magnetisation of at least one of the said first, second, third and fourth sets of superconducting pucks or solenoids to compensate for non-uniformity of said 3-D magnetic field profile to determine a set of target magnetisations for said first, second, third and fourth sets of superconducting pucks or solenoids.

Preferably the adjusting comprises determining an average magnetic field strength in the central 3-D region, comparing a field from a superconducting puck/solenoid with this average magnetic field strength, for example to determine a ratio of one to the other, and then using the result to determine a target magnetisation for a puck/solenoid. This procedure is then repeated iteratively, for example by determining a set of magnetisations for each of the first, second, third and fourth sets of superconducting pucks/solenoids, and then repeating this procedure until the field in a predefined (central) 3-D region of the magnet system is uniform to better than a threshold value. Then a superconducting magnet system may be fabricated according to the resulting design.

The invention further provides processor control code to implement the above-described methods, for example on a general purpose computer system. The code is provided on a carrier such as a disk, CD- or DVD-ROM, or programmed memory such as read-only memory (Firmware). Code (and/or data) to implement embodiments of the invention may comprise source, object or executable code in a conventional programming language (interpreted or compiled) such as C, or assembly code. As the skilled person will appreciate such code and/or data may be distributed between a plurality of coupled components in communication with one another.

BRIEF DESCRIPTION OF THE DRAWINGS

These and other aspects of the invention will now be further described, by way of example only, with reference to the accompanying figures which are as follows:

FIGS. 29—3D model of two lines of column magnets, comparison of the field profile between the red line and blue is made to show the uniformity of the field along z axis.

FIGS. 31—3D model of an array of tablet magnets, comparison of the field profile between the red line and blue is made to show the uniformity of the field along z axis.

FIG. 48—The field profile along the 1 meter middle section of the tunnel, the uniformity in this section is 200 ppm.

FIG. 49—Integrated uniformity.

FIG. 51—The points are used to calculate the integrated uniformity.

DETAILED DESCRIPTION OF PREFERRED EMBODIMENTS

The approach described here is tailored for accelerator dipole magnets but another application is NMR/MRI magnets, e.g. an open system where there are magnets above and below the patient. This system differs from a permanent magnet system in the important respect of the way a magnet develops field (non-superconducting permanent magnets need to be shaped into pyramidal structures in order to obtain a uniform magnetic field). A superconducting magnet, which is more akin to a solenoid, produces a different field shape and thus the techniques for producing a uniform field are correspondingly different.

Figure 1:
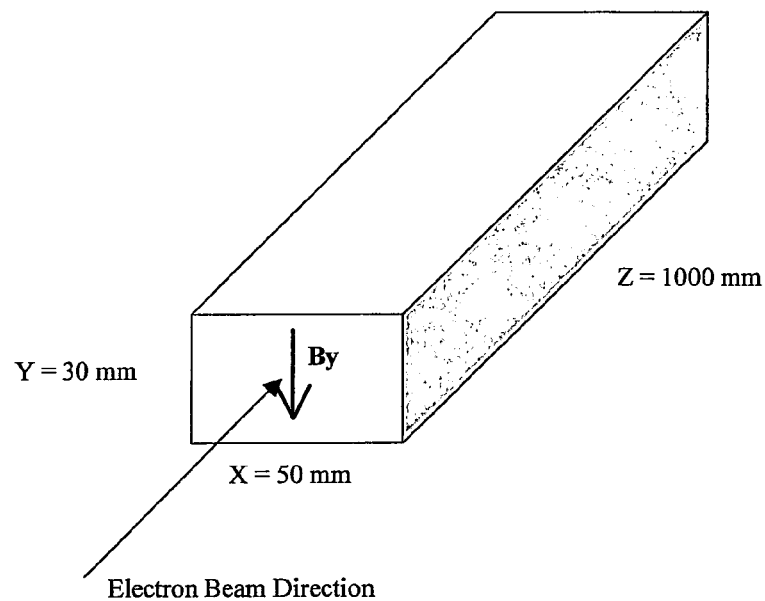
FIG. 1—The volume over which the field is required to be developed, the end faces (XY) are required to be open and the total gap between the superconductors in the Y direction is 60 mm in order to allow for the cryostat and the electron beam vacuum chamber.
Figure 2:
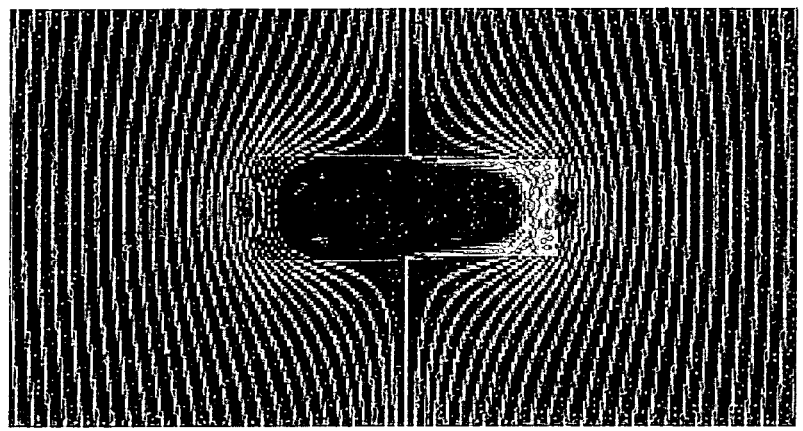
FIG. 2—Magnetization of bulk superconductor.

FIG. 2 illustrates a typical current distribution and trapped flux lines in a superconductor. In this example the superconductor has been placed in a uniform field and has generated currents to produce a uniform field in its centre, exactly cancelling out the applied field. The currents are persistent currents as the superconductor is effectively a permanent magnet. A uniform field can be achieved by placing these superconducting magnets at certain geometry.

The method of magnetizing the superconducting (SC) sample is important when bulk superconductors are used as superconducting magnets. Flux pump technology is one of the most advanced methods for magnetizing superconductors. It significantly reduces the size of magnetizing equipments and the energy required to magnetise the sample. In flux pumping, a field is swept across the superconductor in a magnetic wave. This field induces current according to Faraday's law. As long as the direction of motion of the magnetic wave is consistent then the current induced will always be in the same direction and successive waves will induce more and more current. The magnetic wave would be generated by a solid state method in which a material which changes magnetic state at a suitable magnetic ordering temperature is heated at its edge and the resultant thermal wave produces a magnetic wave which then magnetises the superconductor.

We have described this in more detail in our earlier patent application WO2007/045929, hereby incorporated by reference.

Flux pump technology has two distinct advantages: the first being that flux pump is able to magnetise the superconductors to a high level of magnetic flux density; the other advantage being that flux pump is able to precisely control the current density in superconductors hence can provide a field with very accurate magnitude in each individual superconducting magnet. These two advantages give the possibility of constructing a practical dipole magnet using bulk superconductors.

Round Configuration

Figure 3:
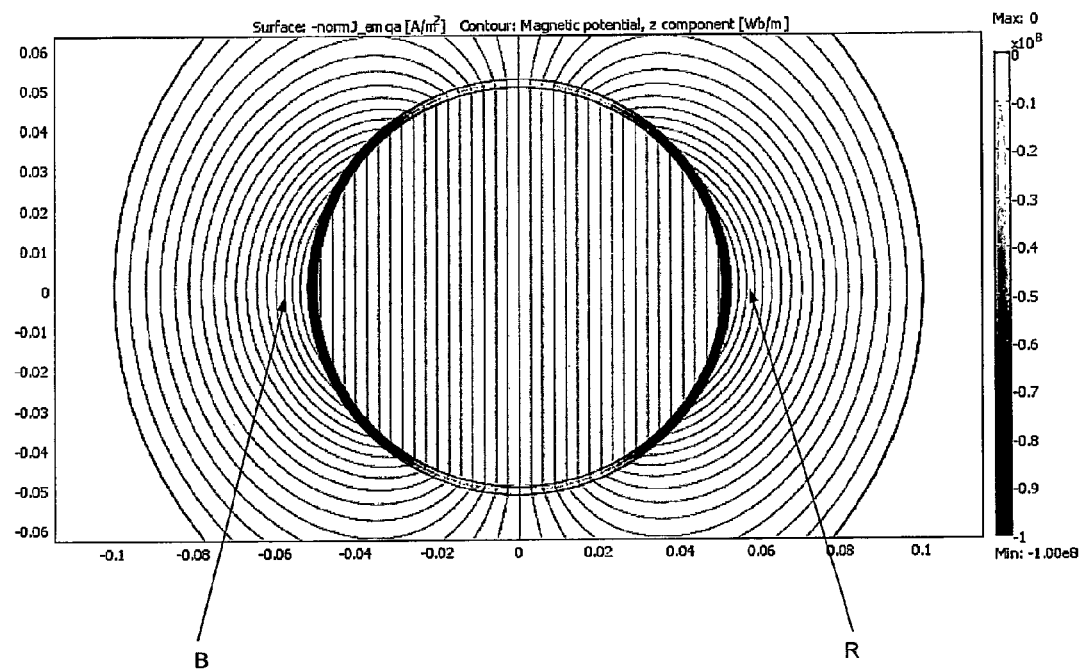
FIG. 3—Ideal situation, the cross section of a YBCO tube. The surface plot is the current density which varies as Jc*cos(θ) on the circle. A perfect uniform field is produced inside the tube.

The study started from the configuration most similar to the geometry used in traditional methods which is a tube with a round cross section. In the study, systems with different configurations of bulk superconducting magnets were investigated. These superconducting magnets were assumed to be magnetised by flux pump. The illustration of FIG. 3 uses a bulk superconductor but a similar technique could employ thin film, thick film or individual turns of wire or tape. The possibility of using bulk superconductors to replace the cos ($\theta$) winding was investigated. The ideal configuration is YBCO tube. A non-uniform current density is applied to the wall of the tube, as shown in FIG. 3.

Figure 4:
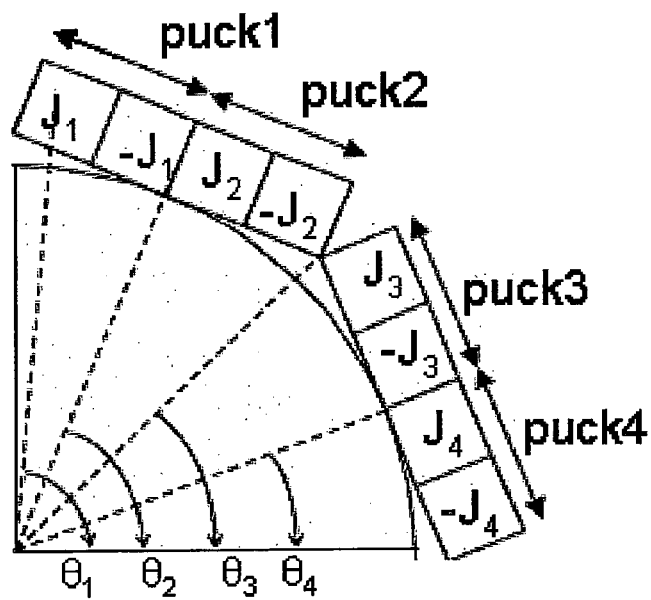
FIG. 4—A quarter of the cross section with four superconducting pucks carrying currents of $J_1$, $J_2$, $J_3$ and $J_4$ FIG. 5—The cross section of the round system with cancellation coil, the transport current in the cancellation coil equals to the current in the end block.

Under practical conditions, the tube has to be geometrically divided into a number of pucks therefore the current density does not vary continuously, shown in FIG. 4. The flux pump is able to control the current density in each puck and make sure the combinations of the current densities between the adjacent pucks agree with the cosine distribution. FIG. 4 shows a quarter of the circle with four superconducting pucks. We assume the current fully penetrates the pucks and each of them carries a different current density. If the maximum current density in this system is $J_c$, the current densities in the pucks are adjusted according to the following equations:

$$J_1 = J_c \cdot \cos(\theta_1)$$

$$J_2 - J_1 = J_c \cdot \cos(\theta_2)$$

$$J_3 - J_2 = J_c \cdot \cos(\theta_3)$$

$$J_4 - J_3 = J_c \cdot \cos(\theta_4)$$

The discrepancy between the practical system and the ideal system (FIG. 3) can be reduced by increasing the number of pucks on the circle.

Figure 5:
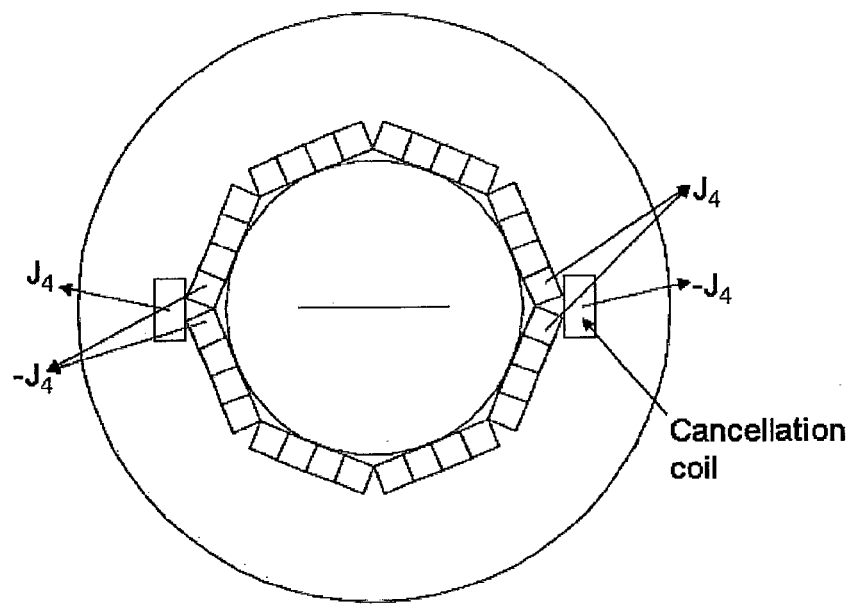

In this system, the current is carried by superconducting bulks rather than wires, which means that the net current in every bulk has to be held at zero. According to equations (1), current density increases from block 1 to block 4 ($J_4 > J_3 > J_2 > J_1$). This leads to the block on the end which carries the largest amount of current density (the block carrying current density of $-J_4$ in FIG. 4) always producing a field opposite to the field produced by the other blocks. This adverse effect significantly reduces the magnitude of field obtained in the centre of the tube. A coil carrying opposite current can be placed next to the end block to eliminate the unwanted field produced by the end block, as shown in FIG. 5.

Figure 6:
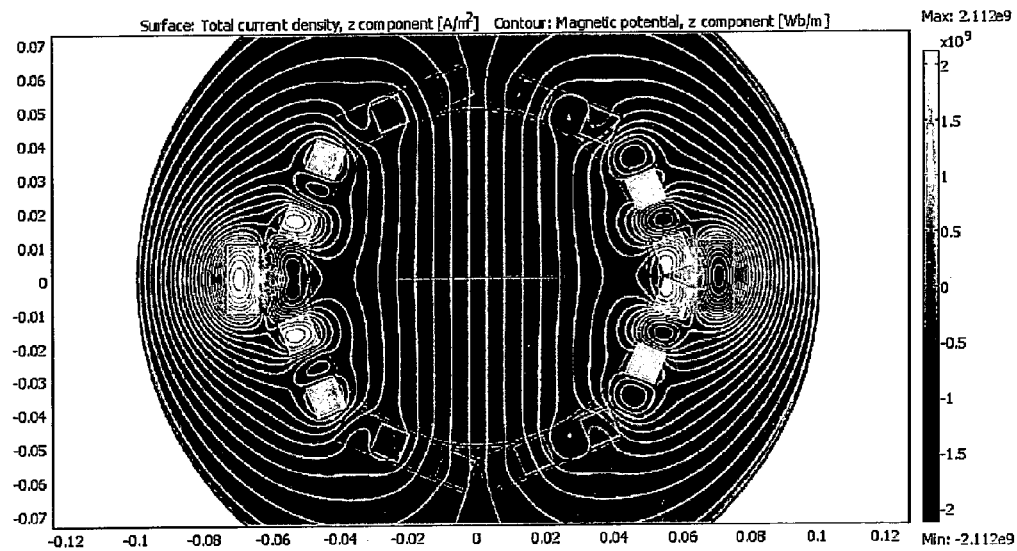
FIG. 6—The current distribution and the magnetic flux line of the round system with cancellation coil.

The simulation result is shown FIG. 6. As can be seen in the figure, the end blocks carry opposite current to the cancellation coil. The uniformity in the central area is +/−0.1%. This uniformity can be improved by increasing the number of blocks on the circle. The magnitude of the field is mainly determined by the maximum current density in the blocks. In this case the maximum current density is $2 \times 10^9$ A/m$^2$ and the magnetic flux density in the central of the tube is around 1 T.

This configuration does not utilise the full potential of the superconducting magnets because the current in the end block which carries the largest amount of current is wasted. Additionally, the requirement of a cancellation coil scarifies one of the most important advantages of bulk superconducting magnets: once magnetized, no further power supply is required. In the following sections we thus focus on a cubic geometry which contains bulk superconductors only. The full potential of superconducting magnets can be utilised.

The basic principle is that the side magnets provide the bulk of the field and the magnets at the top and bottom cancel out the non-uniformity. Results are given in the enclosed document for using one magnet at both the top and the bottom and three magnets at both the top and the bottom. This was the optimal solution for the particular problem being examined. However solutions exist using any number of magnets at the top and the bottom. The number of magnets used is dependent on the magnitude of field required (fewer larger magnets=bigger field) and the uniformity. The top and bottom magnets can be disc shaped or rectangular and the side magnets can be cylindrical or rectangular cylinders. The system may be extrapolated into 3-dimensions as can be seen in the body of the document below and finally it is possible to apply the same principles to "an open system" where one of the sides is omitted which has significant advantages for MRI, NMR and the like.

Rectangular Configuration

Figure 7:
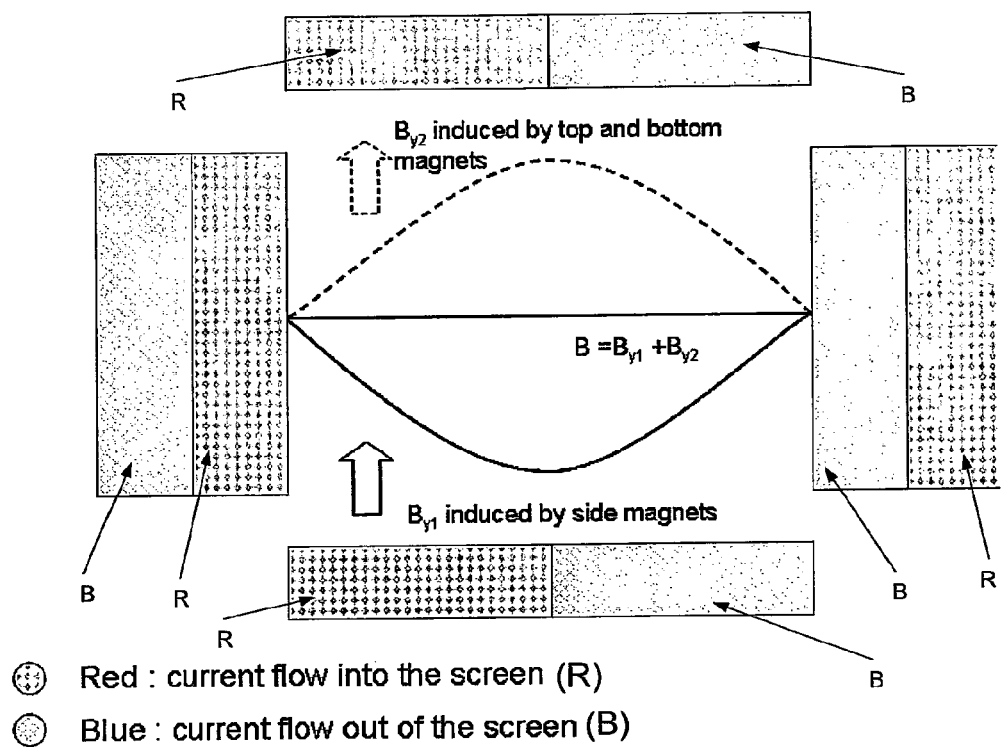
FIG. 7—Using two pairs of SC magnets to produce a uniform field.
Figure 8:
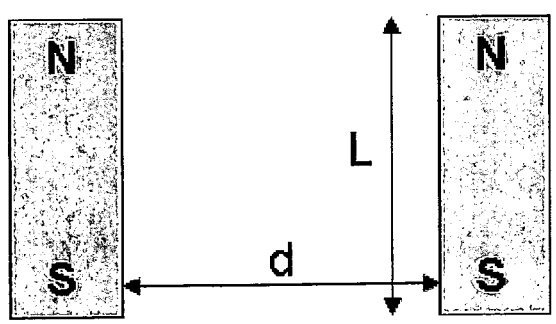
FIG. 8 the geometry and dimension of the side magnets.

This rectangular system comprises two pairs of superconducting magnets. The side magnets produce a background magnetic field and two plate magnets on top and bottom produce a correction field (each plate can contain one or many magnets). The magnitude of the background field is smaller in the centre than on the edge (the solid line curve in FIG. 7), whilst the correction field is larger at the centre than on the edge (the dash line curve in FIG. 7). By carefully adjusting the geometry and the current density in each magnet, the two curves can compensate each other and end up with a uniform field along the central line (the horizontal line).

The methodology of this study is to separately investigate the field produced by the side magnets and the plate magnets using finite element software. Mathematical regression software is then used to fit the profiles of each field into an equation with certain parameters. These equations contain a constant term and a variable term which change with the position between the side magnets. The position and current density in each magnet is adjusted until the variable term from the two field equations cancel out each other. Therefore a uniform field, equal to the sum of the two constant terms can be obtained. The magnitude and the uniformity of the field at the centre of this system are determined by many factors such as the dimension of the magnets, the separation between the magnets in each pair, the value of current density and the number of magnets in the top and bottom plates. The ways in which the field can be affected by these factors will be discussed in the following sections. The investigation starts with two dimensional models and the effect of extending to these to 3D are discussed below.

The Profile of the Field Produced by the Side Magnets

In this section, the field profile produced by the side magnet is investigated. In the two dimensional model, each side magnet is represented by a domain in which half of the area is occupied by the current "flowing into the paper" and half of the area has current "flowing out of the paper". The magnitude of the field between the two side magnets is mainly determined by the value of current density in each magnet, whilst the field profile is determined mainly by two parameters: the separation between two magnets "d" and the length of both of the magnets "L". The model is run with different values of L/d under the same current density and the results are shown in FIGS. 9-11.

Figure 9:
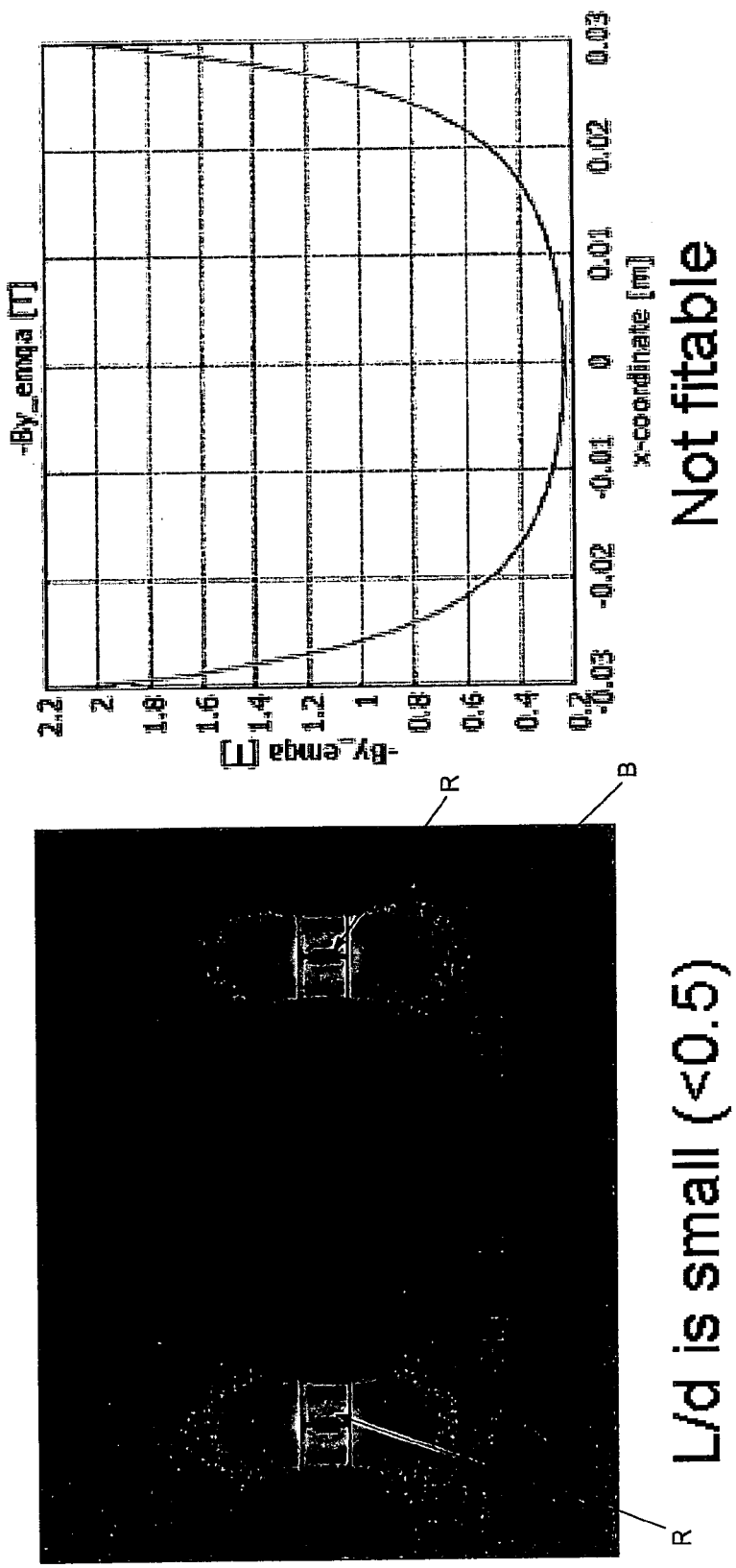
FIG. 9—The field distribution (left) in the plane and the magnetic field profile (right) along the line between the two side magnets when the ratio between L and d is small.

In the situation shown in FIG. 9, the magnets are short. The field drops very quickly from the edge to the centre and the shape of the field profile cannot be fitted into any simple equation.

Figure 10:
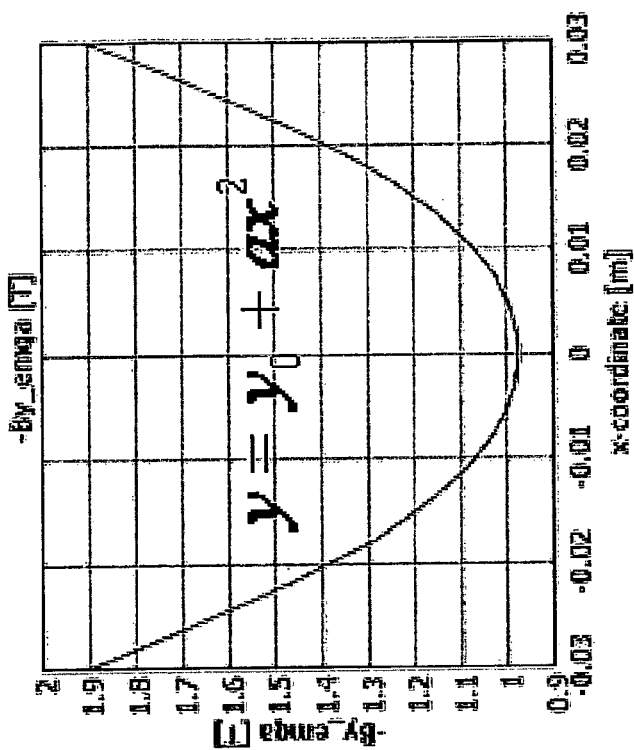
FIG. 10—The field distribution (left) in the plane and the magnetic field profile (right) along the line between the two side magnets when the ratio between L and d is medium.
Figure 10:
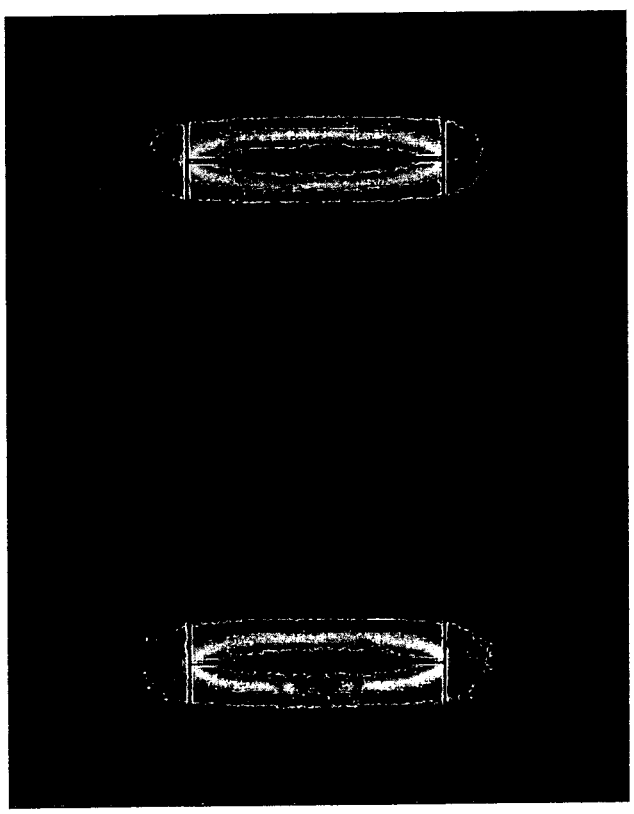
Figure 11:
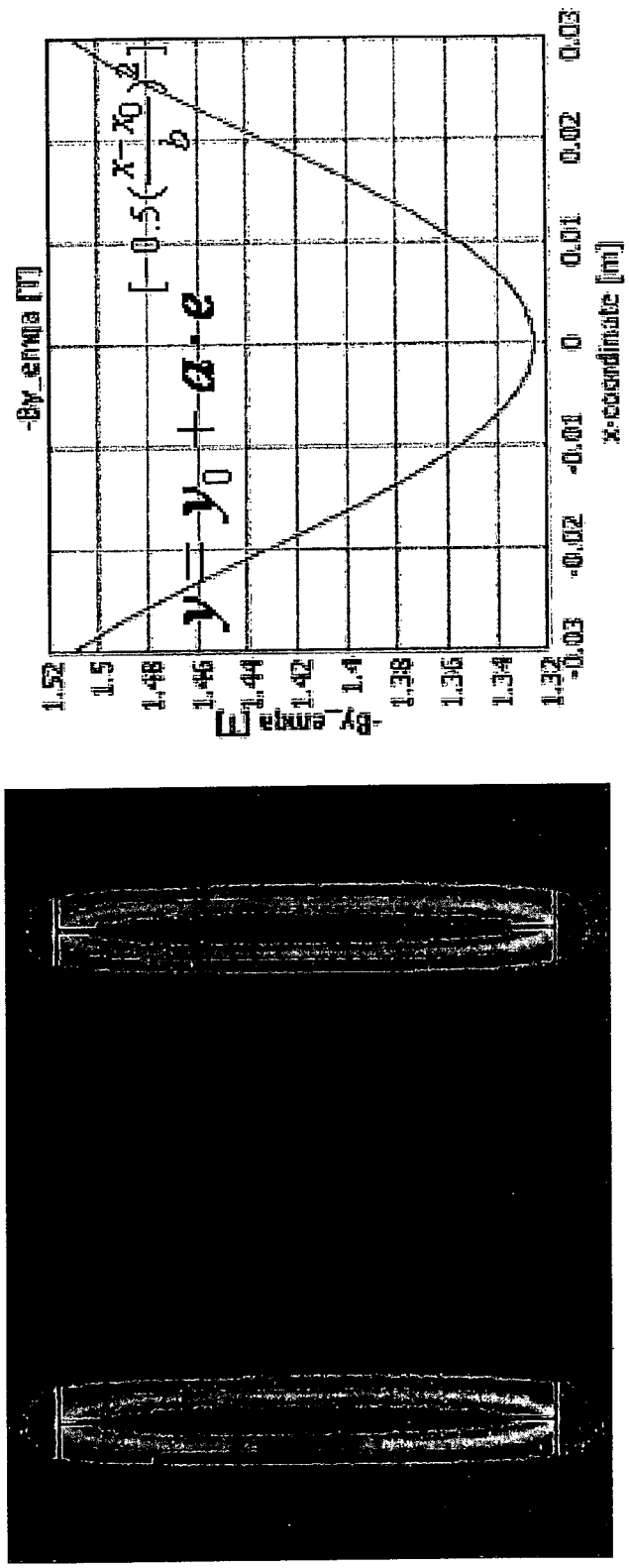
FIG. 11—The field distribution (left) in the plane and the magnetic field profile (right) along the line between the two side magnets when the ratio between L and d is large/

As the length of the magnets increases, shown in FIG. 10, the magnitude of the field in the central area increases and the shape of the field profile changes to a $2^{nd}$ order polynomial curve which can be described as: $B_y=B_0+ax^2$. $B_0$ is the background field and a is a negative number which determines the drop of the field in the x-axis.

When the length of the magnet increases further, the shape of the field profile can be fitted by a Gaussian distribution equation as:

$$B_y = B_0 + a \cdot e^{\left[-0.5\left(\frac{x-x0}{b}\right)^2\right]}$$

where $B_0$ is the background field and the term $$a \cdot e^{\left[-0.5\left(\frac{x-x0}{b}\right)^2\right]}$$

determines the decreased amount of field in the central area.

The Profile of the Field Produced by the Plate Magnets

Figure 12:
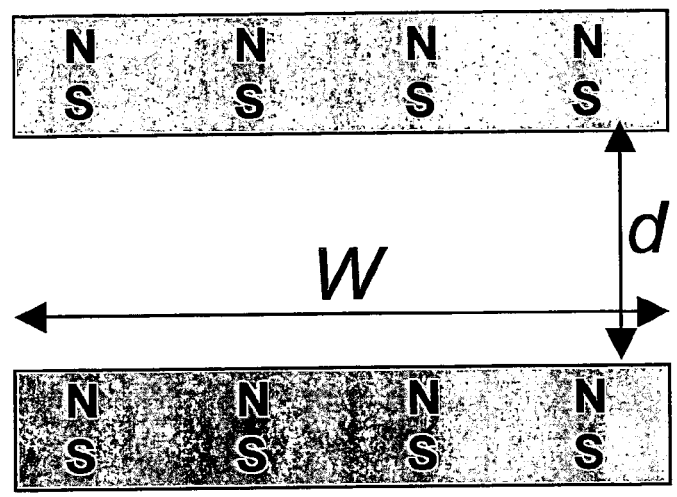
FIG. 12—The geometry and dimension of the plate magnets.

In this section, the profile of the field between the top and bottom plate magnets is investigated. The magnitude of the field and the shape of the field profile are determined by four main factors: the width of the plate (W in FIG. 12), the current density, the distance between the two plates (d in FIG. 12) and the number of magnets in each plate. In this investigation, the value of current density is kept unchanged. A comparison is made of the results obtained with a different number of magnets in each plate and different distances between the two plates.

When parameter d is small, the field profile between the top and bottom magnets is close to the surface field profile of each plate magnets. The field profile changes when the distance between the two magnets increases. Different field profiles can be obtained when the plates contain a different number of magnets. A series of calculations have been carried out to show the field between the plate magnets at four different values of d, i.e. 3 cm, 6 cm, 9 cm and 12 cm. The width of the plate is 12 cm, the thickness of the plate is 1 cm and $J_c$ is assumed to be $1 \times 10^9$ A/m$^2$.

Figure 13:
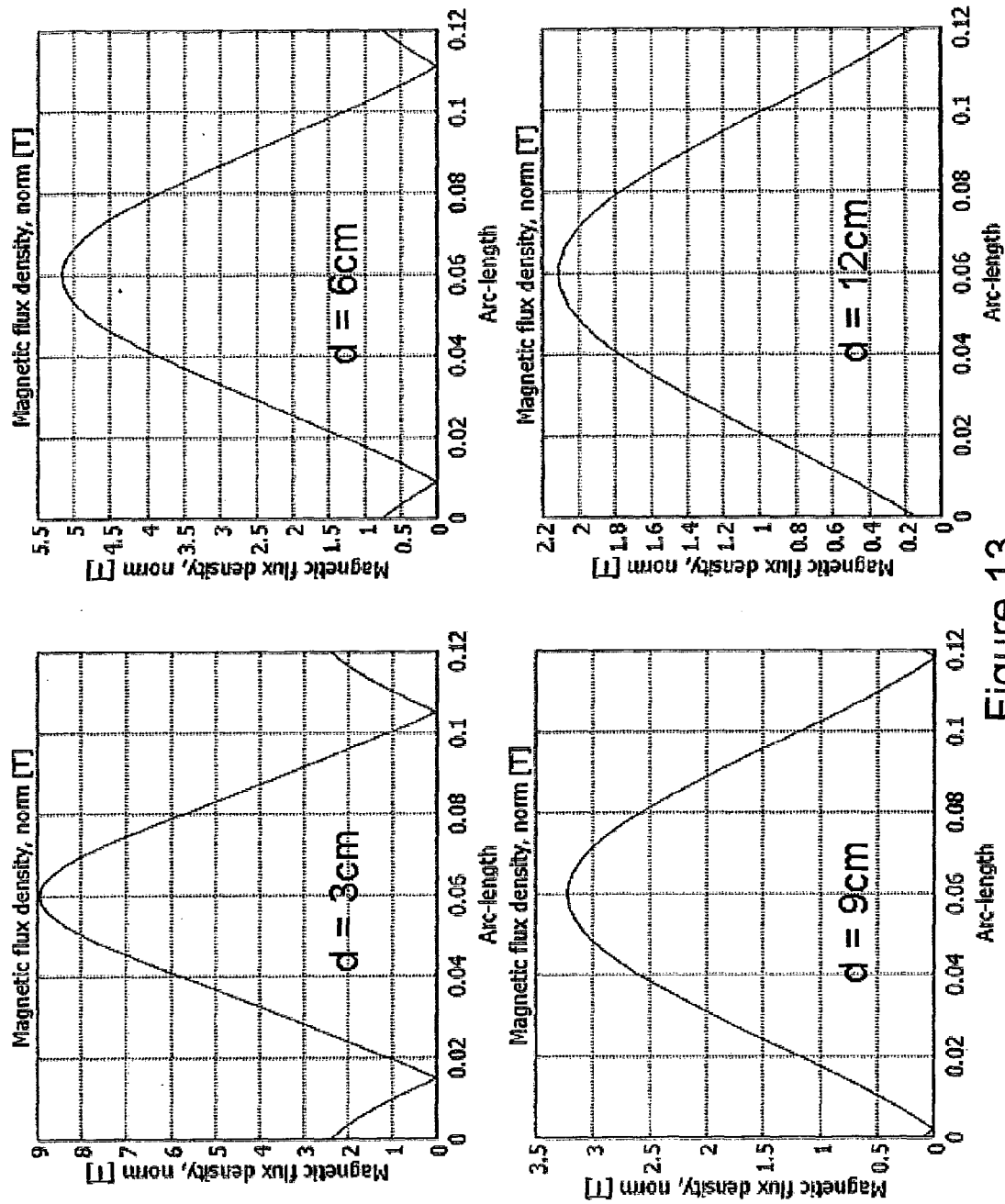
FIG. 13—The profile of the magnetic field along the line in the middle between two plate magnets, results plotted with different separations between the magnets. Each plate contains one magnet in this case.
Figure 14:
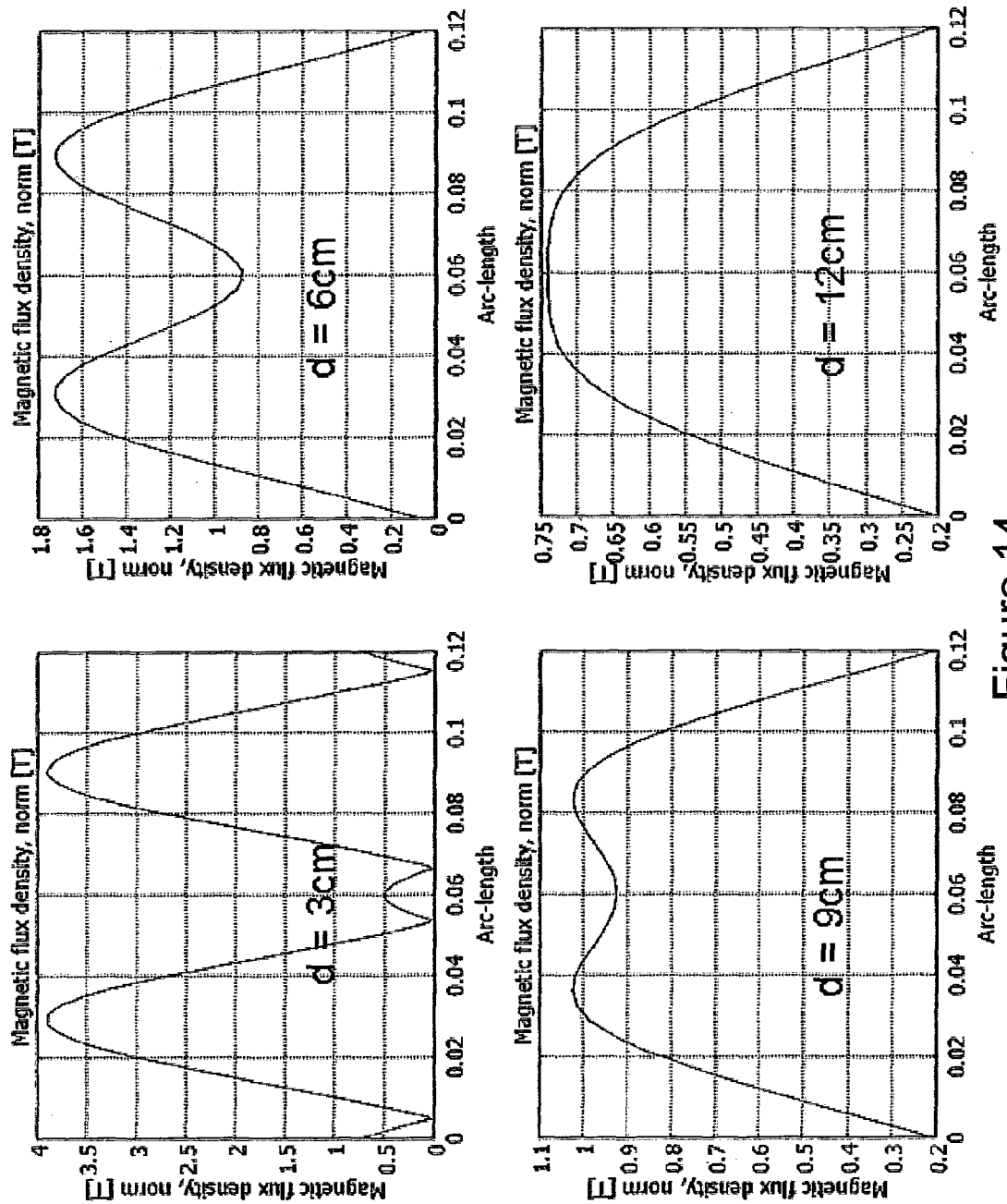
FIG. 14—The profile of the magnetic field along the line in the middle between two plate magnets, results plotted with different separations between the magnets. Each plate contains two magnets in this case.
Figure 15:
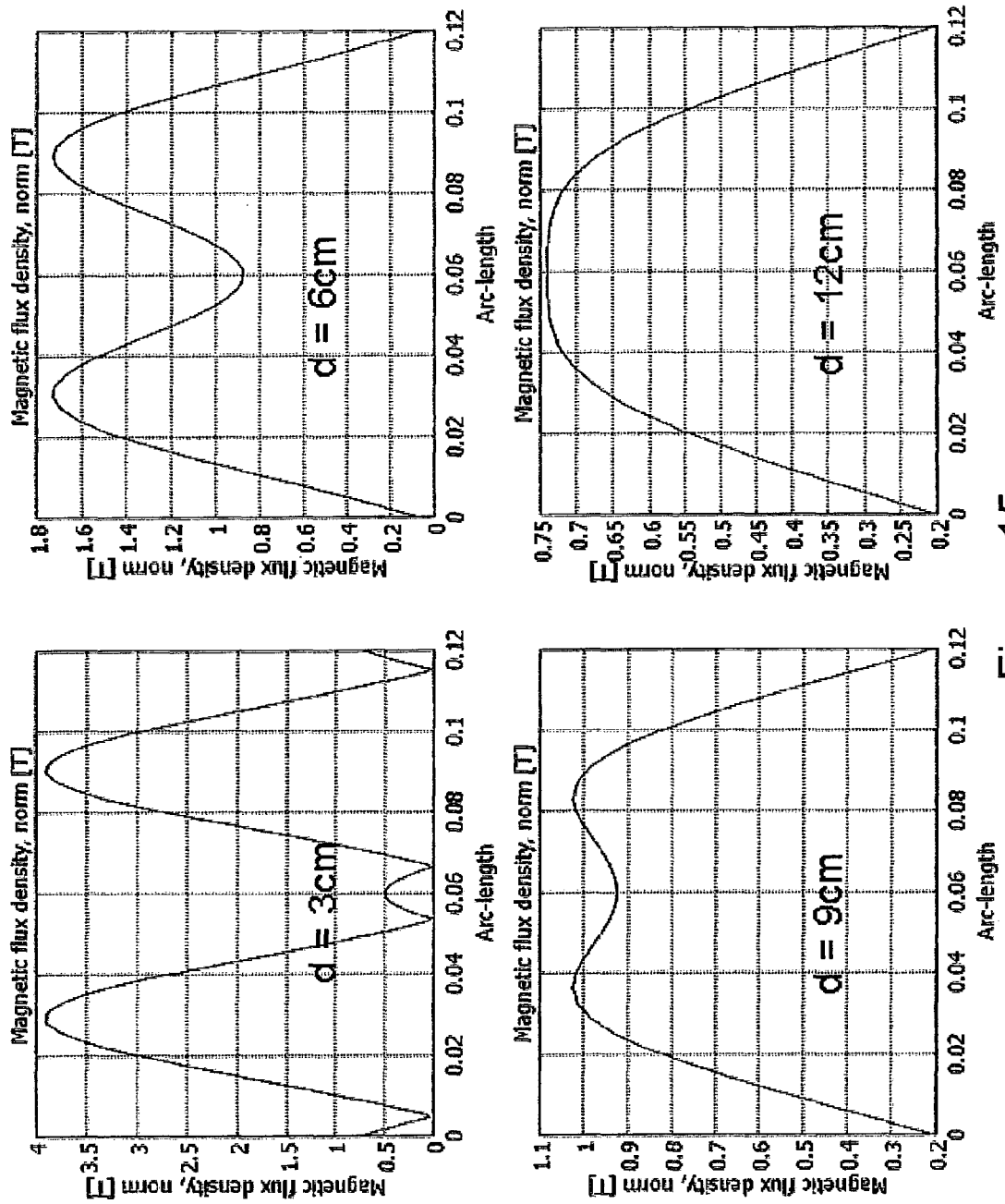
FIG. 15—The profile of the magnetic field along the line in the middle between two plate magnets, results plotted with different separations between the magnets. Each plate contains three magnet in this case.

FIG. 13 shows the results obtained with only one magnet in each plate, FIG. 14 shows the case of two magnets in each plate and FIG. 15 shows the case with three magnets.

As can be seen from these Figures, when the two plates are close to each other the field profile shows one peak for a single magnet, two peaks for double magnets and three peaks for three magnets. As d increases, the field profiles become smoother and finally converges to the shape of a single peak. For the cases of one magnet and three magnets in the top and bottom plate, this peak curve can be fitted to a Gaussian distribution, whilst for the cases of two magnets in the plates, this peak curve can be fitted to a $2^{nd}$ order polynomial equation.

The Combined Fields of the Two Pairs of Magnets

The studies in the previous sections proved that the field profile produced by the side magnets and the plate magnets have opposite shapes. i.e. one reaches a peak at the centre, the other has peaks at the edges. It provides the possibility of combining the two fields to obtain a uniform field in the central area between the pairs of magnets. Summarising the results presented in the previous two sections, two possible combinations can be found to produce the uniform combined field. The first one is to use an odd number of magnets for the top and bottom plates and long side magnets. In this case, both of the fields can be fitted to a Gaussian distribution. The other option is to use even numbers of magnets for top and bottom plates and to use side magnets with the ratio of L/d≈1. In this case, both of the fields can be fitted to a $2^{nd}$ order polynomial equation. An example is given for the first scenario.

Figure 17:
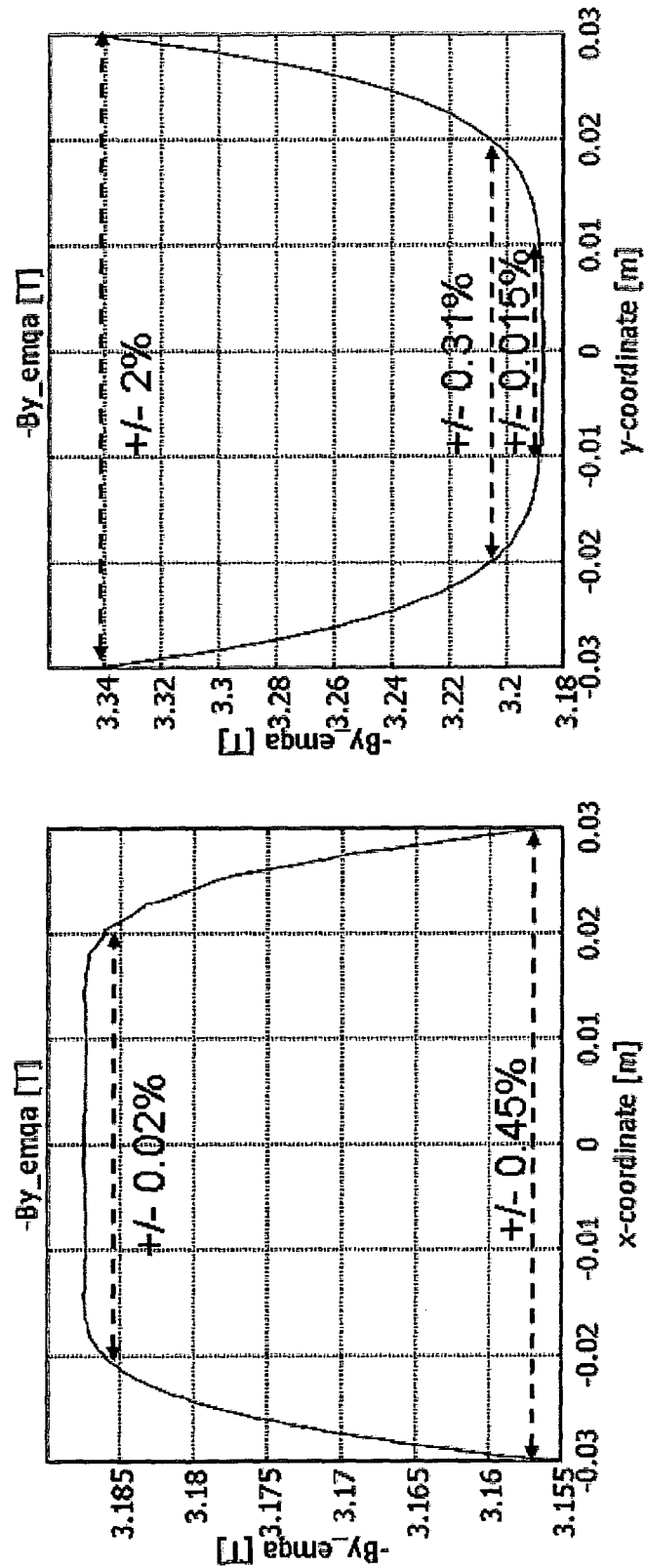
FIG. 17—The detailed field profiles along the lines A (left) and B (right) marked in FIG. 16. The uniformity within different sections along x and y axis is pointed out.
Figure 19:
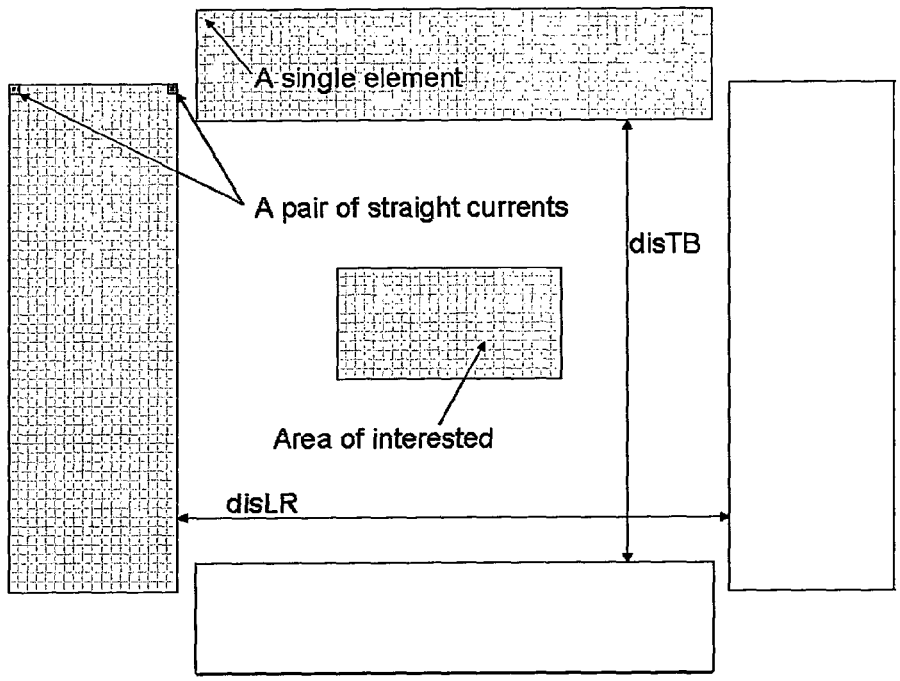
FIG. 19—The elements and parameters in the optimization program.

FIG. 17 shows the field distribution in the central area between two pairs of magnets. There is one single magnet in both the top and bottom plates. The width of the plate is 6 cm, the thickness of the plate is 0.5 cm, and the distance between the two plates is 10 cm. The diameter of the side magnets is 2 cm, the length of the side magnets is 8 cm, and the distance between two side magnets is 6 cm. The current density in the plate magnets is $1.23 \times 10^9$ A/m$^2$; the current density in the side magnets is $2 \times 10^9$ A/m$^2$. The field profile is plotted in FIG. 17 along the central line in x and y axis. As can be seen in FIG. 17, the uniformity is better in the centre than in the surrounding area.

Figure 16:
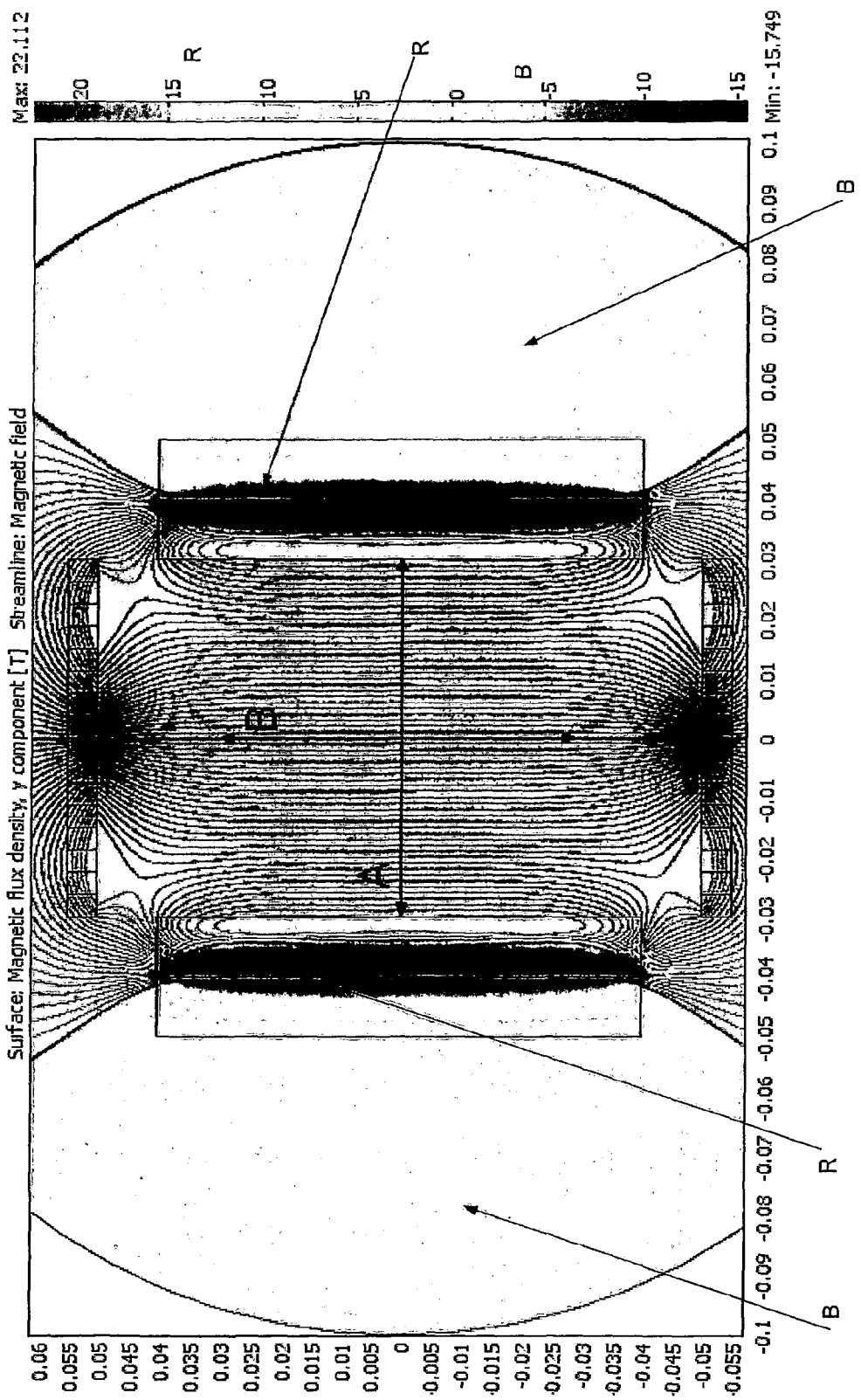
FIG. 16—The field distribution and magnetic flux line produced by the combination of the two pairs of magnets. The detail field profile along the line A and B is plotted in FIG. 17.

The results shown in FIGS. 16 and 17 demonstrate that a uniform field can be achieved by combining the field produced by the side magnets and the plate magnets. The best uniformity is achieved at the centre of the system. As the area of interest becomes larger, the uniformity decreases. The total dimensions of the system are determined by the size of the uniform area and the level of uniformity required. The current density in the system is determined by the magnitude of the required field. In the next chapter, the work will focus on a practical design.

Optimization

The concept of using two pairs of superconducting magnets to produce a uniform field has been documented above. The uniformity and the magnitude of the achieved field is sensitive to many factors such as the dimension of the magnets, the distance between the two magnets in each pair, the current density in every magnet and the overall size of the system. A computer program (MATLAB) was written to calculate optimal solutions. The program was able to analyse the magnetic field produced by the two pairs of magnets. The current density in every magnet can be adjusted by the program making sure the variable terms in the field produced by the side magnets and plate magnets cancel out each other. The parameters that determine the uniformity of the field are changing by iteration in the program to find the best achievable uniformity.

The Equations in the Optimization Program

To be consistent with the assumptions made in the finite element model, the optimization program chooses a pair of straight currents to approximate a circular current. The magnetic vector potential due to a pair of parallel wires at a separation a can be expressed as:

$$A_z = \frac{\mu I}{2\pi} \ln(a2/a1) \tag{2}$$

The components of magnetic field which are given by $\nabla \times A$ and can be expressed as:

$$B_z = \frac{\partial A_y}{\partial x} - \frac{\partial A_x}{\partial y} = 0 \quad (3)$$

$$B_x = \frac{\partial A_z}{\partial y}$$

$$B_y = -\frac{\partial A_z}{\partial x}$$

Since $$a1 = \left[\left(x - \frac{1}{2}a\right)^2 + y^2\right]^{1/2} \text{ and}$$

$$a2 = \left[\left(x + \frac{1}{2}a\right)^2 + y^2\right]^{1/2},$$

this gives:

$$B_x = \frac{\mu I y}{2\pi}\left(\frac{1}{a2^2} - \frac{1}{a1^2}\right) \quad (4)$$

$$B_y = -\frac{\mu I}{2\pi}\left(\frac{x + 0.5a}{a2^2} - \frac{x - 0.5a}{a1^2}\right)$$

In the optimization program, the cross sections of the magnets are divided into a number of elements and each element is represented by a long straight wire carrying superconducting current. An area of interested is defined according to the requirement. The magnetic flux density in the area of interest is calculated as the combination of the fields caused by all the elements in the magnets. The uniformity is defined as the difference between the maximum value and the minimum value of the field inside the area of interest. An algorithm was developed to adjust the current in each magnet to minimize the value of uniformity. After the best uniformity is obtained, the magnitude of the field can be adjusted by increasing or decreasing the current density in the whole system, keeping the ratio of the currents in magnets unchanged.

Finding the Best Geometry

A series of calculations have been performed by the program. These calculations include changing the distance between the two side magnets (disLR), the distance between the two plate magnets (disTB) and the width of the plate magnet.

Five values of disLR (10, 11, 12, 13, 14, 15 cm) have been chosen for the calculations. For each value of disLR, the distance between the two plate magnets varies for 20 different values. 120 different geometries have been considered in total for this series of calculations. In every calculation, the current density in each pair of magnets is determined by the optimization algorithm to achieve the best uniformity in the area of interest.

Figure 20:
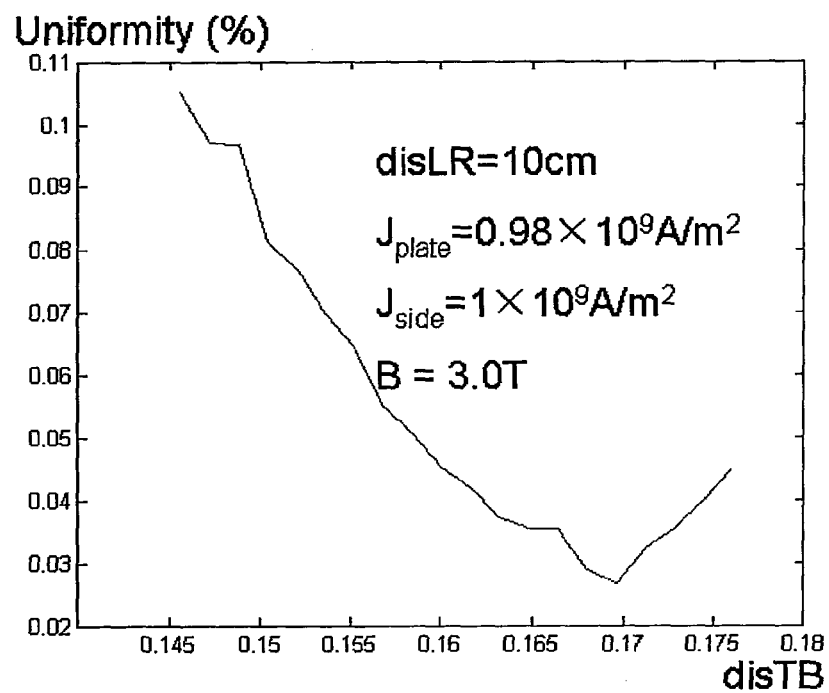
FIG. 20—The plot of the uniformity of the field against the distance between two plate magnets. Current densities are optimized with each value of disTB. Distance between two side magnets is 10 cm. The best uniformity could be obtained is +/−0.013%.
Figure 21:
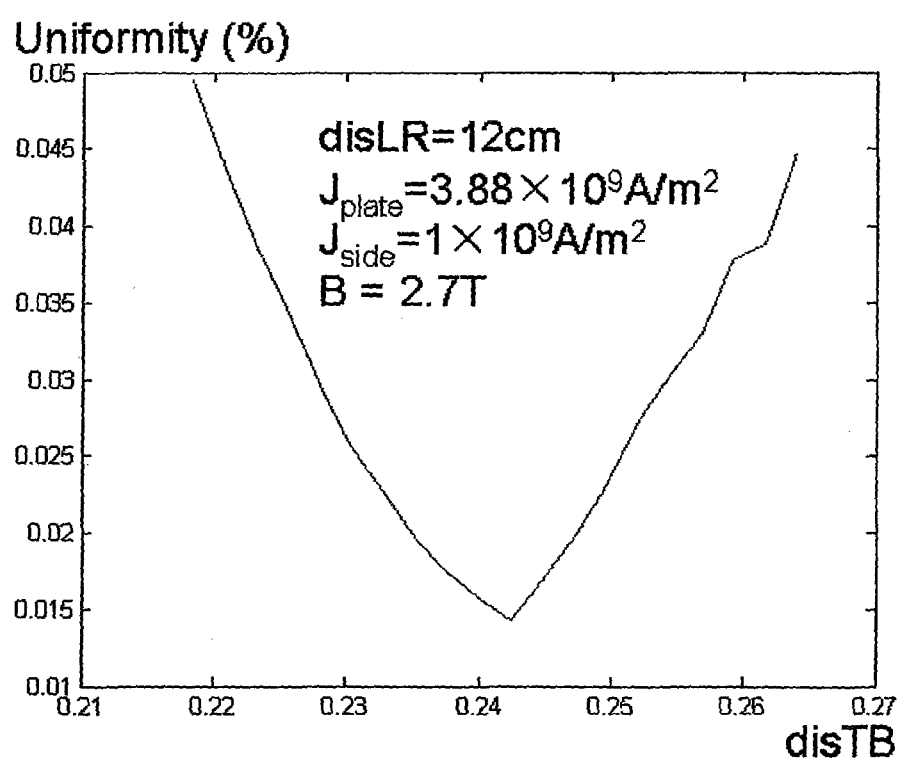
FIG. 21—The plot of the uniformity of the field against the distrance between two plate magnets. Current densities are optimized with each value of disTB. Distance between two side magnets is 12 cm. The best uniformity which could be obtained is +/−0.007%.

Certain interesting observations are made during results analysis. The value of disLR mainly determines the best uniformity which can be achieved by the system. Larger values of disLR give better uniformity in the area of interest. At a given value of disLR, there exists an optimal value of disTB at which the best uniformity is achieved. FIGS. 20 and 21 shows the varying of uniformity against the value of disTB in the condition of disLR=10 cm and 12 cm respectively.

When the distance between the side magnets is 10 cm, as the value of disTB increases from 14.5 cm, the value of uniformity improves. The uniformity approaches a minimum value of +/−0.013% when the distance between the plate magnets is 17 cm. In this case the current density in the plate magnets is $0.98 \times 10^9$ A/m$^2$ and the current density in the side magnets is $1 \times 10^9$ A/m$^2$.

When the distance between the side magnets is 12 cm, the curve shows a similar behaviour. The uniformity approaches the minimum value of +/−0.007% when the distance between the plate magnets is 24.2 cm. In this case the current density in the plate magnets is $3.88 \times 10^9$ A/m$^2$ and the current density in the side magnets is $1 \times 10^9$ A/m$^2$.

When disLR is 12 cm, the system can get a field with better uniformity than in the case of disLR=10 cm. However, the optimal distance between the plate magnets is larger as well (24.2 cm compared with 17 cm). Therefore a larger current density is required for disLR=12 cm than for disLR=10 cm.

The width of the plate magnets also has a significant effect on the results. The program tries different width values and finds out that the most suitable value for a single magnet in each plate is 6 cm.

The thickness of the plate magnet and the width of the side magnets have minor influence on the uniformity of the field but would affect the required current density. The magnitude of the field is determined by the total amount of the current. If the system adopts a smaller value for the thickness of the plate magnets or the width of the side magnets, the current density in the magnet need to be increased correspondingly.

The Optimal Results

An example requirement was to produce a geometry in which the overall uniformity was +/−0.01% and the integrated uniformity is within +/−0.05%. This uniformity was to be achieved in a cuboid of dimensions 30 mm×50 mm×1000 mm at a minimum flux density of 3 T. This requirement can be met as described below. After careful consideration, two solutions were chosen from the optimization program. The geometry and parameters are summarized in table 1.

TABLE 1

The parameters and characteristics of the two solutions

|  | Solution 1 | Solution 2 |
|---|---|---|
| No of Magnets in each plate | 1 | 3 (with a gap of 0.5 cm) |
| Width of the plate magnets | 6 cm | 2 cm |
| Thickness of the plate magnets | 1 cm | 1 cm |
| Width of the side magnets | 4 cm | 4 cm |
| Thickness of the side magnets | 16 cm | 16 cm |
| disLR | 12 cm | 12 cm |
| disTB | 24.38 cm | 12.12 cm |
| Current density (plate) | $4.3626 \times 10^9$ A/m$^2$ | $2.4871 \times 10^9$ A/m$^2$ |
| Current density (side) | $1.1 \times 10^9$ A/m$^2$ | $1.25 \times 10^9$ A/m$^2$ |
| Uniformity | +/−0.008% | +/−0.0075% |
| Integrated uniformity | +/−0.002% | +/−0.003% |
| Average flux density | 3.2 T | 3.2 T |

Figure 22A:
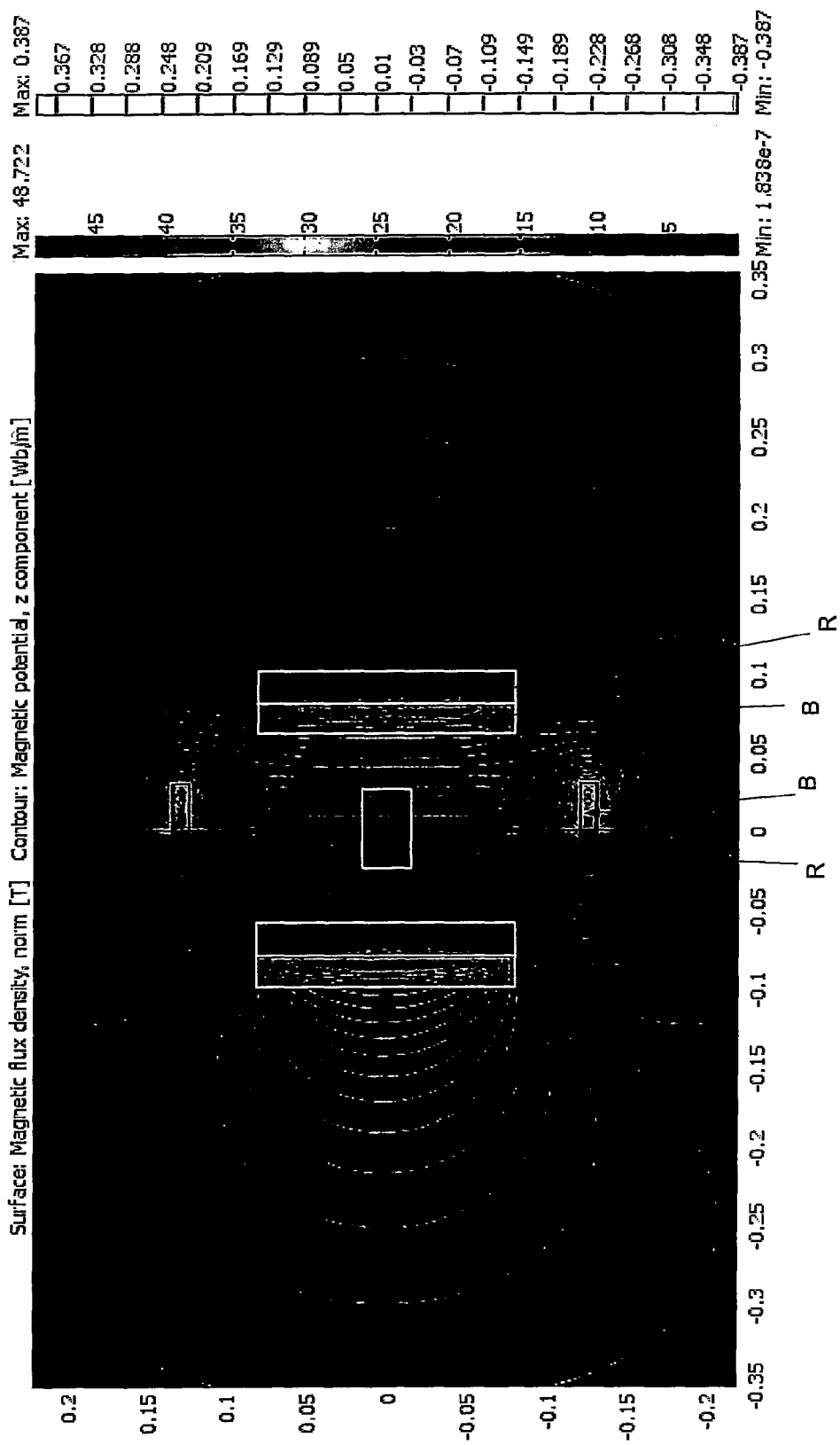
FIG. 22—FIG. 22(a) shows the magnetic field distribution and flux line for a first example field. The current density is plotted in FIG. 22(b).
Figure 22B:
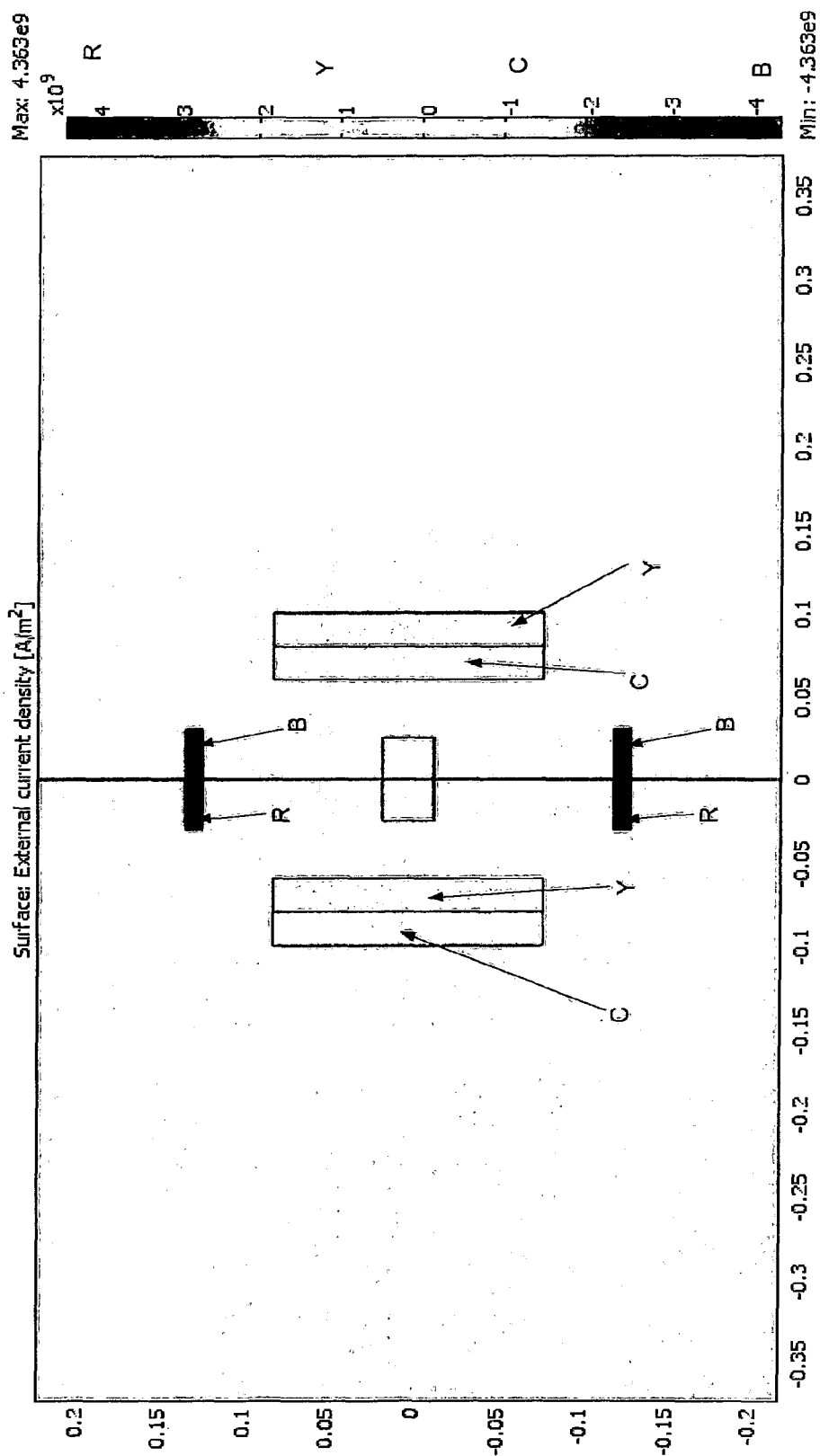

The geometry and parameters of the two solutions are adopted in the finite element model to give a comprehensive result. FIG. 22(a) shows the magnetic field distribution and flux line for solution 1. The current density is plotted in FIG. 22(b).

Figure 23:
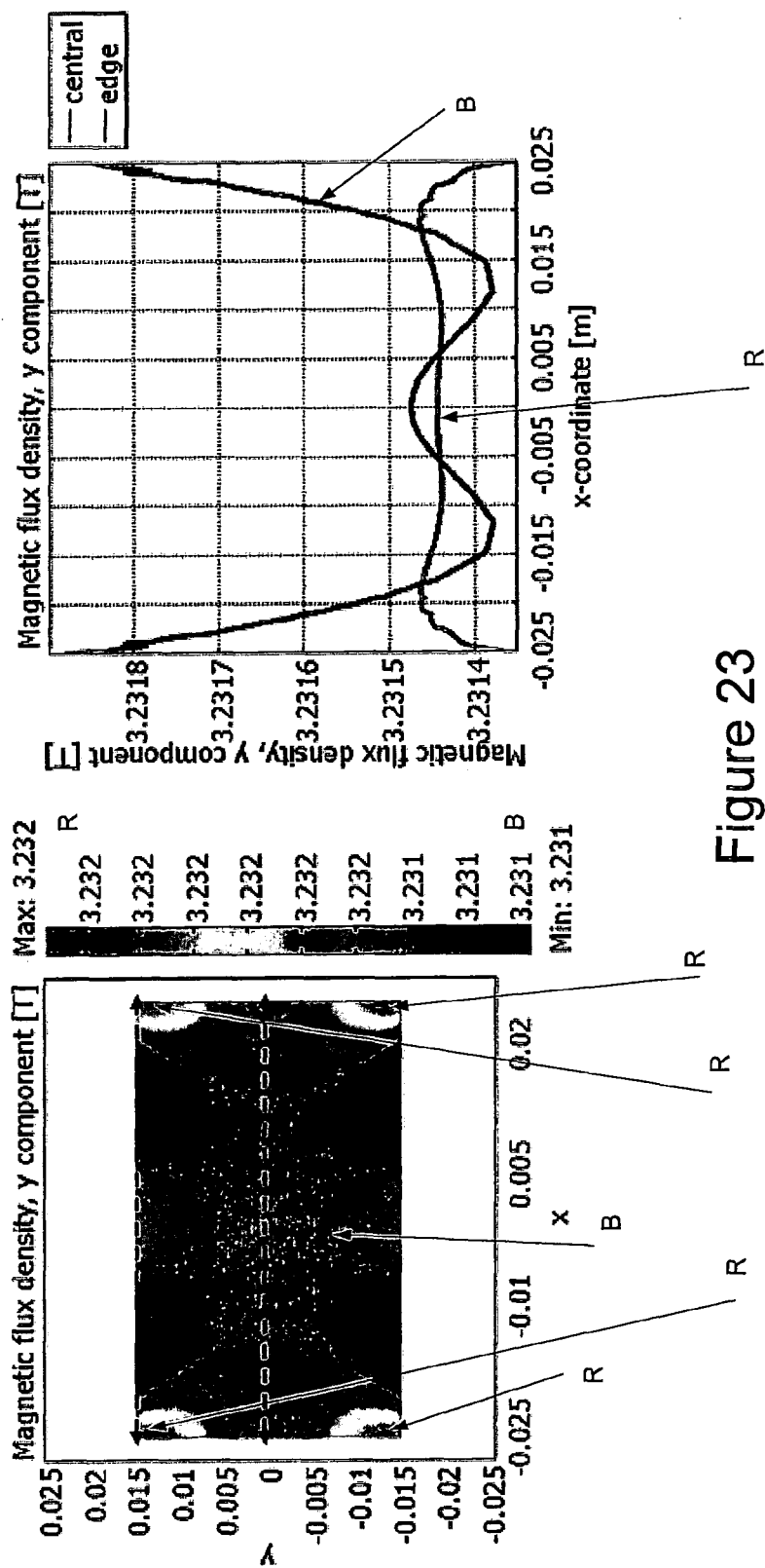
FIG. 23—The detailed field distribution iii the area of interest for example 1 (left), the profiles of magnetic field along the lines in the central and the edge of the area (right).

More detailed results of magnetic flux density for the area of interest (50 mm×30 min in the centre) are plotted in FIG. 23. The colour plot on the left represents the magnitude of the field. It can be seen that the maximum values of the field is located at the four corners and the minimum values located on the top and bottom edge. The magnitude of the field along the dash lines are plotted on the graph. It can be found that most of the non-uniformity is due to the blue line which represents the field on the edge. This phenomenon indicates that the uniformity has the potential to be improved if we are interested in a region thinner than the example.

Figure 24A:
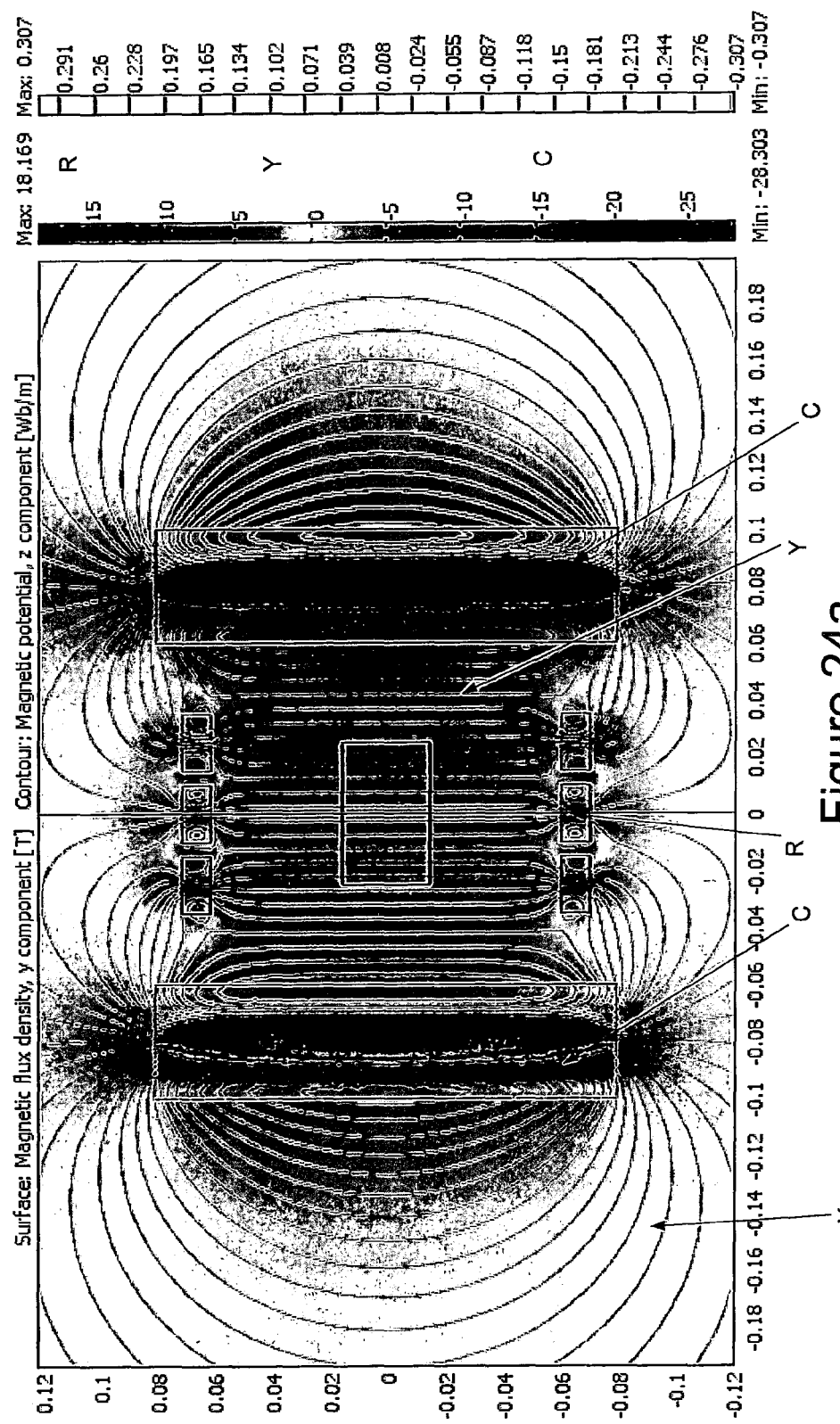
FIGS. 24—(a) and (b) show the field distribution and current distribution for a second example field.
Figure 24B:
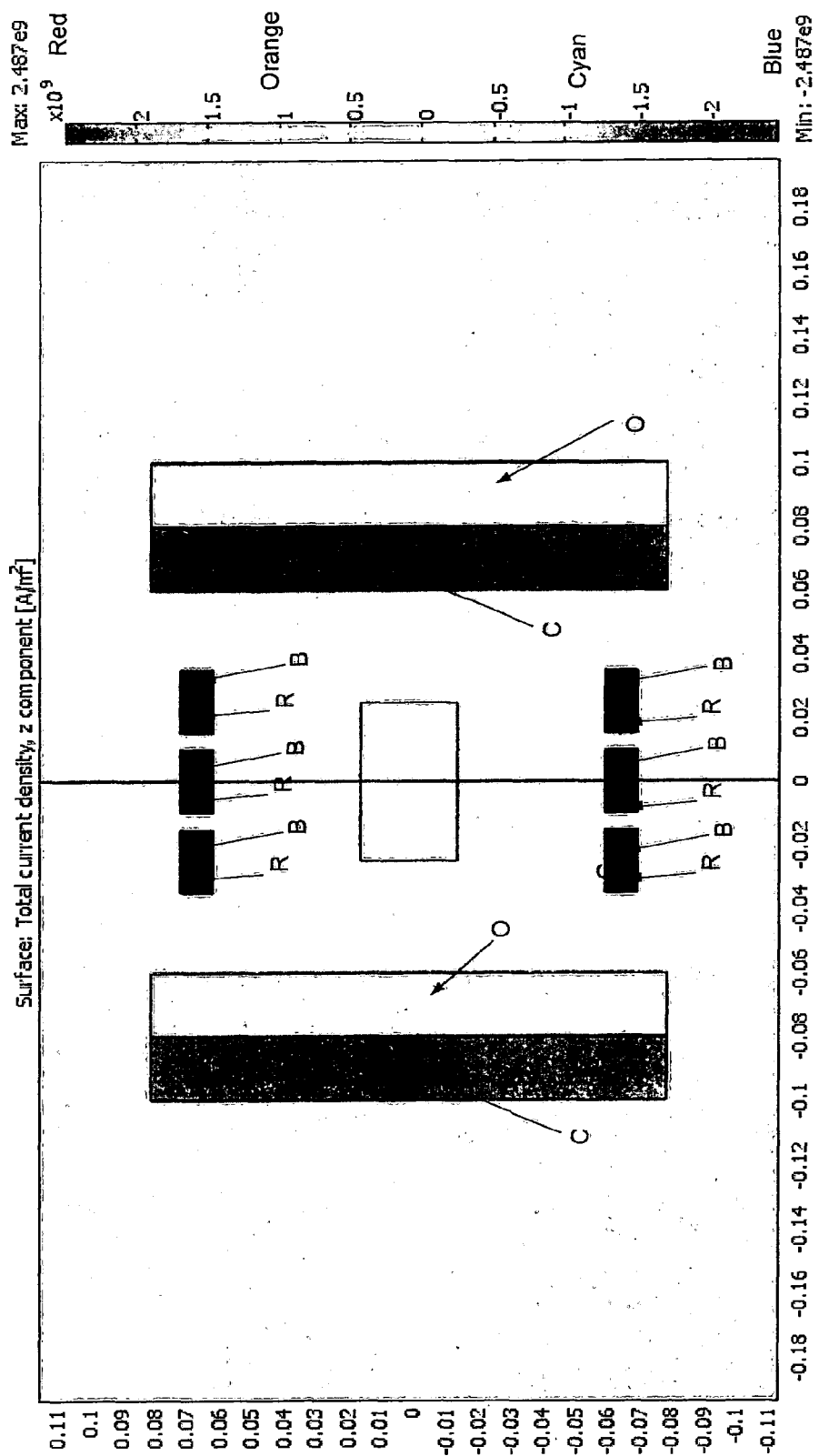

FIGS. 24(a) and (b) shows the field distribution and current distribution for solution 2. In this case the overall size of the system is much smaller than that in solution 1. Because plate magnets in solution 2 are much closer than those in solution 1, the current density in solution 2 is much smaller.

Figure 25:
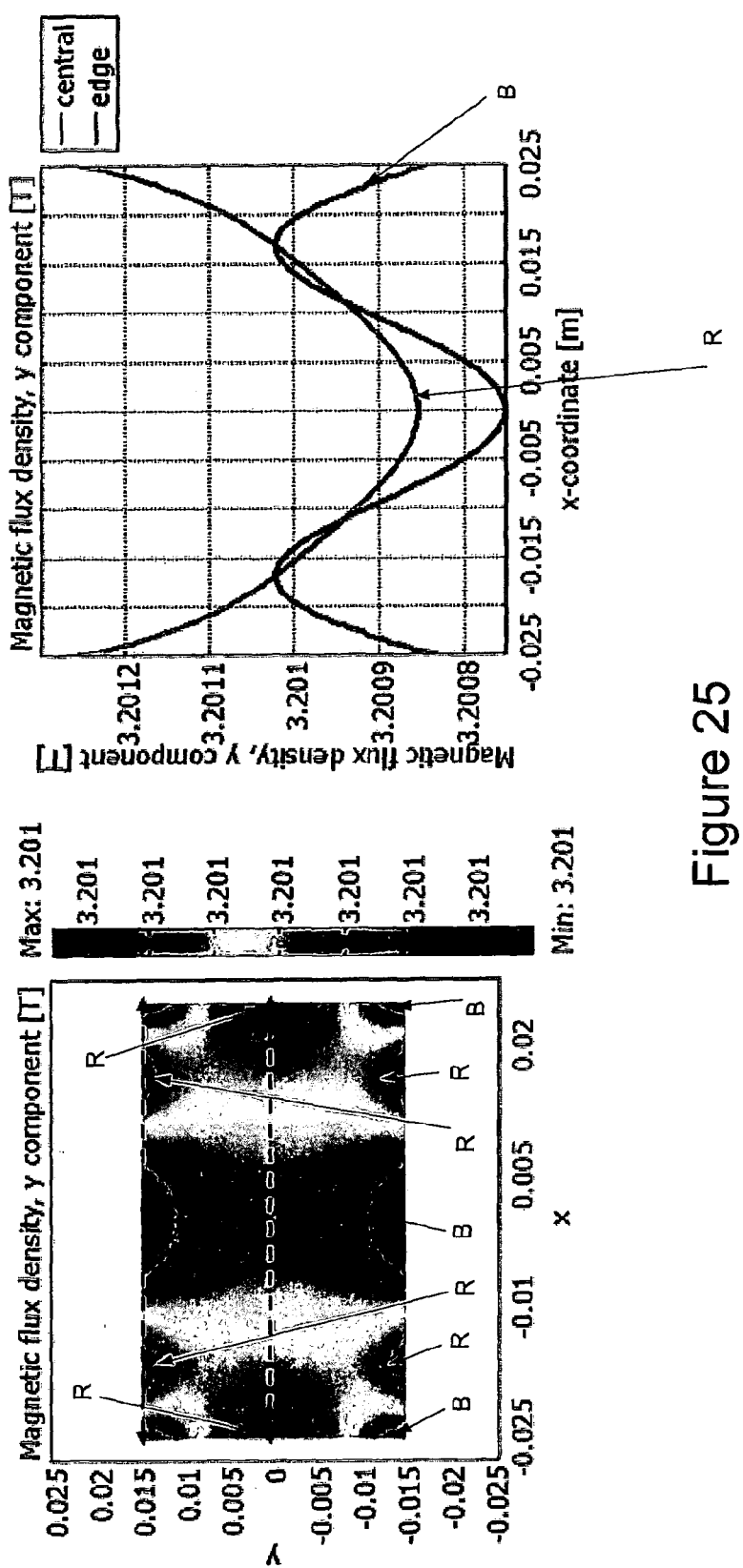
FIG. 25—The detailed field distribution in the area of interest (uniformity) for example 2 (left), the profiles of magnetic field along the lines in the central and the edge of the area (right).

The field distribution in the area of interest is shown in the left plot in FIG. 25 and the field profile along the central line and line on the edge are plotted on the graph. There is an interesting observation. Most of the non-uniformity is due to the field on the left and right edge. If we are interested in a narrower region than the requirement, the level of uniformity could be improved significantly.

Other Engineering Considerations

Here some practical issues of building this magnetic dipole system are taken into consideration. One of the factors is the tolerances of the system. For a field with very high level of uniformity it is important to investigate how sensitive the uniformity of the field is to some parameters in the system. The current study is based on two dimensional analyses. It is also useful to know how the uniformity and magnitude of the field would change when the model is extrapolated to three dimensions. The forces between the magnets are calculated and the requirement thickness of the supporting frame is estimated.

The Tolerance of the System

The tolerance in terms of uniformity is what is of concern. There are two major types of tolerance in this magnetic dipole system. The first one is the tolerance of uniformity against the variation of the geometry; the other is the tolerance of uniformity against the value of current densities in the SC magnets.

The Tolerance of the Uniformity Against the Geometry

Figure 26:
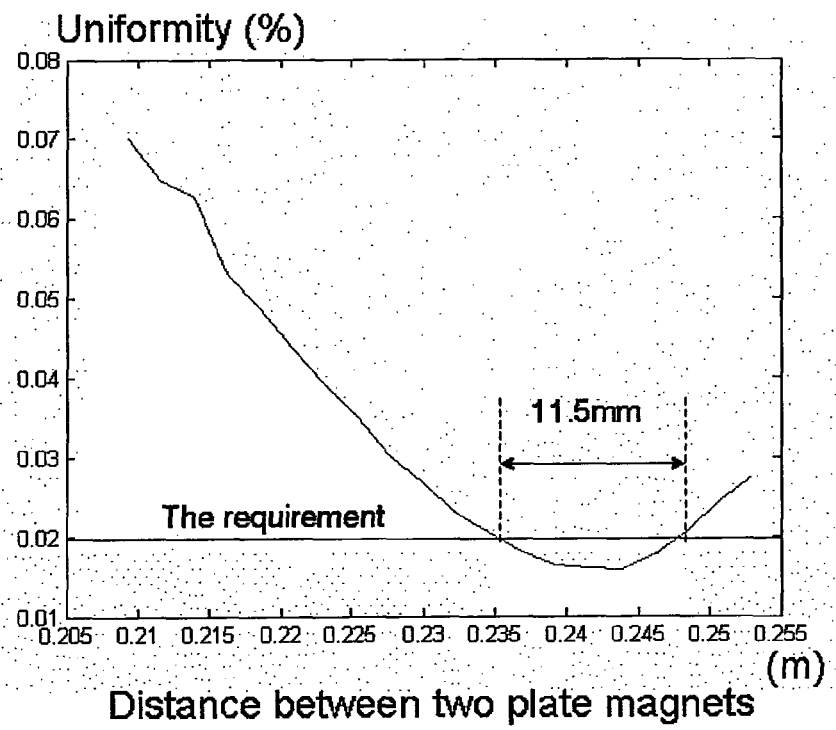
FIG. 26—The plot of the uniformity of the field against the distance between two plate magnets for example 1. The current density is allowed to be re-adjusted in each step. The region within the example requirement is marked.

The uniform field is obtained by placing each pair of magnets with an optimal separation. The degradation of the uniformity is studied when the positioning of the magnets is not as accurate as the design. In this study, we keep the position of the side magnets unchanged and do the calculation with certain variation of the distance between the two plate magnets around the optimal value. FIG. 26 shows the tolerance of the uniformity for solution 1 and FIG. 27 shows that for solution 2.

Figure 27:
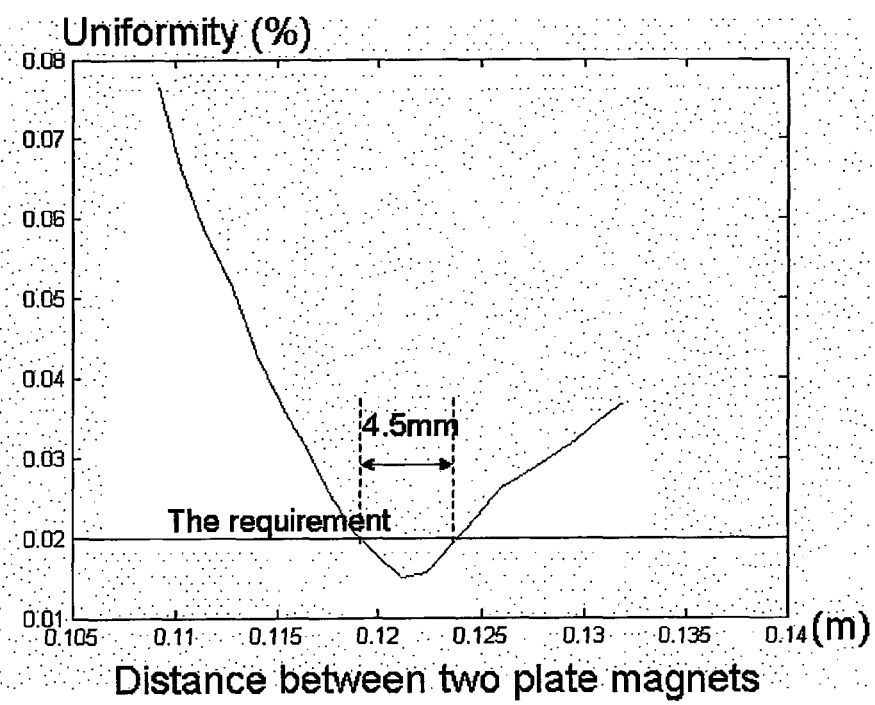
FIG. 27—The plot of the uniformity of the field against the distrance between two plate magnets for example 2. The current density is allowed to be re-adjusted in each step. The region within the example requirement is marked.

The solid lines marked with "requirement" in FIGS. 26 and 27 show the limitation of the uniformity that an example application can accept. The regions below those lines are within requirement. For solution 1, the distance between the two plate magnets can be varied by +/−5.75 mm within which the system still can provide a uniform field as required. For solution 2, in which the distance between the two plate magnets is much smaller than that in solution 1, this tolerance is only +/−2.25 mm. The tolerance is calculated based on the assumption that as the position of the magnets changes the current density can be re-adjusted by the system. If a more restricted condition is applied such that the current density can not be changed when the position moves, the tolerance would be much smaller than the values given above. The calculations show that the distance between the magnets can change +/−0.12 mm for solution 1 and +/−0.07 mm for solution 2 if the current densities are not allowed to be re-adjusted.

The Tolerance of the Uniformity Against the Current Density

Two major factors cause concern of the tolerance of the uniformity against the current density. The first one is the flux creep effect which is due to the basic characteristics of bulk superconducting materials. The other factor is the change of critical current density against temperature. However this is not an issue if we are below the critical current threshold.

When the superconductor is magnetized, the trapped field would decrease as time goes on even if the external magnetic condition does not change. The rate of decay depends on the number of n being used in E-J power law and can be fitted using a power law $B \sim t^{-a}$ relationship. The decay due to flux creep takes place simultaneously in every superconducting magnet in this system, which means the ratio between the fields produced by the plate magnets and side magnets does not change and the uniformity would not be affected by flux creep. Flux creep does cause the degradation of the magnitude of the field but the effect is negligible when a certain period of time is allowed for the system to settle down after magnetizing the sample. A rough estimation (E-J power law used with n=30) has been carried out and shows that, after the SC magnet is magnetized to 3.5 T, the field decreases to 3.2 T in 2 minutes and decreases to 3.1 T in 5 days. If the sample is magnetized and left for flux creep for 5 hours, the magnitude of the field only changes ~0.08% in every following hour.

Figure 28:
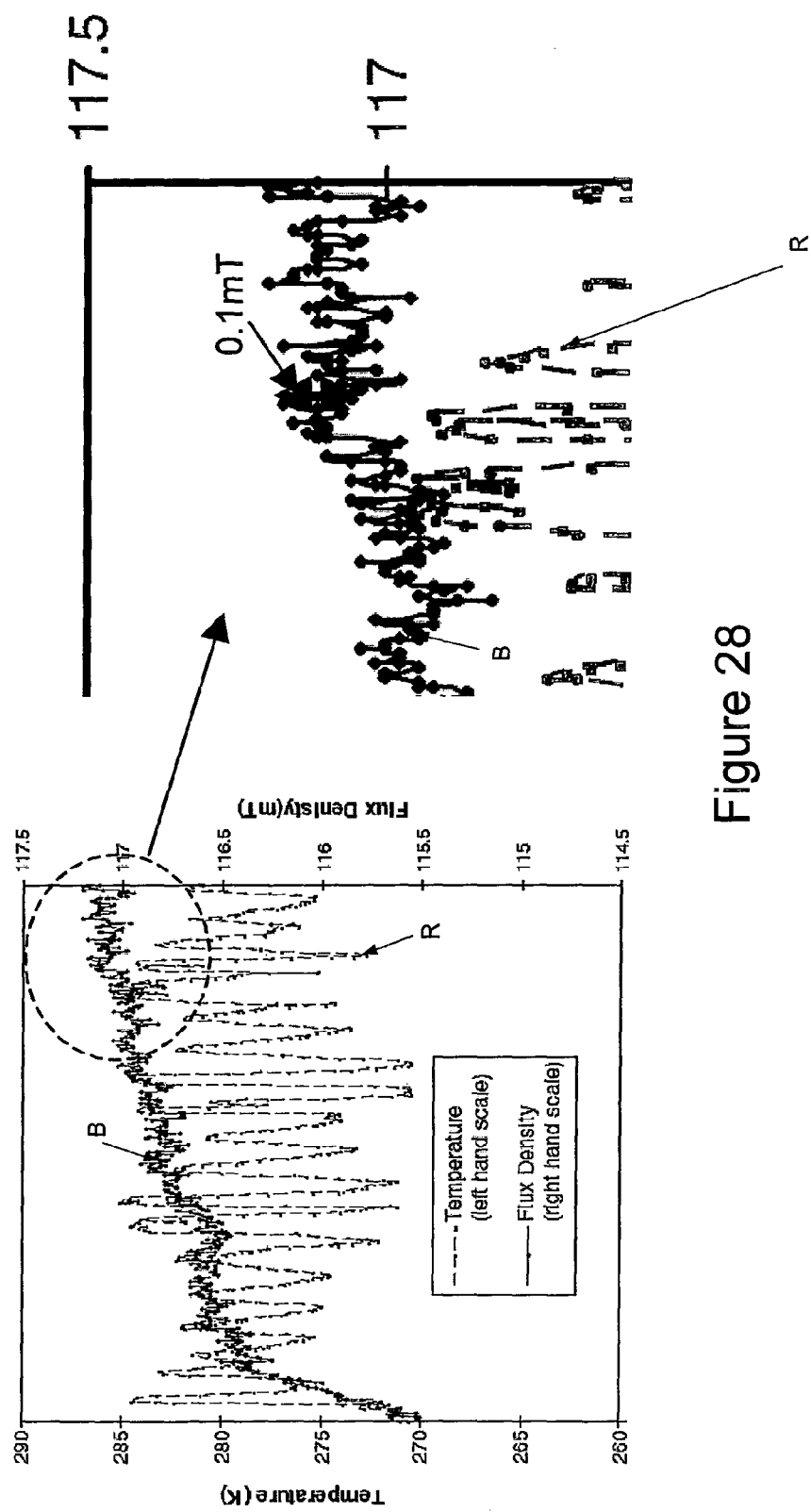
FIG. 28—Experimental results of field accumulation by flux pumping.

The tolerance of uniformity against the change of the current density caused by temperature change is of importance and should be considered carefully. Calculations were carried out using the optimization program. Tolerance of the uniformity against the change of current in one pair of magnets is obtained. If the geometry and positions of the magnets are kept unchanged and the current density in the side magnets is fixed, the current density in the plate magnets is allowed to change +/−0.7% for solution 1 and +/−0.45% for solution 2 before the uniformity fails to meet the requirement. Assuming the critical current density changes linearly against temperature and two typical values for the $J_c$ are $10^{10}$ A/m$^2$ at 20 k and $10^8$ A/m$^2$ at 80 k. The tolerances in current densities mentioned above indicate the values of tolerances against the temperature as +/−0.33% for solution 1 and +/−0.1% for solution 2. This tolerance appears low and seems to require temperature control. However, with the help of flux pumping technology, the system does not need to be so complicated. Flux pump is able to increase or decrease the magnetization in the superconductor with a very precise incremental value. If the ratio between this incremental value and the original magnitude of the field is smaller than the tolerances presented above, the effect of temperature changes can be counteracted by dynamically controlling the magnetization by flux pumping. FIG. 28 shows the experimental data of field accumulation by flux pumping and the close-up look is shown on the right. It can be observed in this figure that the incremental value of the field can be as precise as 0.1 mT. Comparing with the maximum field trapped inside the plate magnet (10 T), 0.1 mT is only 0.001% of the trapped field. Thus if needed a flux pump is able to counteract the change of critical current density due to temperature change in the system and to keep the uniformity of the field within a described range.

Extrapolation to Three Dimensional System

The uniformity of the field along the z axis is verified by a three dimensional finite element model. Due to the intensive requirement of computational times in 3D model, it is not practical to simulate the whole system in 3D. The field produced by the side magnets and plate magnets are investigated separately.

Figure 29:
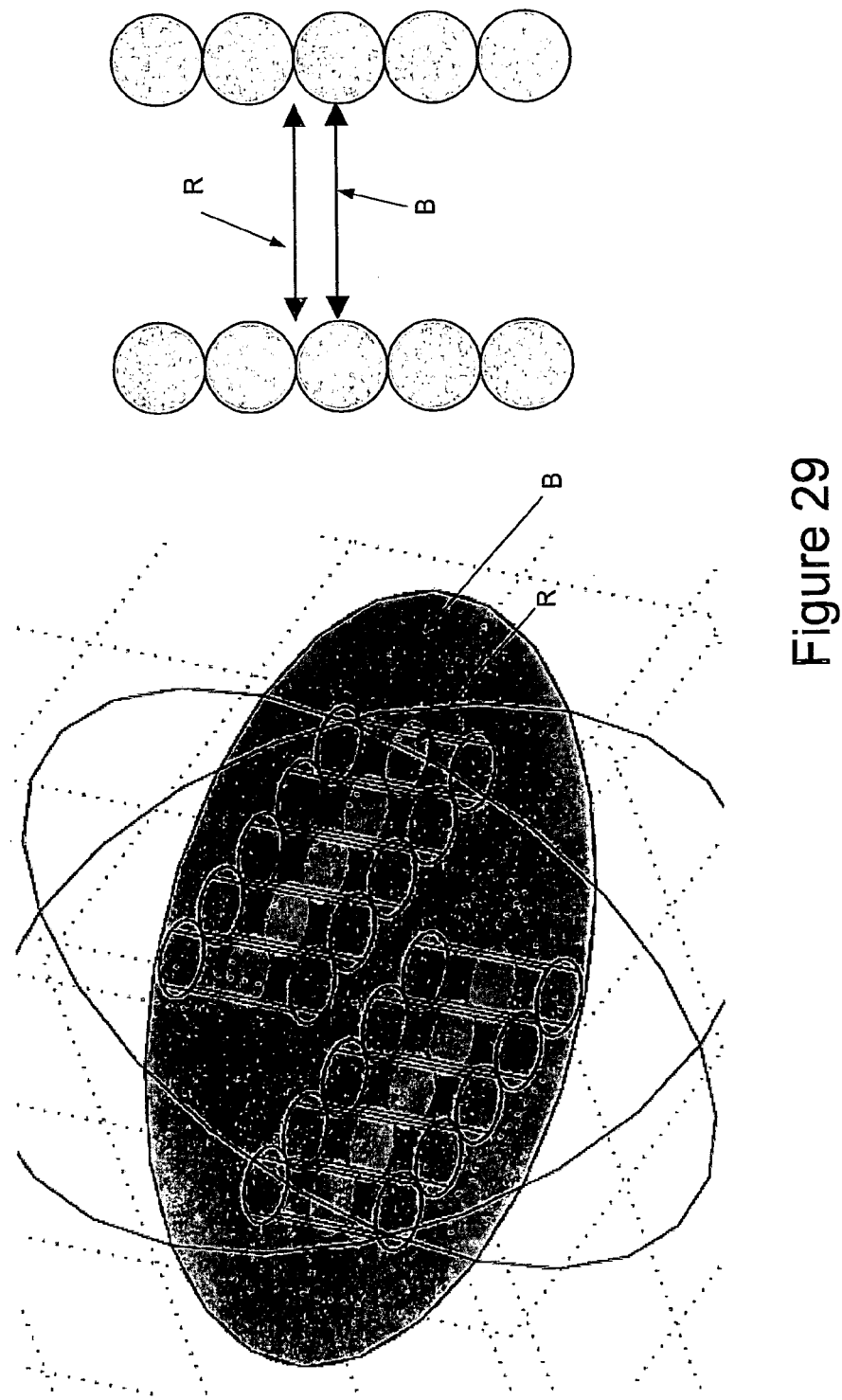
Figure 30:
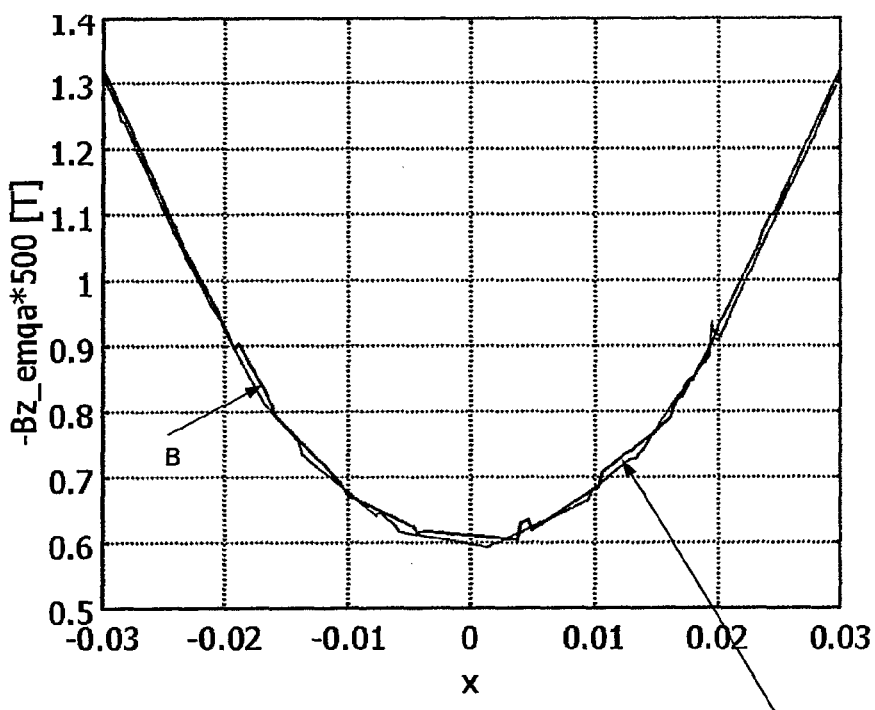
FIG. 30—The field profiles along the red and blue lines pointed out in FIG. 29.

Two lines of column magnets patterned as shown in FIG. 29 is simulated by FEM (finite element modelling). Uniform magnetization is assumed to for inside of each magnet. The magnetic field profile is calculated along the blue line and the red line in the figure on the right. The field profile is plotted in FIG. 30. Apart from the small discrepancy between the red and blue curves, which is due to the quality of the mesh in the model, there is no difference between these two field profiles. This proves that the field in between of the side magnets is uniform along the z axis. The magnitude of the field in this study is just a relative number. It does not correspond to the magnitude of the field in the two examples given above.

Figure 32:
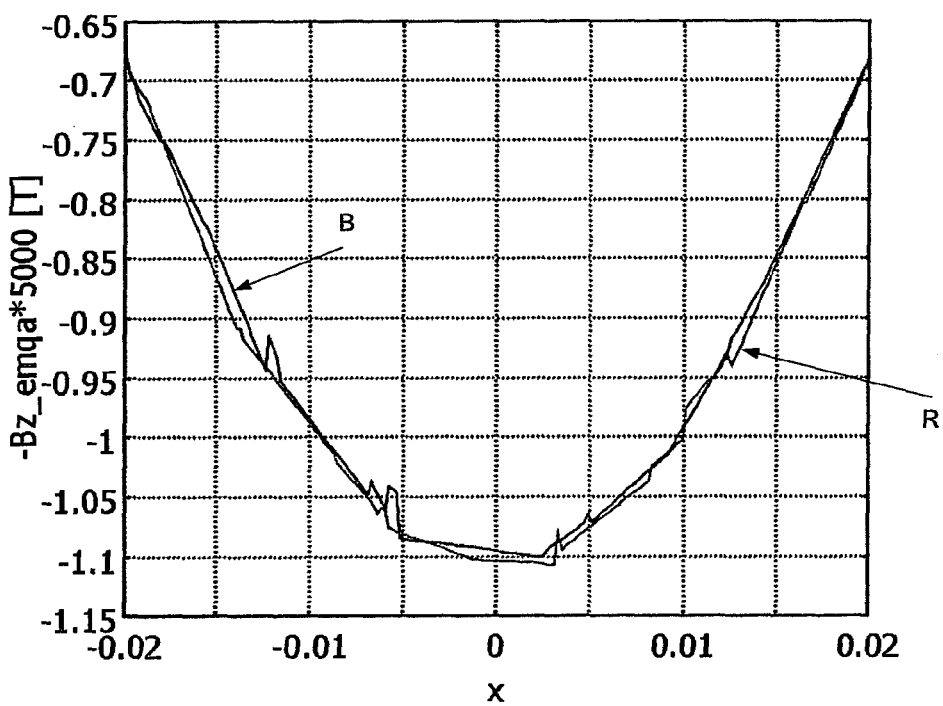
FIG. 32—The field profiles along the red and blue lines pointed out in FIG. 31.
Figure 31:
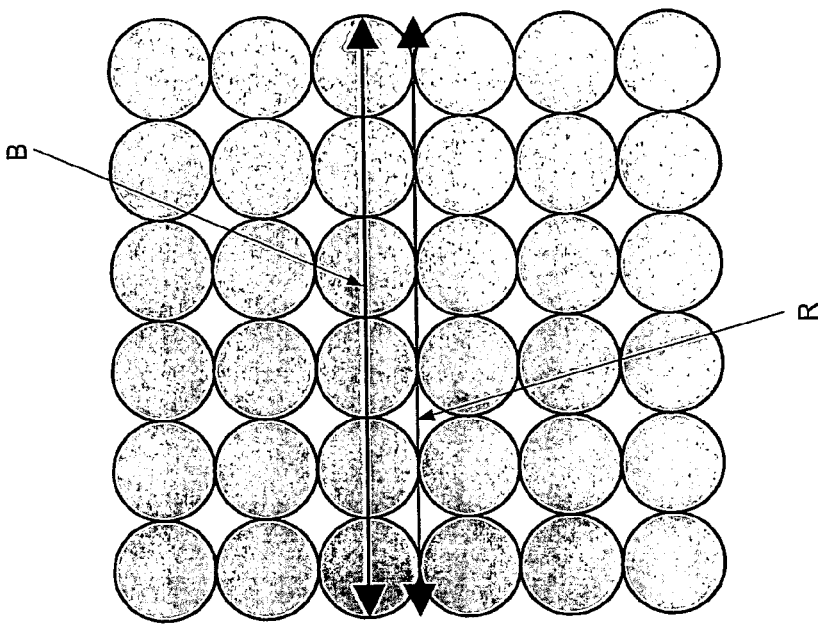
Figure 31:
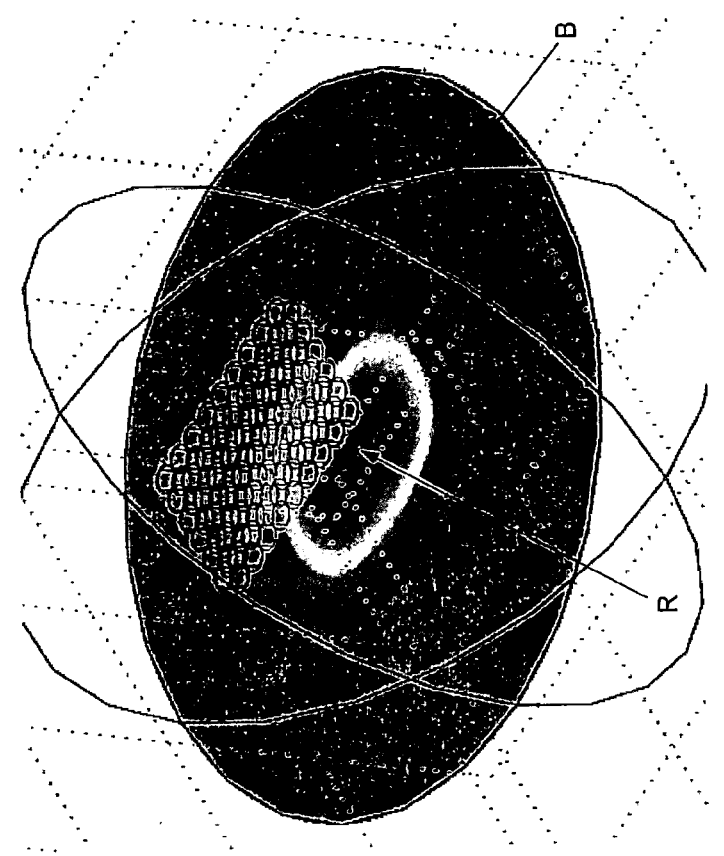

Next, we investigated the field produced by the plate magnets. In this case, only the top plate is simulated for numerical simplicity. An array of tablet magnets patterned as shown in FIG. 31 is simulated by FEM. The field underneath the blue line and red line with a distance of 5 cm is calculated. The profile of the field is plotted in FIG. 32.

The field profile underneath the diameters of the tablets (red) is the same as that underneath the edges of the tablets (blue). This result proves that the field profile produced by the plate magnets does not change along the z axis at locations 5 cm or further from the plate.

Since both of the side magnets and plate magnets produce uniform fields along z axis for this given geometry, the combination of the two fields would still be uniform along z axis. There is substantially no degradation of the uniformity in 3D space comparing with the results obtained by the 2D model.

Operating Temperature Range

Figure 33:
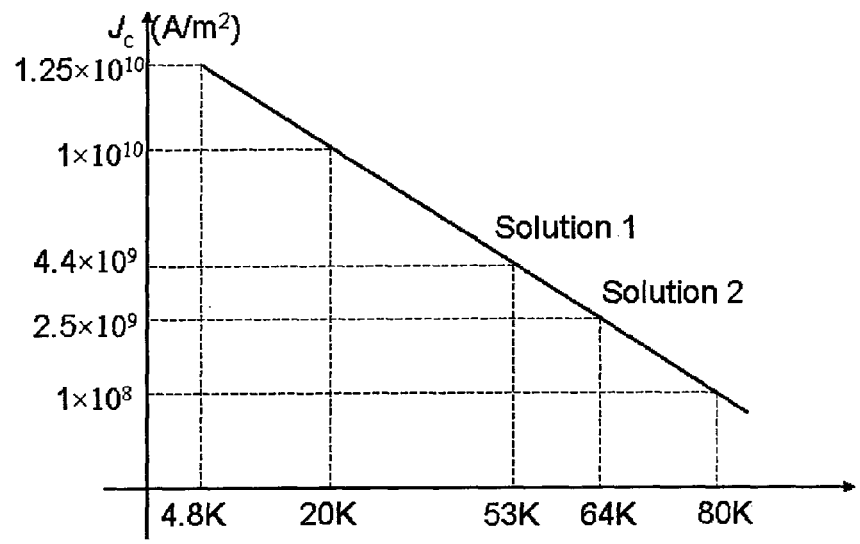
FIG. 33 Typical Jc versus temperature.

FIG. 33 shows typically how critical current varies with temperature for an YBCO sample. From the figure we can see that the operating range is from Liquid helium temperatures to 53 Kelvin for solution 1 and to 64 Kelvin for solution 2.

Forces

The forces between the plate magnets and the side magnets can be obtained from the Comsol model. For solution 2 the vertical force on one single tablet among the plate magnets is 2000N. This gives a total repulsive force on the top/bottom plates of 2000N×3×50=3×10$^5$N. The area of the top surface of the inner frame is 0.12 m$^2$. This equates to a pressure load applied due to the top and bottom layers of magnets of 2.5×10$^6$ Pa.

Figure 34:
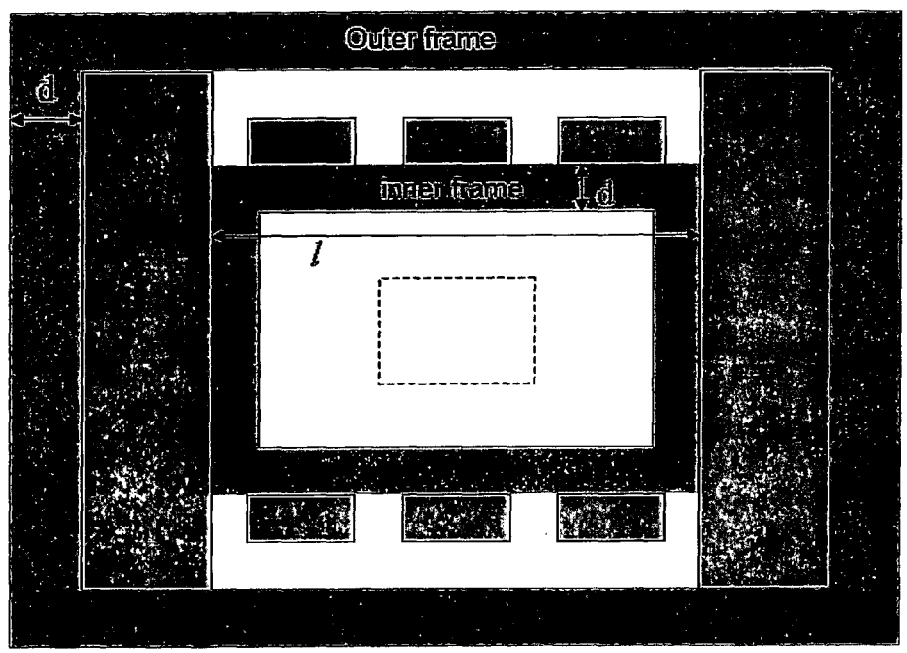
FIG. 34—The frames used to support the superconducting magnets.

Since the force between the top and bottom magnets is a compressive load and that between the side magnets is a bursting load it is appropriate to consider the support of each separately. Typically an outer frame might be used to retain the side magnets and an inner frame for the top and bottom magnets, a sample arrangement is shown in FIG. 34.

Taking a worst case and assuming that the plates supporting the top and bottom magnets act as a simply supported beam then the central deflection σ of the beam is given by:

$$\sigma = \frac{5Wl^3}{384EI} \text{ and}$$

$$I = \frac{bd^3}{12}$$

Where W is total applied load, l is the width of the beam, b is the depth of the beam, d is the thickness of the beam and E is Young's modulus. If value of 0.05 mm is allowed as the maximum deflection in the central of the frame which is less than the tolerance calculated in the preceding sections then the minimum thickness of the inner beam (d) is 1.9 cm. This still leaves more than the 60 mm clearance in the y-direction which is required for the inclusion of the cryostat and the electron beam chamber. The same calculation has been done for the outer frame and the result shows that the minimum thickness of the outer frame is 2.0 cm.

Overall System Parameters

A summary of the design for the two example solutions is listed in table 2

TABLE 2

The parameters and characteristics of the two solutions

| | Solution 1 | Solution 2 |
|---|---|---|
| No of Magnets in each plate | 1 | 3 (with a gap of 0.5 cm) |
| Width of the plate magnets | 6 cm | 2 cm |
| Thickness of the plate magnets | 1 cm | 1 cm |
| Width of the side magnets | 4 cm | 4 cm |
| Thickness of the side magnets | 16 cm | 16 cm |
| DisLR | 12 cm | 12 cm |
| DisTB | 24.38 cm | 12.12 cm |
| Current density (plate) | 4.3626 × 10$^9$ A/m$^2$ | 2.4871 × 10$^9$ A/m$^2$ |
| Current density (side) | 1.1 × 10$^9$ A/m$^2$ | 1.25 × 10$^9$ A/m$^2$ |
| Uniformity | +/−0.008% | +/−0.0075% |
| Integrated uniformity | 0.004% | 0.006% |
| Average flux density | 3.2 T | 3.2 T |
| Tolerance against the distance (allowing re-adjust current) | +/−5.75 mm | +/−2.25 mm |
| Tolerance against the distance (fixed current) | +/−0.12 mm | +/−0.07 mm |
| Tolerance against the current density | +/−0.7% | +/−0.45% |
| Tolerance against the temperature | +/−0.33% | +/−0.1% |
| Number of bulks in side mgs | 480 | 480 |
| Number of bulks in plate mgs | 40 | 360 |
| Cost of YBCO powders | £50,000 | £50,000 |

Open Faced Geometry

Figure 35:
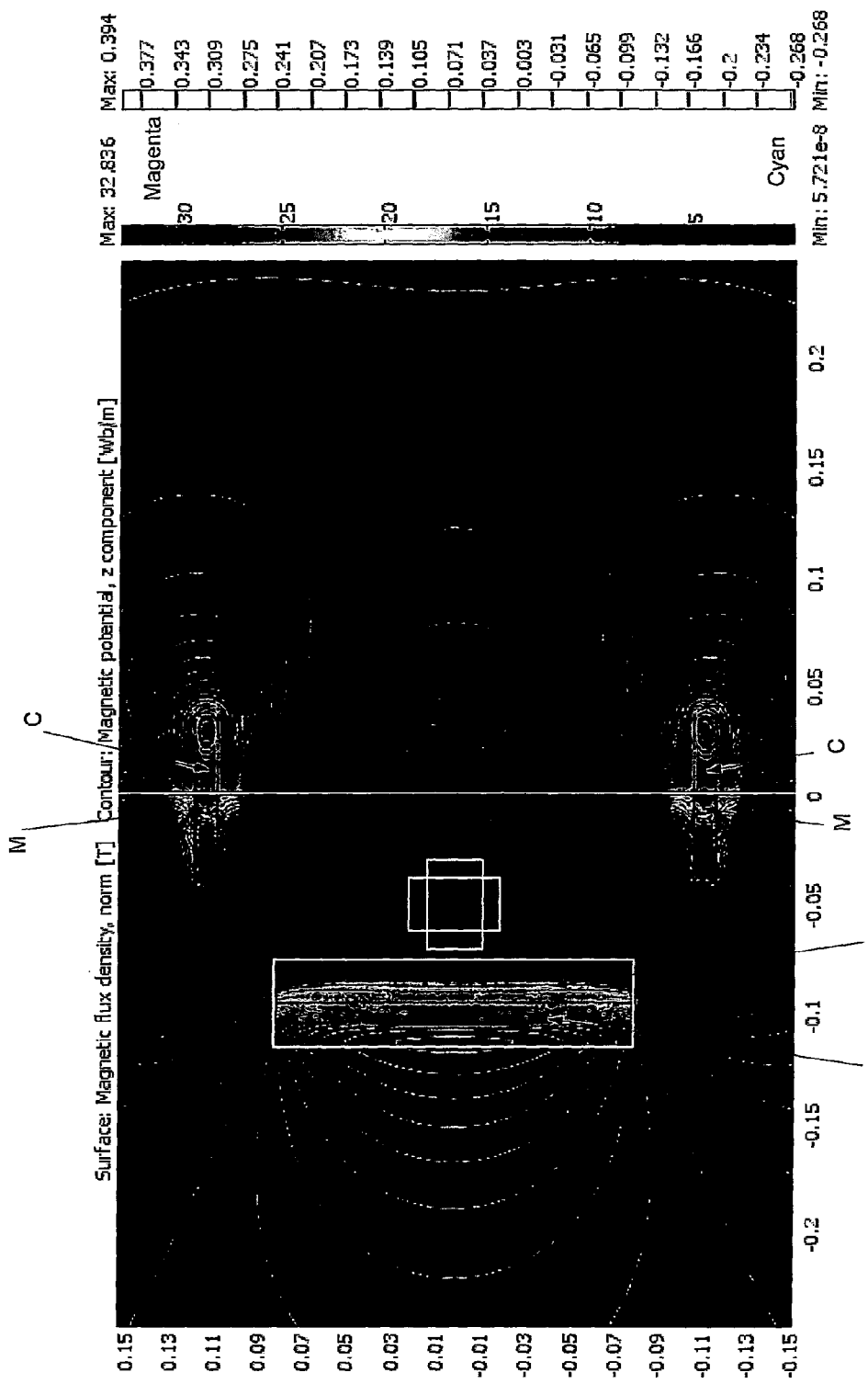
FIG. 35—Field distribution and magnetic flux lines for the open face system, in this case the majority of the field is provided by the side magnet. Plate magnets are used as correction.

The system described has great potential to be modified for other applications. For the applications where the uniformity of the field is not as demanding as above, the system is able to be modified to an open face system, as shown in FIG. 35 in which the boxes show regions of uniform field.

The right hand of the side magnets is removed in this case. The area of interest is moved closer to the left side magnets. The current density in the side magnets is 1×10$^9$ A/m$^2$ and the current density in the plate magnets is 2.64×10$^9$ A/m$^2$. This system is able to produce a field of 2.6 T inside the region of interest (40 mm*30 mm) with a uniformity of +/−0.175%.

Figure 36:
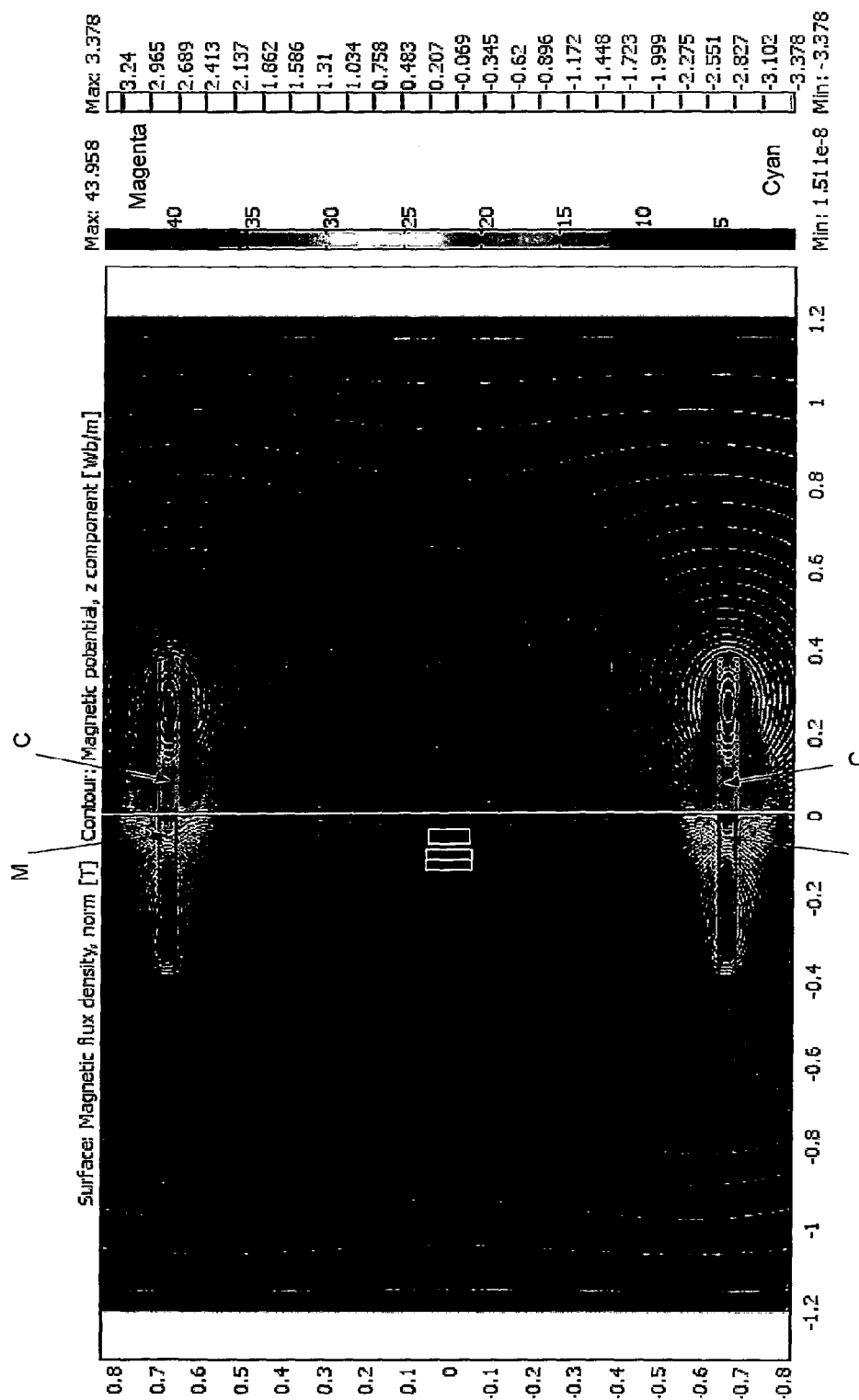
FIG. 36—Field distribution and magnetic flux lines for the open face system, in this case the majority of the field is provided by the plate magnets. Side magnet is used as the correction.

If we use the plate magnets to produce the background field and use the side magnets to produce the correction field, the system is modified to the geometry shown in FIG. 36. The correction field magnet is on the left of the central boxes; the uniform field region is the right one of the central boxes. This is an open system with two big plate magnets on the top and bottom, a small movable cylinder magnet is located at a certain position between the plates. A field as uniform as +/−0.05% could be produced right beside the cylinder magnet. The magnitude of the field is mainly determined by the plate magnets. In this case the current density in the plate magnets is 0.7×10$^9$ A/m$^2$ and the uniform field obtained is 2.3 T.

We have described a relatively simple and practical system for achieving a dipole magnet using superconducting magnets. The study has been based on bulk YBCO material. It would be possible to replace the top and bottom magnets with thin film YBCO but the largest volume (90%) of material is in the side magnets so the study together with the simple structural calculation given above gives a good indication of the overall dimensions of the system (minus the cryostat). If a lower overall field were required then other superconducting materials such as MgB2 and BSCCO would be equally implementable with this system. The indicators are that the system is reasonably tolerant to manufacturing tolerances and that there is a fair range of operating temperatures which could be used.

The two example designs have been given and the production of an open face system has been described. FIG. 34 shows an example configuration and this may be considered if a requirement was for a system where easy access to the sample space was described or where, since the correction magnet could be made mobile, it was desirable to actively translate the sample space, although in general an open system is a less efficient system.

3-D Superconducting Dipole Magnet Systems

We have described above the principle of using two groups of magnets (plate magnet and side magnet) to generate a uniform field. For the original study a two-dimensional analysis tool was developed to verify the field distribution on the cross section of the system.

We now describe extension of the tool to a three dimensional model. This model is used to calculate a 3D image of the field distribution inside the Dipole Magnet. End effects have been incorporated and an optimization method invented to minimize the end effects and the material required to build the magnets. The method adjusts the current density in each superconducting bulk independently and determines the optimal distribution for the magnetization of the individual bulks. From this a final 3D solution is produced. The optimised system is able to produce a 3-Tesla uniform field in a one meter tunnel with a 3 cm*5 cm cross section. The uniformity of the field in the tunnel is 200 ppm and the integrated uniformity along the axis of the tunnel is 302 ppm. In addition the field profiles on the central lateral and vertical axes have been studied.

The change in uniformity of the field due to misalignment of the individual bulks is calculated and a tolerance for the positioning of the bulks determined. For individual blocks this has been calculated to be between 0.2 and 0.3 mm. Finally the drift rate of the magnet is shown to be comparable or better than a commercial MRI system.

Thus we now describe the results obtained in a second phase of the feasibility study of using superconducting bulk magnets magnetised by flux pumping for the construction of Dipole Magnets. The output of the work described above was a relatively simple and practical system for achieving a Dipole Magnet using superconducting magnets. The system has two groups of superconducting magnets, i.e. the side magnets producing a background magnetic field and two plate magnets on top and bottom producing a correction field. In the central region of the system, a uniform field was achieved in a cuboid of dimensions 30 mm×50 mm×1000 mm at a minimum flux density of 3 T. The overall uniformity of the field was +/−0.01%.

A two-dimensional model was used above and an infinitely long system was assumed, therefore the end effects and integrated uniformity of the field along the axis of the tunnel were not investigated. In the second phase of study, a fully three dimensional electromagnetic model has been developed to calculate the value of the field at any point inside or outside the system. A whole 3D image of the field profile is presented and the end effects of the system investigated.

To smooth the end effect and to minimize the materials required, an optimisation program was developed to individually adjust the current density in each YBCO bulk. This optimisation algorithm significantly improves the uniformity of the field in the tunnel and reduces the amount of YBCO material. Then we discuss the tolerance of the field in three-dimensional space. The tolerance of the field against the misplacement of the superconducting bulk is also investigated. Finally we describe the stability of the field in this system. Superconductors have finite resistance even in super-conducting state. The magnitude of the super-current will decay with time and hence the value of the trapped field will decrease. "Drift rate" is the parameter which is commonly used to describe the stability of the field for trapped field magnets. The drift rate of this system is estimated using an E-J power law. The relationship between the drift rate and the current density in the superconductors is presented.

Three-Dimensional Model

Figure 37:
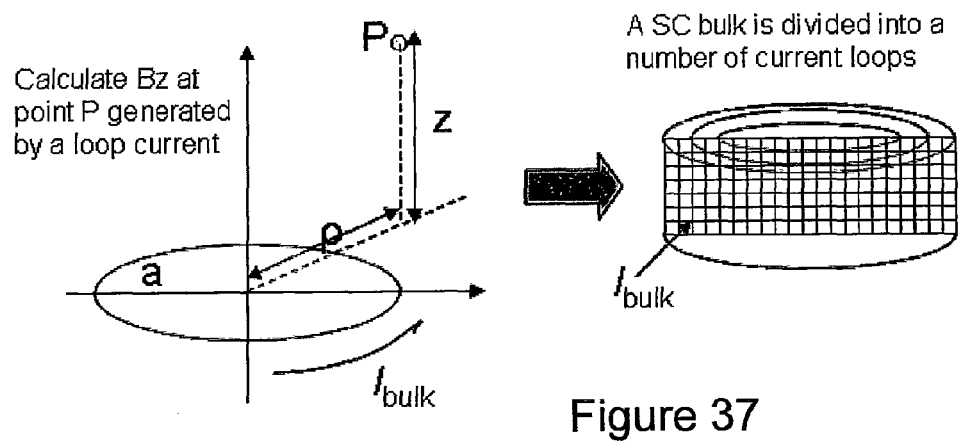
FIG. 37—The vector potential and flux density at a point produced by a current loop.

In order to fully analyse the system a three-dimensional model was constructed. It is written in Matlab and calculates the vector potential A and the flux density B. It is built around the following equations which calculate the contributions of individual current loops to the vector potential and the flux density. Referring to FIG. 37, in spherical polar coordinates, the vector potential A at a given point P is:

$$A_\phi = \frac{\mu I}{\pi k}\left(\frac{a}{\rho}\right)^{1/2}\left[\left(1 - \frac{1}{2}k^2\right)K - E\right]$$

Where $k^2 = 4a\rho[(a+\rho)^2 + z^2]^{-1}$ and K and E are complete elliptic integrals of the first and second kind.

Further to this the flux density $B_z$ at point P is:

$$B_z = \frac{\mu I}{2\pi}\frac{1}{[(a+\rho)^2+z^2]^{1/2}}\left[K + \frac{a^2-\rho^2-z^2}{(a-\rho)^2+z^2}E\right]$$

These equations have been implemented in individual pucks by dividing the cross section of every superconducting puck into many small units (ref. FIG. 37) each unit representing one single current loop. The field at a point P is then the sum of the fields produced by all the current loops.

Figure 38:
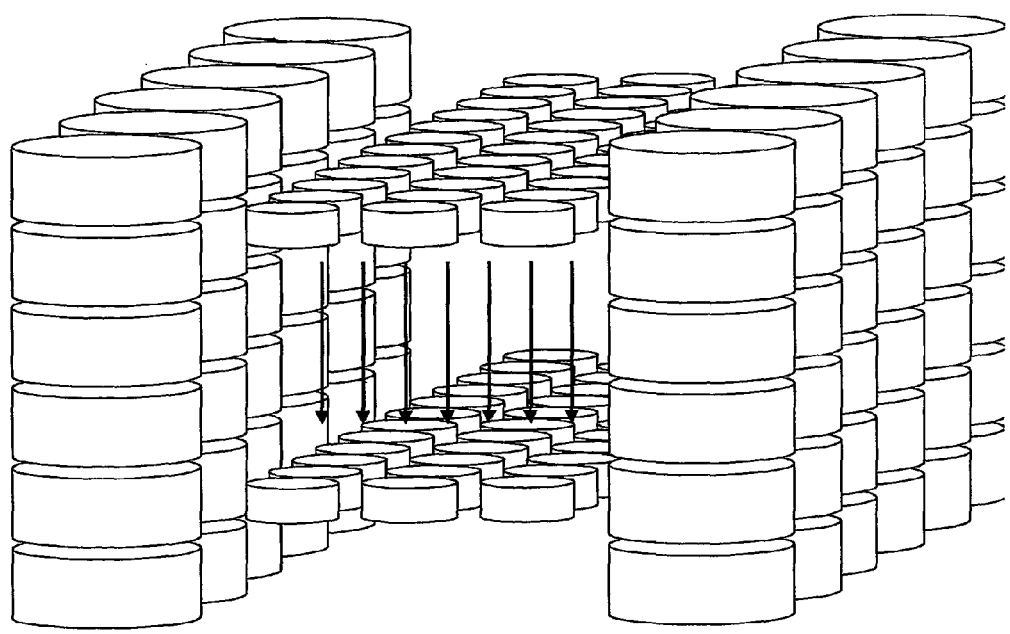
FIG. 38—The field contributed by the plate magnets.

Since the system is linear, having calculated the field distribution due to one puck the geometry may be extended to a group of superconducting pucks and the field distribution in the central region of the system calculated, as shown in FIG. 38.

The area of interest is defined according to requirement of the design. The magnetic flux density in this area is calculated by combining the fields caused by all the magnets in the system. The current density in the plate magnets is 2.4871× $10^9$ A/m² and the current density in the side magnets is 1.25× $10^9$ A/m². These values were obtained in the previous study. The uniformity of the system is defined as the difference between the maximum value and the minimum value of the field inside the region of interest.

In the following the whole magnetic profile in the tunnel will be calculated and the end effect of the system is investigated.

The Study of the End Effect

Figure 39:
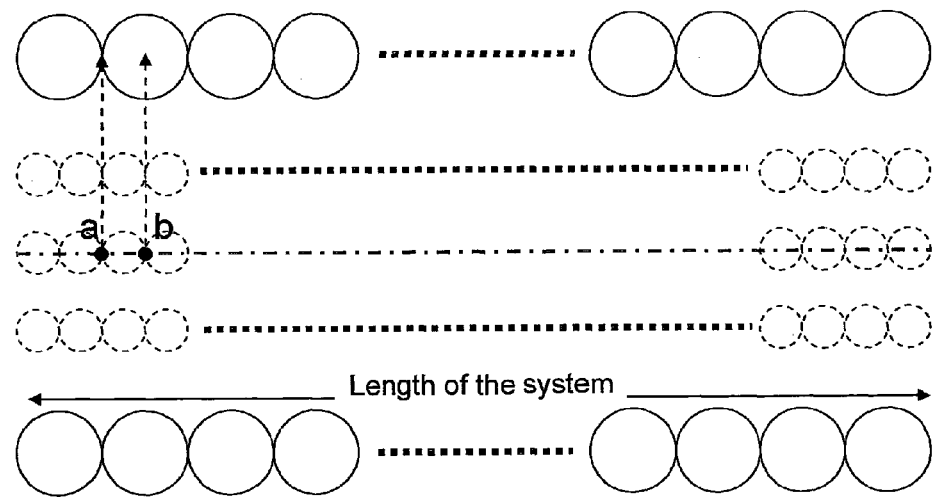
FIG. 39—The geometry of the system looking from the top.

FIG. 39 shows the geometry of the system in xy plane (viewed from the top of the system). The field distribution along the central line of the tunnel is plotted in FIG. 40. In this case, the length of the system is one meter and contains 25 blocks of side magnets in a line and 50 plate magnets in a line.

Figure 40:
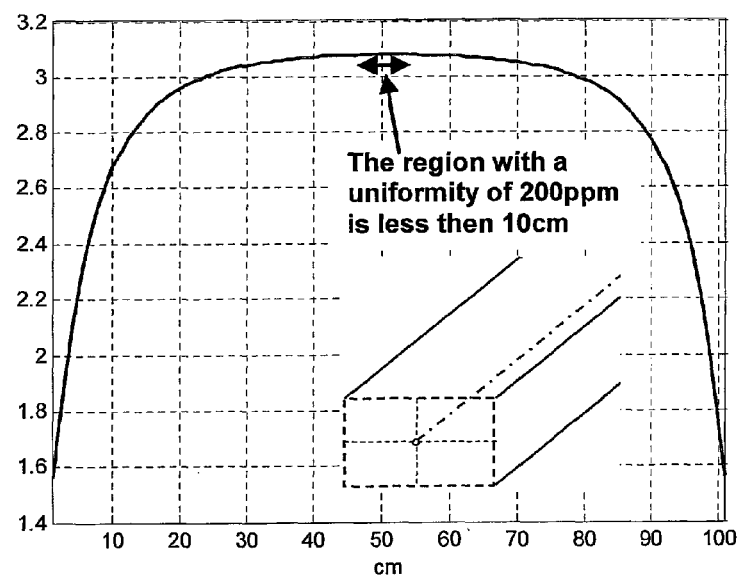
FIG. 40—The field distribution along the central axis of the tunnel.

FIG. 40 shows the field profile along the centreline of the one meter long magnet when the plate magnets are all magnetised equally and the side magnets are all magnetised equally. This was the assumption in the original study. It can be seen from FIG. 40 that the maximum field in the middle region of the tunnel is around 3 T as required, however at the ends of the tunnel, the field drops to 1.6 T which represents a 45% decrease. This strong end effect not only causes degradation of the field at the end of the tunnel but also constrains the uniform region. Only a 10 cm long region in the middle section of the tunnel satisfies the requirements for the system. Therefore to achieve a uniform field (200 ppm) along one meter, the whole system would need to be at least 10 meters long. This is impractical we therefore investigated the effect of varying the magnetisation of the superconducting pucks along the length of the magnet.

Minimize the End Effect by Varying the Magnetisation of the Superconducting Bulks To minimize the end effect a larger current density is used in the bulks closer to the ends by multiplying a factor to the original Jc. This approach will enhance the field at the ends of the tunnel and significantly improve the uniformity along the axis of the tunnel. In order not to change the uniformity perpendicular to the axis of the tunnel (which is determined by the ratio of current densities between the side magnets and plate magnets) the current densities in the side magnets and plate magnets within the same section of the tunnel are increased or decreased by the same factor. In order to achieve this, the side magnets and plate magnets are divided into groups (enclosed by the dashed lines in FIG. 41) and the magnets in each group share the same multiplication factor.

Figure 41:
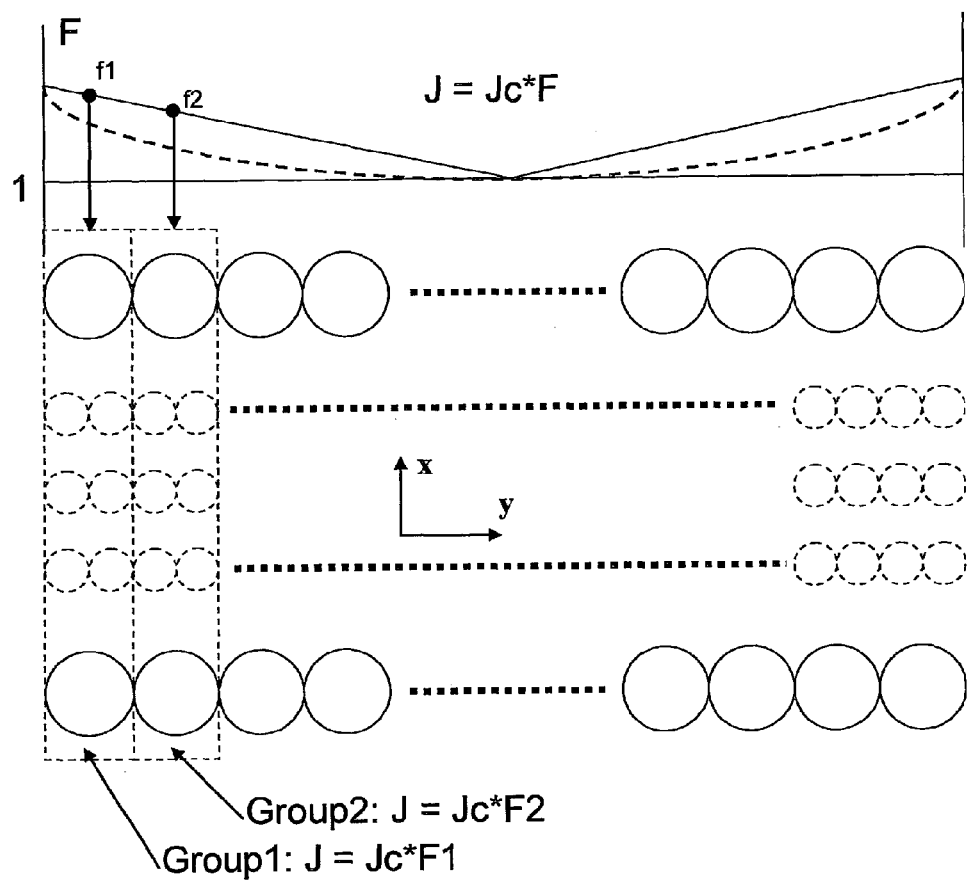
FIG. 41—The scheme of applying compensation current to the bulks close to the end of the tunnel.

We tried several methods of varying the current. The simplest method is to define the multiplication factors as a function of the position along the tunnel, the y coordinate, F=f(y), the value of F equals to 1 at the central point of the system and approaches a maximum value at the ends of the tube (as seen in FIG. 41). The function can be represented by different equations such as a linear equation or $2^{nd}$, $3^{rd}$ or even $4^{th}$ order polynomials.

Figure 42:
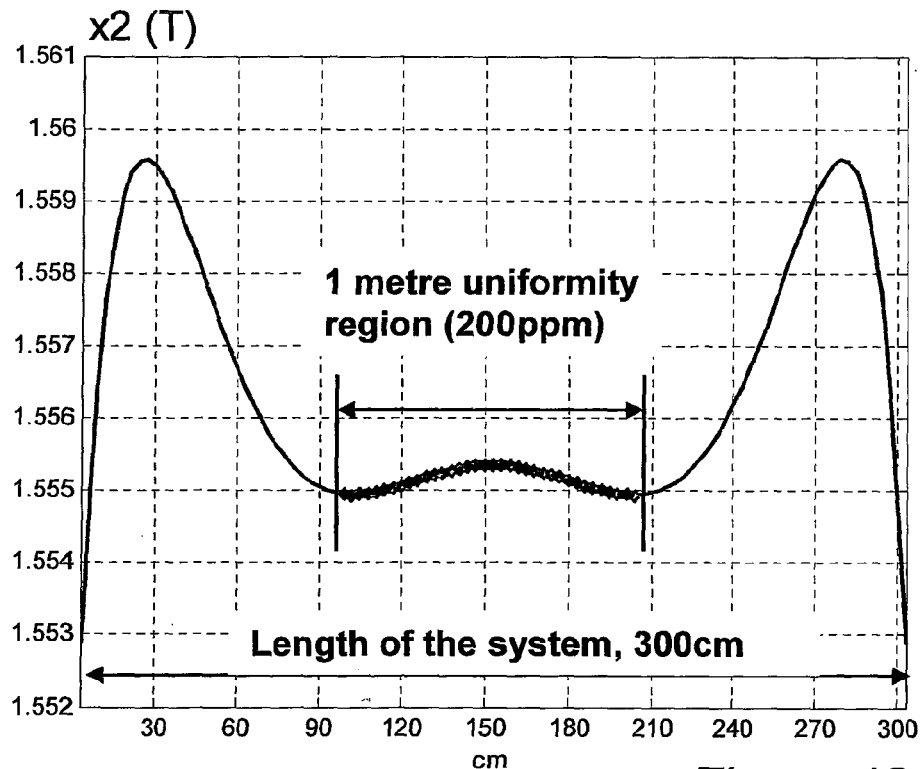
FIG. 42—The field profile along the central axis of the tunnel. The current densities in the superconductors have been modified by a 4th order polynomial equation.

A series of calculations was carried out for different equations and the results show that better uniformity can be achieved by using equations with larger orders. FIG. 42 shows the field profile along the central axis of the tunnel obtained by applying modified current densities to the bulks. The value of multiplication factor increases from 1 at the centre of the tunnel to 1.4 at both ends of the tunnel according to a $4^{th}$ order polynomial equation. Using this scheme the whole system has a length of 3 meters and the uniform region (200 ppm) is about one meter long. However it is difficult to further reduce the total length of the system to less than 3 meters even using polynomials of higher order.

Iterative Optimizing Scheme

To further improve the uniformity and reduce the total length of the system to below 3 meters a more sophisticated optimisation scheme was employed. A program was developed to individually change the current density in every group of magnets. This iterative scheme was used to determine the optimal multiplication factors for each group of magnets.

Figure 43:
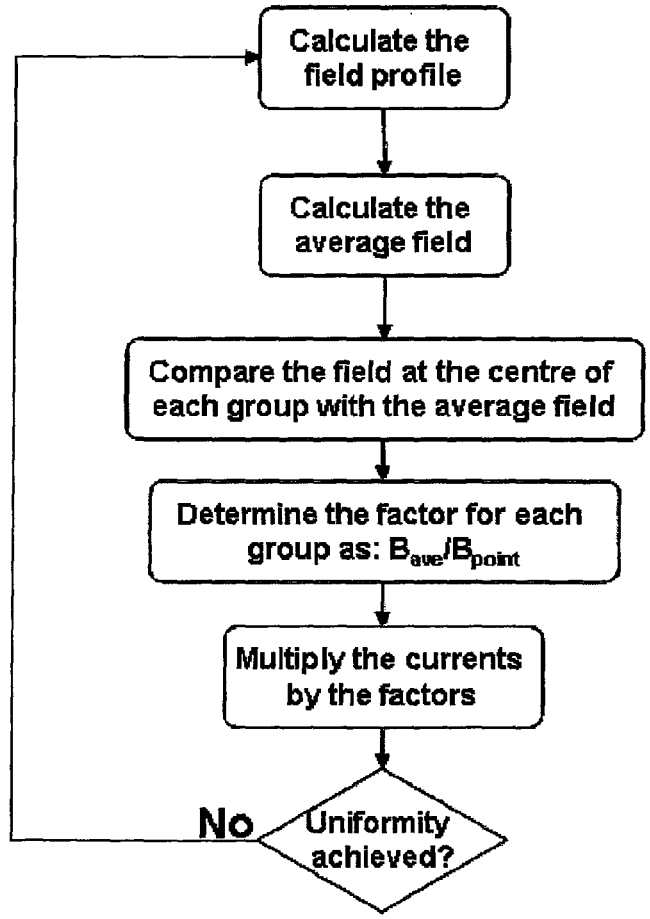
FIG. 43—The flow chart of using interactive scheme to determine the optimal multiplication factors for each group of magnets.
Figure 44:
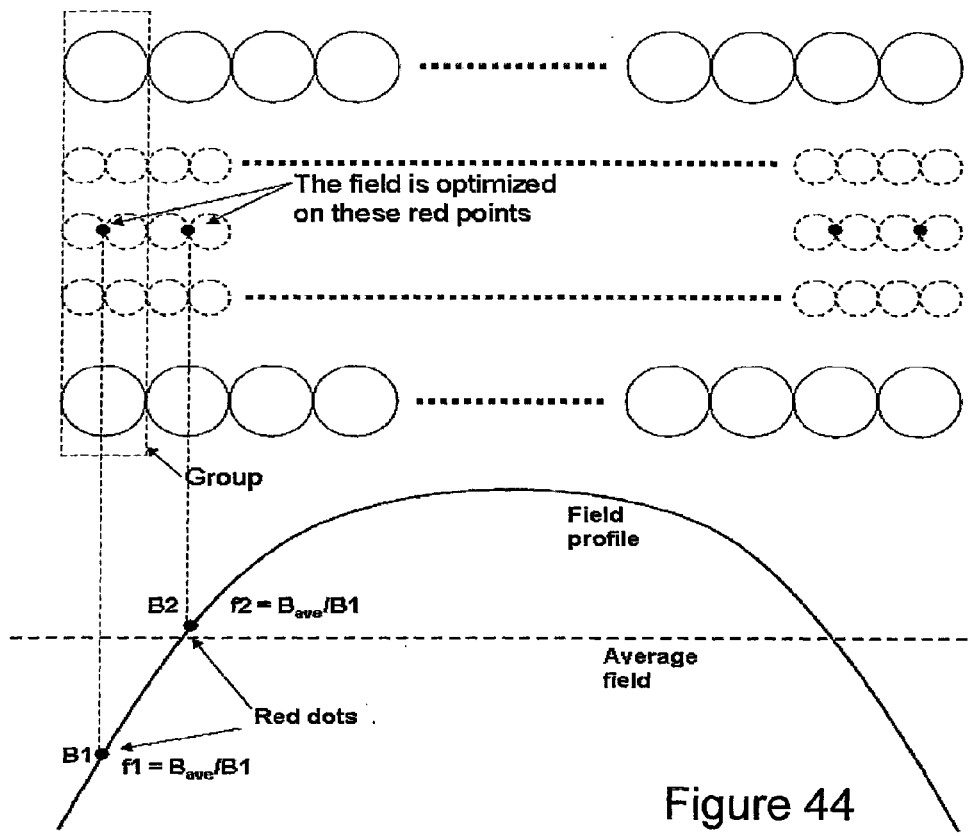
FIG. 44—The schematic plot using interactive scheme to determine the optimal multiple factors for each group of magnets. The field profile is calculated along the central line of the tunnel. The red dot is the reference point where the field is optimized.

The process of this iterative scheme is shown in the flow chart in FIG. 43 and the illustration of the scheme is shown in FIG. 44. Firstly, the field profile along the central line of the tunnel is calculated without the compensation current and the average field is calculated. The multiplication factor for each group is determined by the ratio between the average field and the actual field at the central position of this group (the red dot in FIG. 44). After that the current density in each group is multiplied by its own factors and the average field is re-calculated according to the updated current densities. This process is repeated iteratively until the field profile satisfies the required uniformity.

This optimization method reduces the required length of the whole system to 1.48 meters.

In this 1.48 meter long system, there are 37 groups of side magnets and plate magnets. Each group has two side magnets and 12 plate magnets (the diameter of a plate magnet is half of the diameter of a side magnet). The original current density in the side magnets was $1.25 \times 10^9$ A/m$^2$ and in the plate magnets was $2.4871 \times 10^9$ A/m$^2$. After 400 iterations the final multiplication factors were calculated.

Figure 45:
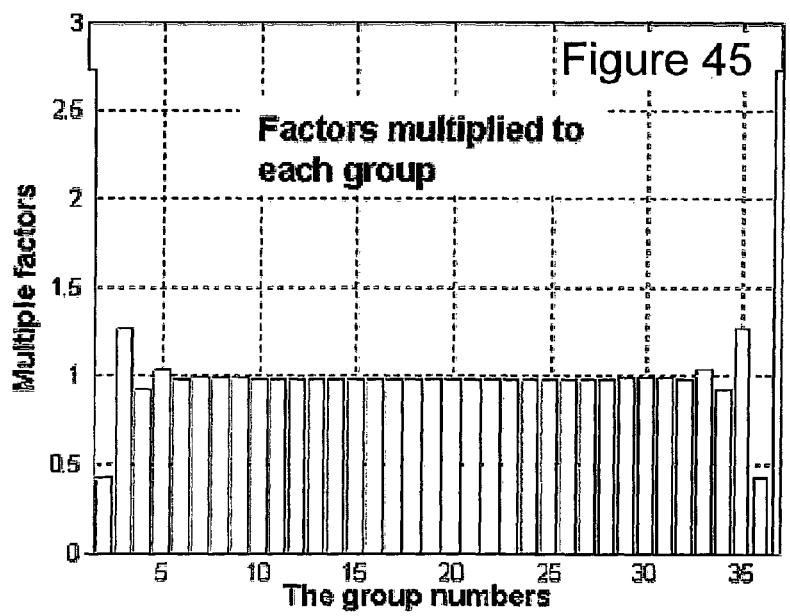
FIG. 45—The multiple factors applied to each group of magnets.

The result of the calculation can be seen in FIG. 45. The maximum multiplication factors of 2.7 occur in the groups at the ends of the tunnel, therefore increasing the maximum current density for the whole system to $6.69 \times 10^9$ A/m$^2$. Only the plate magnets in the end groups have to carry this maximum current density and this current density is well within the limit of best performance that can be provided by bulk YBCO. The second largest multiplication factor is 1.3 which is used for group 3 and 35. The current densities in most of the other groups barely changes and some (2,4,32 and 34) actually reduce.

Figure 46:
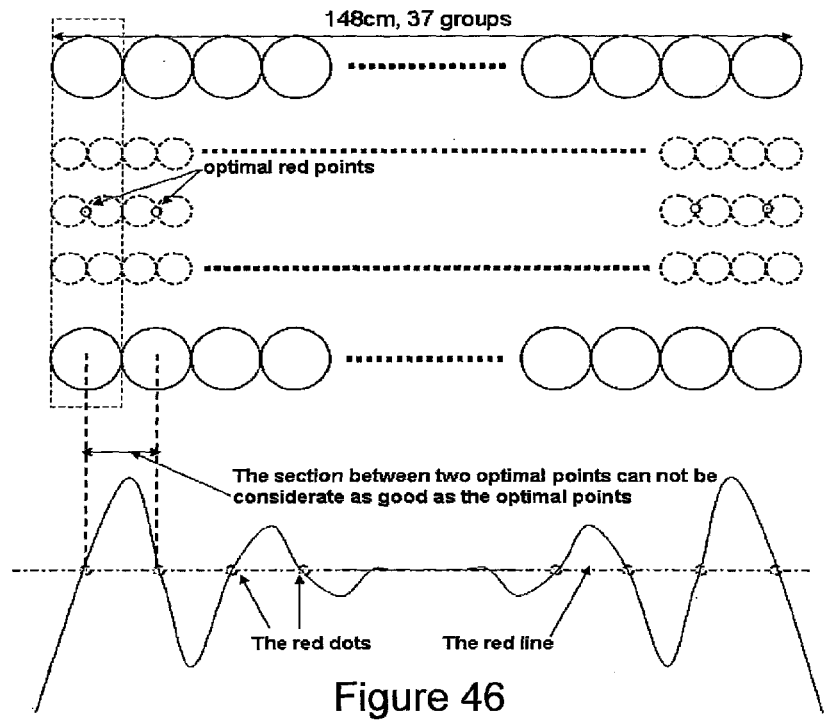
FIG. 46—The schematic plot of the field profile on the optimal points and the sections between the optimal points.

The fundamental limit of this optimization scheme is that only the fields at the centre points of each group have been considered without consideration for the areas in between. Therefore if we plot the values of field at the 37 points the curve is perfectly flat (the dot-dashed solid line in FIG. 46). However, the regions in between two adjacent optimal points can not be as good as the optimal points. So that the real field profile is a fluctuating waveform which passes an average value 37 times, as shown in FIG. 46 (the black solid line).

Figure 47:
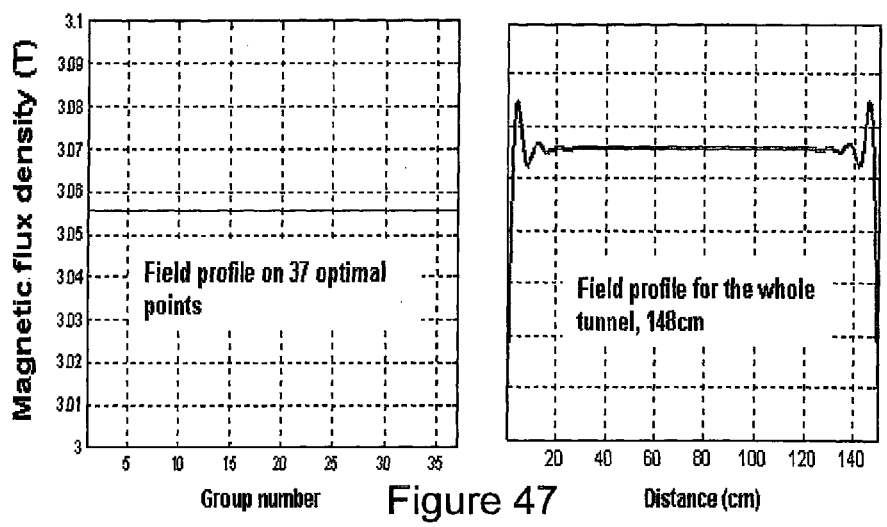
FIG. 47—The calculated field profile at the 37 optimal points (left) and the field profile for the whole region of the tunnel axis including the section in between the optimal points (right).

Running the model using the corrected current densities enables us to compare the values of field at the optimal points and for the whole length of the magnet as is shown in FIG. 47. As can be seen in the plot on the right in FIG. 47, the length of the system is 148 cm and only the section in the middle of the tunnel is uniform. The uniformity within the central 100 cm section meets the requirement (200 ppm). A close-up figure of this region is shown in FIG. 48.

According to the results and discussion presented above, it is not difficult to see that the best uniformity that can be achieved is determined by the number of optimal points, or determined by the size of the side magnets. If side magnets of smaller diameter are used, the system could be divided into more groups along the tunnel, therefore the same uniformity can be achieved by a shorter system. However, reducing the size of the side magnets will reduce the magnitude of the field, so larger current densities are required in each bulk to maintain the 3 T field in the centre of the system. Additionally, changing the size of the magnets will also change the balance between the field produced by the side magnets and plate magnets and change the uniformity on the cross section of the tunnel obtained in the previous study. To preserve this uniformity, we will leave the geometry unchanged and conclude that 148 cm is the minimum required length of the system to produce a uniform region of 100 cm. However, if the material cost saving is significant enough to justify further size reduction of the system, it can be achieved through re-designing of the whole system.

So far we have obtained an optimum solution to the design. The length of the system along the tunnel axis is 1.48 meter. There are two lines of side magnets. Each line contains 37 blocks. There are six lines of plate magnets (3 lines on top and 3 at bottom) and each line contains 74 blocks. The uniformity within the one meter section is better than 200 ppm. But it has to be noted that only one dimensional uniformity along the axis of the tunnel was considered in the optimising program on the assumption that the uniformity on the cross section of the tunnel, which was determined in the previous study, will not change. In the following discussion, we will verify this assumption by calculating the field profile for the whole 3D space along the magnet. The integrated uniformity will also be calculated.

Field Profile in 3D:

Integrated Uniformity

The integrated field $B_{int}$ is defined as the integral of $B_z$ along the y axis of the magnet. The average field is calculated by $B_{ave}=B_{int}$/length, thus:

$$B_{ave} = \frac{\int_{-length/2}^{length/2} B_z(y)\,dy}{length}$$

Figure 50A:
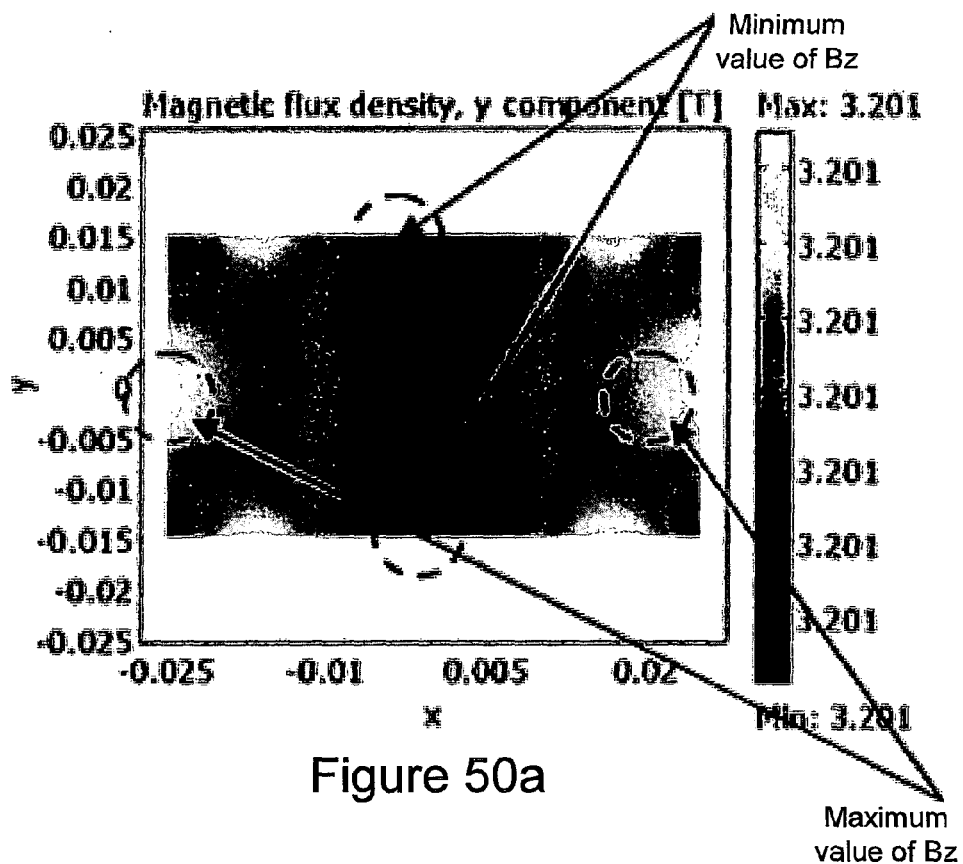
FIG. 50—The locations of the maximum and minimum values of the Bz on the cross section of the tunnel.
Figure 50B:
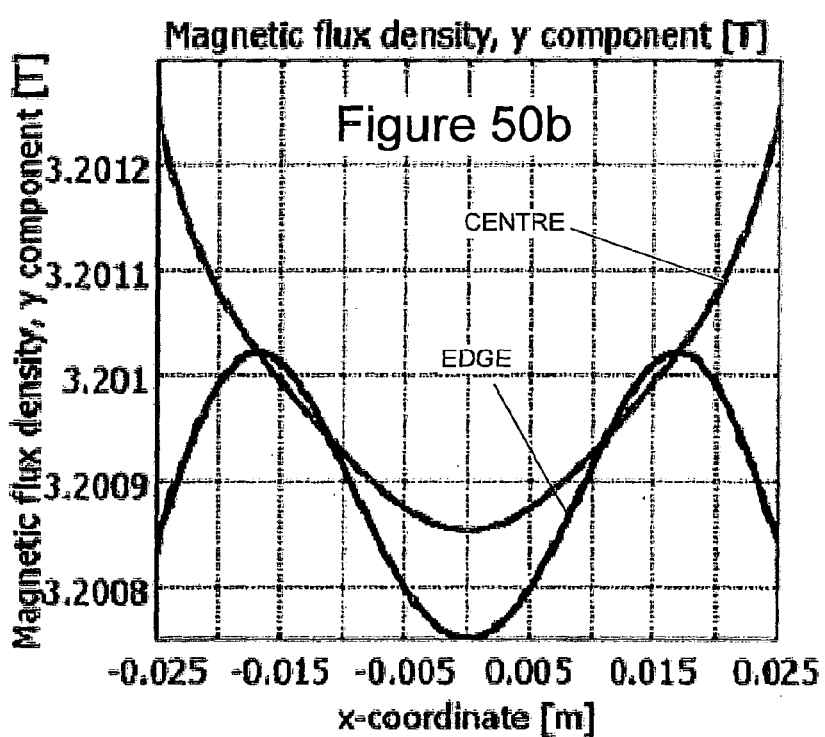

The integrated uniformity is determined by the discrepancies between the values of average field at every point on an xz plane, as shown in FIG. 49. In theory, the integrated fields have to be calculated at all the dots in the figure. But the previous study showed that the maximum and minimum values of the field on the cross section of the tunnel are always located on the edge of the rectangle, as shown in FIG. 50.

Therefore only the points on the edges of the cross section need to be calculated. Symmetry allows the reduction of the points further down to half the length of each edge. These simplifications significantly reduce the computational time of the program. The total points used to calculate the integrated uniformity are therefore reduced to those given in FIG. 50.

Figure 52:
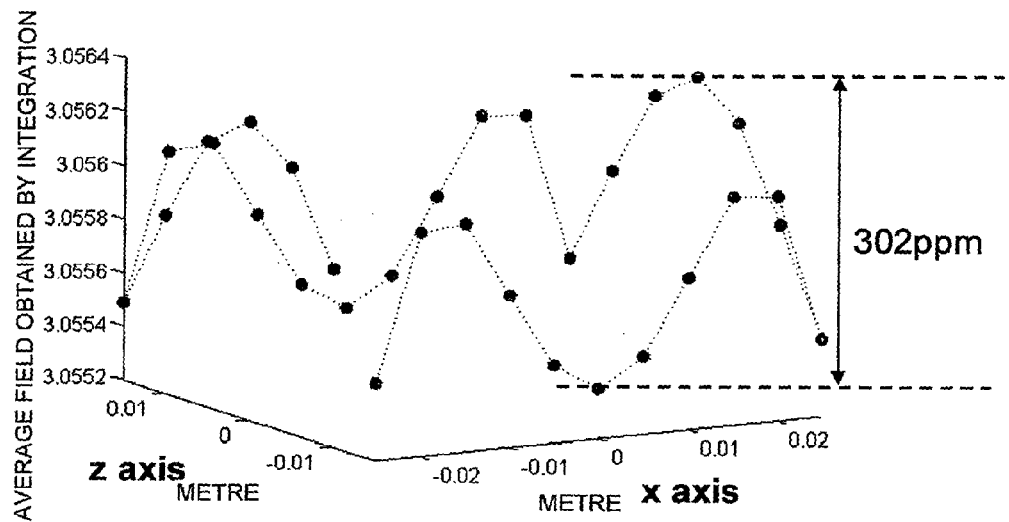
FIG. 52—The integrated uniformity of the system.

The values of the average field on the edge of the cross section are calculated by the program and plotted in FIG. 52. In this figure, the x and z axes represent the position of the points in the xz plane, the height represents the magnitude of the average field. It can be seen from the figure that, the value of average field changes between 3.05615 T to 3.05523 which gives an integrated uniformity as 302 ppm. This number is well within the desired 1000 ppm integrated uniformity.

Integrated Field on the Central Axes of the System

Figure 53:
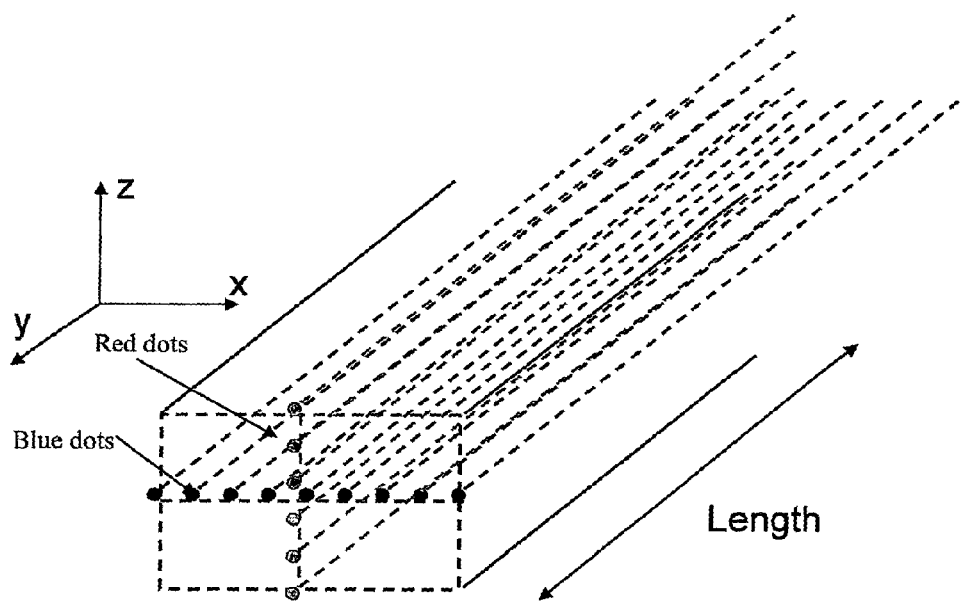
FIG. 53—The points used to evaluate the integrated field along the central lines of the system.

The previous section focused on the integrated uniformity over the whole region of the cross section. When a Dipole Magnet is used in an accelerator it is normally the field profile on the horizontal and vertical central planes of the system which are of practical interest, as shown in FIG. 53. Therefore in this section, we will focus on this area.

Figure 18:
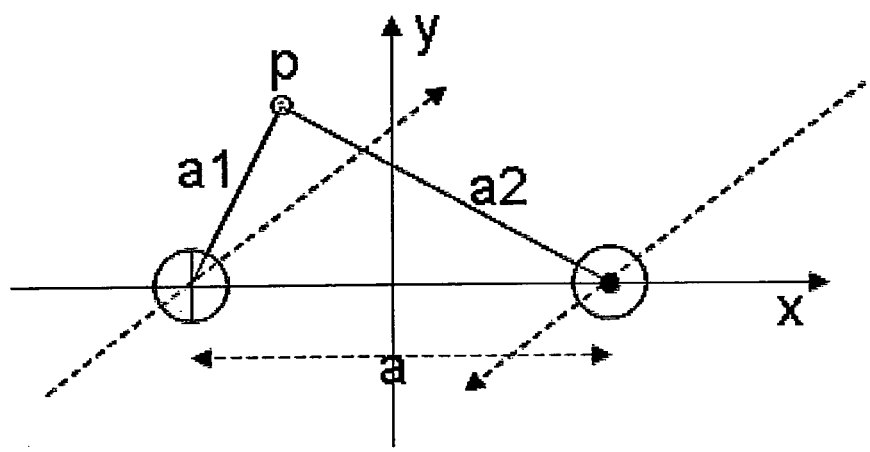
FIG. 18—A pair of parallel wires at a distance a carrying current in opposite directions.

The integrated average field is calculated along the vertical (red dots) and horizontal (blue dots) central lines shown in FIG. 53. The field profile is plotted in FIG. 18. The integrated uniformity along the vertical central line is 163 ppm and the integrated uniformity along the horizontal central line is 196 ppm. These numbers are much better than the integrated uniformity for the whole region of the system. This indicates that the system is able to deliver better performance in a practical accelerator than the requirements of design.

Field Profile and Integrated Uniformity Outside the System

Figure 54:
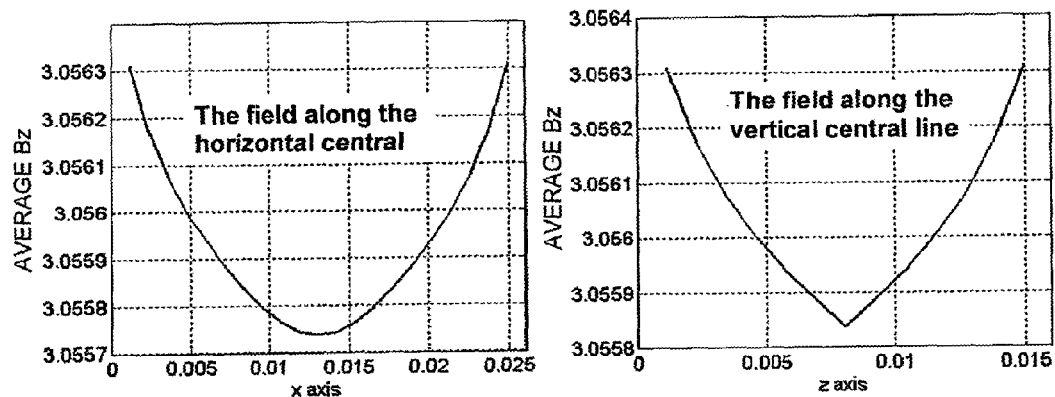
FIG. 54—The integrated field along the horizontal slice (the blue dots in FIG. 17), and the vertical slice (the red dots in FIG. 17) for the one meter uniform section.
Figure 55:
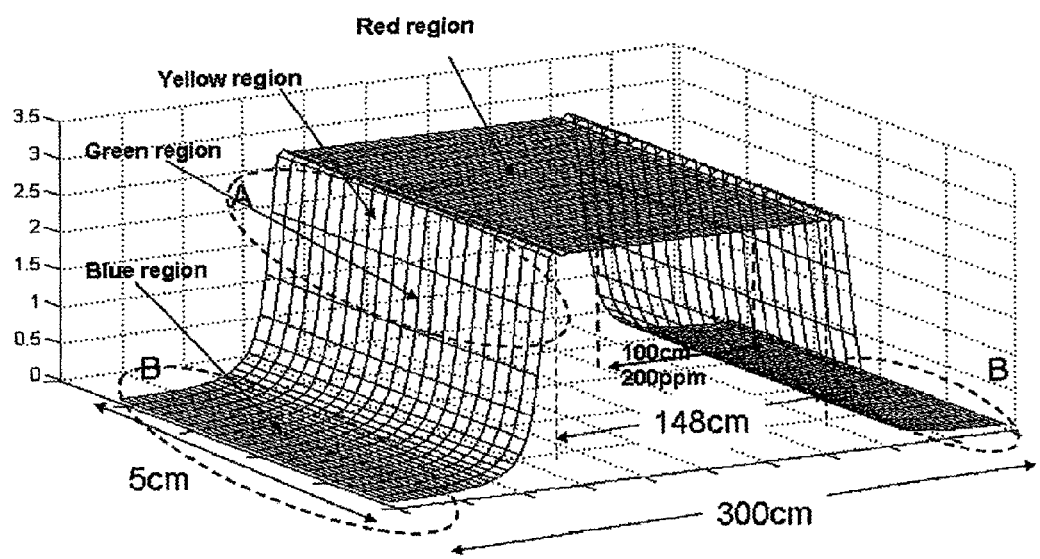
FIG. 55—The field profile on the central horizontal slide, in the region: $-150$ cm$<$y$<$150 cm, $-2.5$ cm$<$x$<$2.5 cm, z=0.
Figure 56:
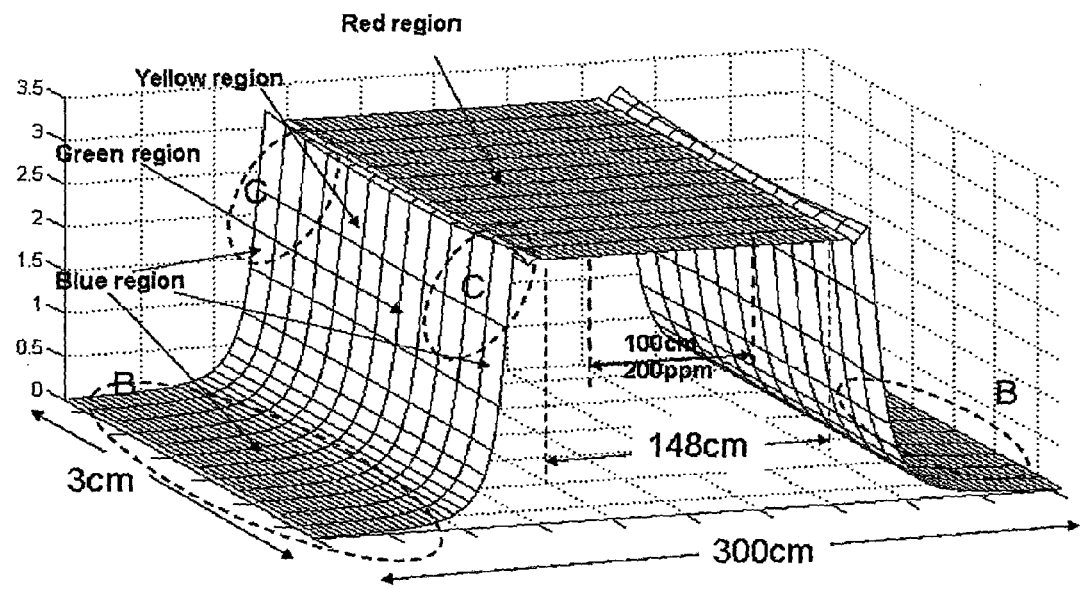
FIG. 56—The field profile on the central vertical slide, in the region: $-150$ cm$<$y$<$150 cm, $-1.5$ cm$<$z$<$1.5 cm, x=0.
Figure 57:
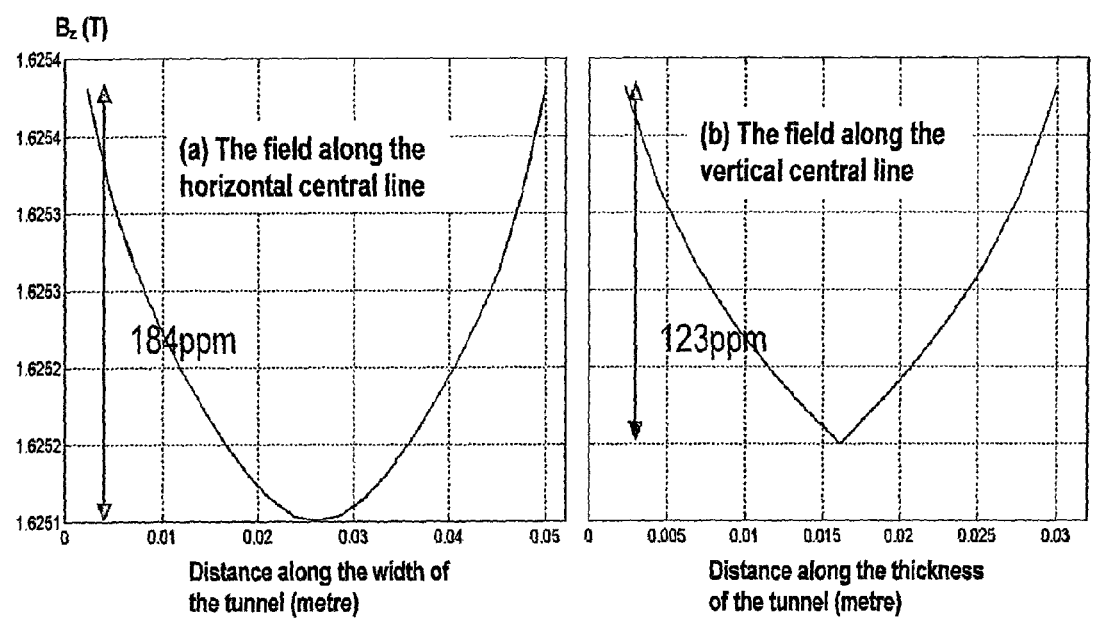
FIG. 57—The integrated field along the horizontal slice (the blue dots in FIG. 17), and the vertical slice (the red dots in FIG. 17) for the whole 3 meter span.

When a Dipole Magnet is used in a particle accelerator, the field outside the uniform region is also an important issue because the travel of the electron beam would have already been affected by the external field before it reaches the uniform region. In this section, the study focuses on the field profile from negative infinity to positive infinity positions along the axis of the tunnel. In FIGS. 55 and 56, the field profile on the horizontal (blue dots in FIG. 53) and vertical (red dots in FIG. 53) slides is plotted. In this case we use +/−1.5 meter to approximate +/− infinite positions because, as can be seen in the figures, at the end of the three-meter section the field drops to almost zero. The integrated uniformity for the horizontal and vertical slide for the whole 3 meters span is plotted in FIG. 57. Because the average field includes the external fields too, the magnitude of the integrated average field is lower than that shown in FIG. 54.

There are two major features of these two figures. One is that the field does not become negative outside the system. As can be seen in region "B" in FIGS. 55 and 56, the magnitude of the field gradually approaches zero. This means that no "decelerating" effect (no negative field) would be applied to the electron outside the tunnel. The second feature is that the magnitude of the field decreases almost uniformly in the region outside the tunnel. In region "A" in FIG. 55, along the width of the tunnel, the colours in the plot change uniformly from red to yellow to green and finally to blue. This phenomenon indicates a very good integrated uniformity (184 ppm) on the horizontal slice for the span from negative infinity to positive infinity, as shown in FIG. 57(a).

For the vertical slice, shown in FIG. 56, the decrease of the field outside the tunnel is slightly less uniform than that in the horizontal slice. Tiny variations of the colour can be observed in region "C" in FIG. 56. The fields close to the edge decrease faster than the ones in the centre. Interestingly, this phenomenon actually enhances the uniformity of the external field. The reason for this is that the integrated field tends to be lower in the centre than at the edge. Therefore a more rapid drop of the field on the edge only compensates for this difference.

The Tolerance Against the Misplacement of One Block in the System

The uniform field produced by this system is obtained from combining the field produced by the plate magnets and side magnets. The field produced by the plate or side magnets is determined by two major factors: the current density in the bulk and the position of the bulk. Flux pumping (our WO2007/045929) can, for example, precisely control the current density, therefore, the accuracy of the field produced by the system is mainly determined by the positioning of each superconducting bulk. In this section, the tolerance of the uniformity of the field is investigated in the situation that one of the superconducting bulks is misplaced by a certain distance. The study will focus on the detailed field profile on the central horizontal slice within the 1 meter uniform region because this region has the most significant influence on the electron beam.

Figure 58:
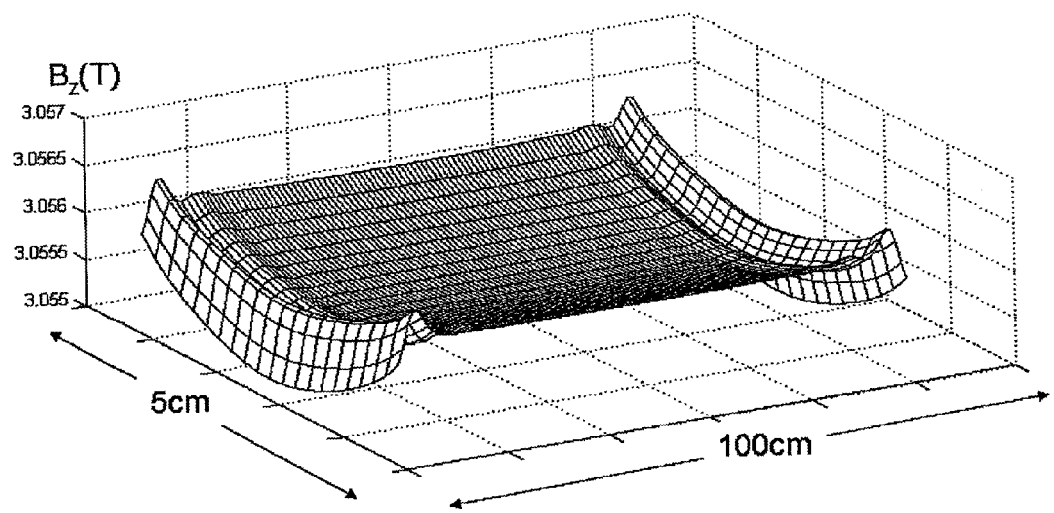
FIG. 58—The detailed field profile on the horizontal slice with in the one meter section.
Figure 59:
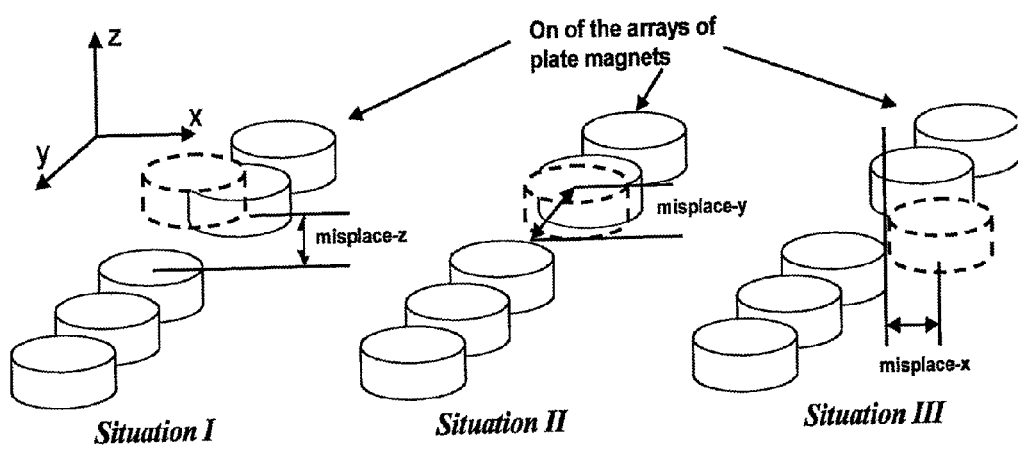
FIG. 59—The configuration of one of the bulk is misplaced. In situation one the bulk is displaced along the z axis by a certain distance; in situation two, along the y axis; in situation three, along the x axis.
Figure 60:
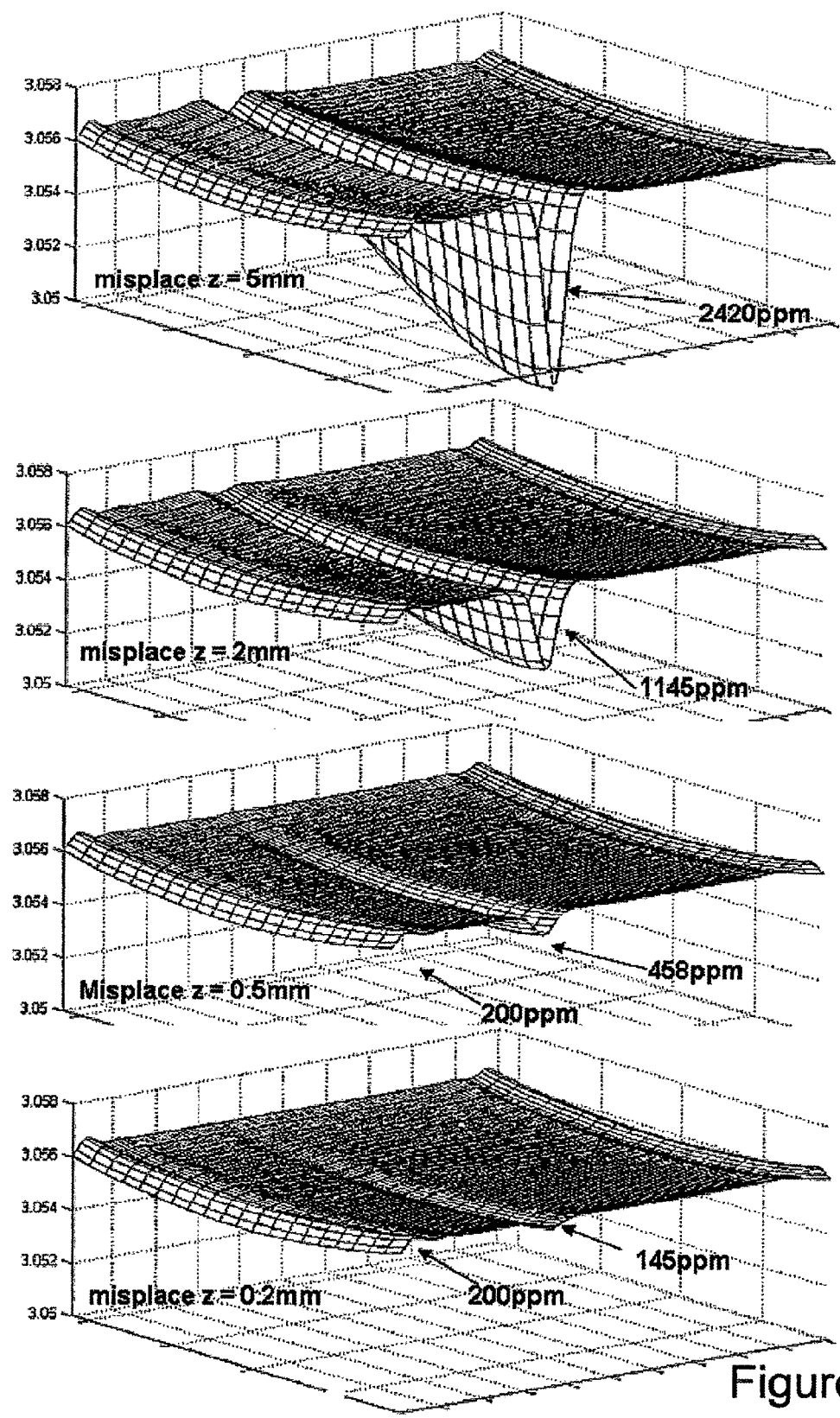
FIG. 60—The field profiles on the horizontal slice with different distances of misplacement in the z direction (situation I).
Figure 61:
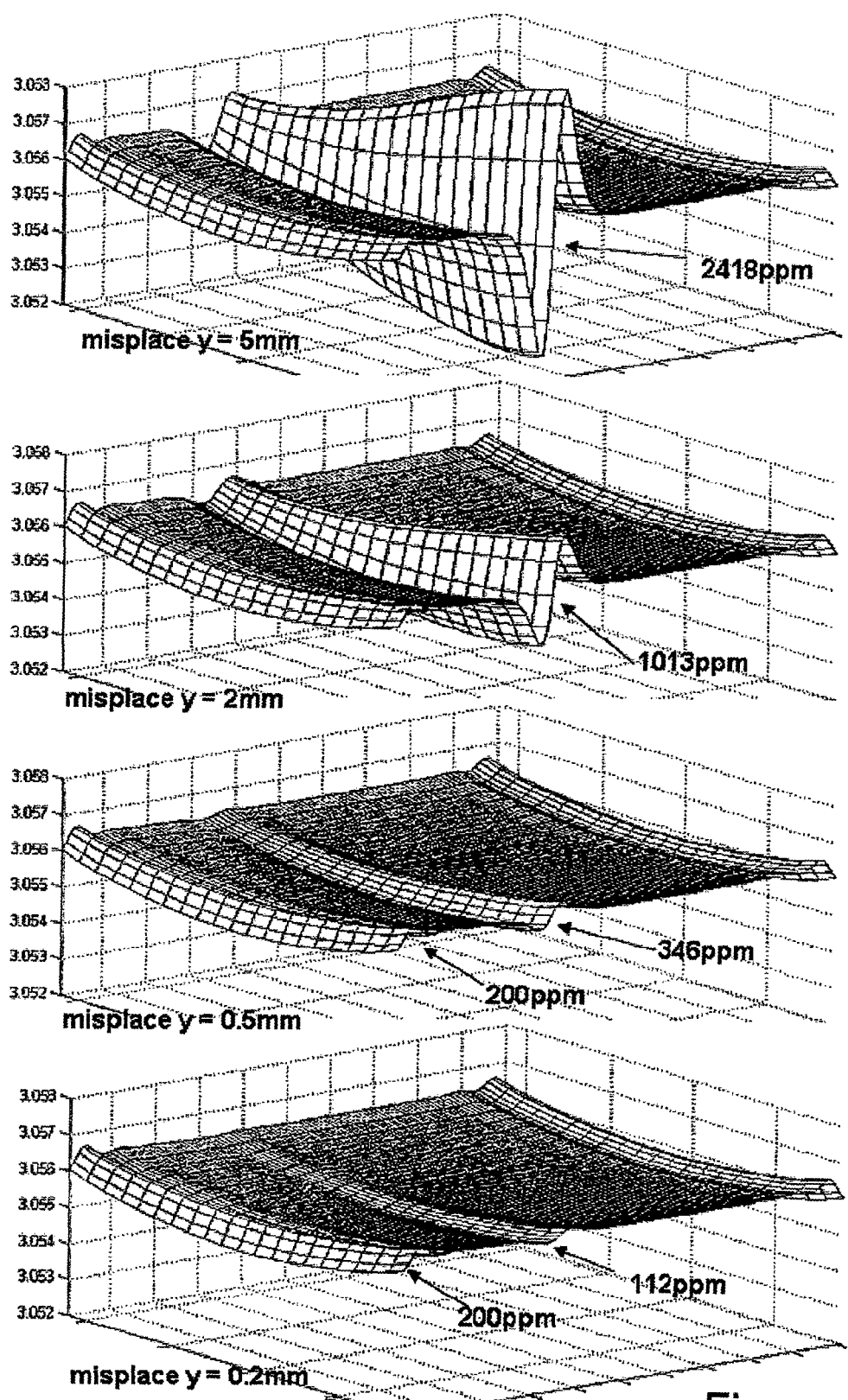
FIG. 61—The field profiles on the horizontal slice with different distances of misplacement in the y direction (situation II).

FIG. 58 shows the field profile on the horizontal slice when all the SC bulks are at the correct positions. A series of calculations have been carried out to calculate the field profile when one of the bulk is misplaced by a distance along z axis (situation I), y axis (situation II) and z axis (situation III) respectively, shown in FIG. 59. Four different values of misplacement, 5 mm, 2 mm, 0.5 min and 0.2 mm, are used in the calculations. In FIGS. 60 and 61, the field profiles are plotted for each situation with different values of misplacement.

For the situations shown in these three figures, the misplaced block is the 31$^{st}$ block located in the top plate in the array of magnets on the right. FIG. 60 shows the field variation when the misplaced block is lifted (moved up along z axis) by different distances. The field drops at the point where misplacement occurs. When the block is lifted by 5 mm, 2 mm and 0.5 mm the uniformities are degraded to 2420 ppm, 1145 ppm and 485 ppm respectively. These values are all beyond the required uniformity. When the misplacement is 0.2 mm, the non-uniformity introduced by misplacing the block (145 ppm) is less than the uniformity at the corner of the horizontal slice (200 ppm), which means the misplacement will not change the overall uniformity of the system. Calculation shows that if the misplacement along z-axis is less than 0.22 mm, the overall uniformity of the system will not be degraded.

Figure 62:
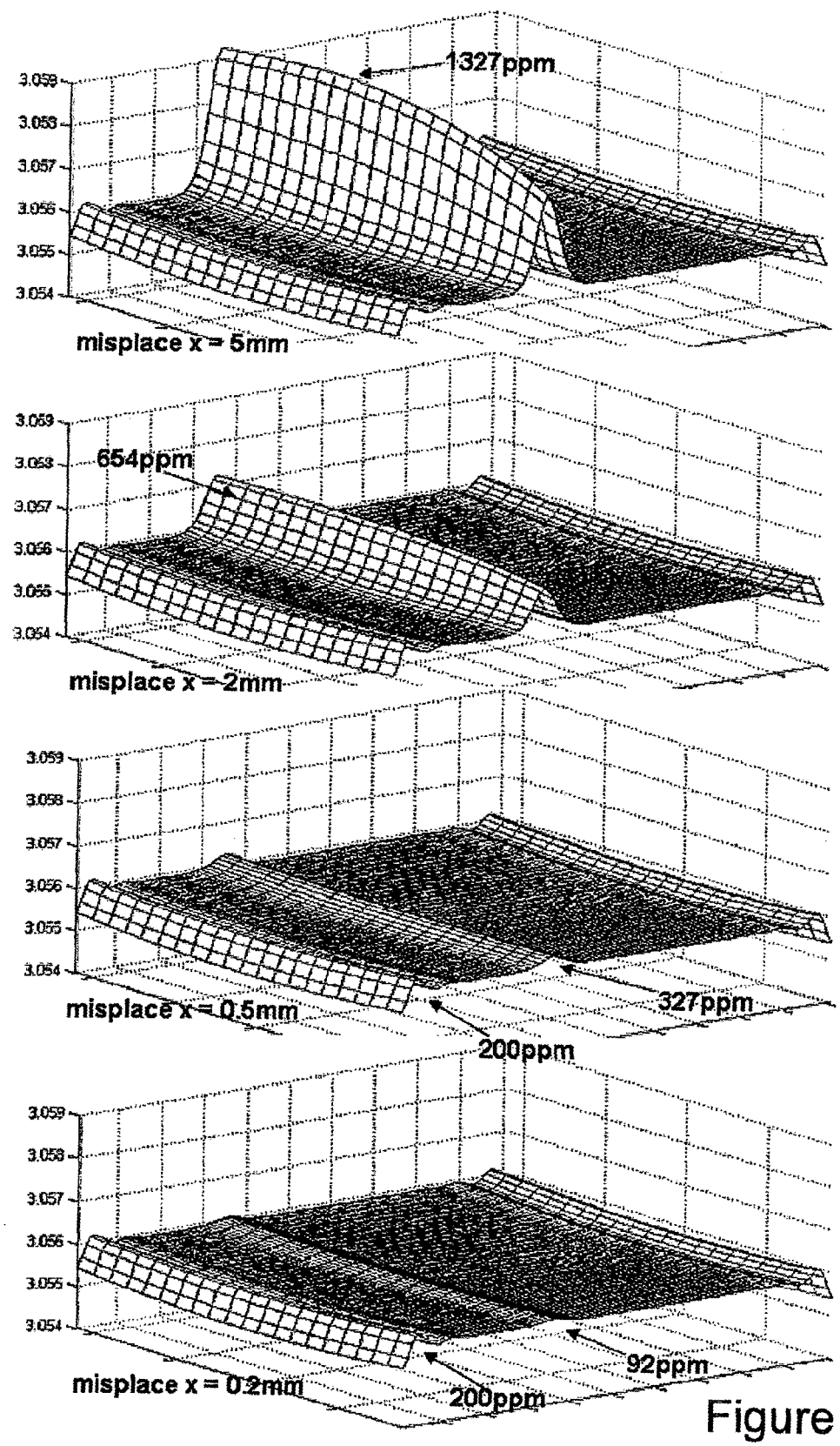
FIG. 62—The field profiles on the horizontal slice with different distances of misplacement in x direction (situation III).

The observation is similar when the misplaced block is moved sideway (along the y-axis and the x-axis), as shown in FIGS. 61 and 62. When the block is moved along the y-axis, the misplacement causes the field to increase on one side of the moved magnet and decrease on the other side. When the block is moved along the x-axis (towards the centre of the system) the field increases at the position around the moved block. On the other hand, if the block is moved away from the centre along x-axis, the field will decreases.

However, the overall non-uniformity introduced by moving the block along x and y axis is smaller than that introduced by moving the block along the z-axis. After calculation, the result shows that the tolerances of the uniformity against the misplacement in y and x directions are 0.24 mm and 0.33 mm.

Field Decay and Drift Rate

A superconductor is commonly assumed to have zero resistance; in practice a superconductor in a Dipole Magnet system does not have absolutely zero resistance. The resistance of a superconducting magnet comes from two sources. First the superconductor itself. The behaviour of a superconductor is best described by an E-J power law, at a current density equal to and above Jc electric field, and therefore resistance, is developed rapidly as the current density is increased. However below Jc there is still an electric field the value of which is dependent on the n-value of the power law and the percentage of Jc. Second, if the system uses wires, then there is resistance developed in superconducting joints. The system proposed in this report does not have joints resistance.

For superconducting materials, the n-value, a quality index, is used to characterise the resistive behaviour in a wire or bulk near its superconducting transition. For LTS materials, this value is typically very high (>200), which indicates a very low resistance under ordinary operating conditions. However, for HTS materials, especially BSCCO tapes, the n-value is fairly low (15~25). The n-value for YBCO material is in between BSCCO and LTS. A reasonable estimate is between 30 and 50 depending on the quality of the sample. This finite n-value could give some resistance that may not be negligible for this Dipole Magnet when in persistent mode. Although constantly using the flux pump to top-up the current is an option, we would like to design a magnet with a resistance which is low enough, such that the magnet could potentially be operating in persistent mode for a long period of time.

To estimate the resistance due to the finite n-value, we start from the E-J power law:

$$E = E_0 (J/J_c)^n$$

and resistivity:

$$\rho = dE/dJ.$$

After manipulation the resistivity can be expressed as:

$$\rho(J) = \frac{E_0 \cdot n \cdot (J/J_c)^{n-1}}{J_c}$$

This equation shows that the resistivity is a function of the current density J used in the superconducting wires or bulks. The resistance increases dramatically when the superconductor is used with a current close to the maximum Jc which can be provided by the sample. To achieve an optimal design, we can always choose an appropriate current density Jc to ensure that the resistance does not lead to a drift rate larger than required.

The drift rate is calculated by dividing the energy loss per hour in DC conditions by the total energy stored in the superconducting magnets. The energy loss per hour is expressed as:

$$W_{loss} = 3600 * I^2 R$$

Where, for the system using bulk materials, I is the average current flowing in the bulk and R is the average resistance of the bulk which is calculated from the resistivity $\rho(J)$ presented above.

The total magnetic energy stored in the system is calculated by:

$$\iiint_v \frac{B \cdot H}{2} dv$$

Where B and H are magnetic flux density and magnetic field intensity, and the integration is carried out over the whole space of the system.

Figure 63:
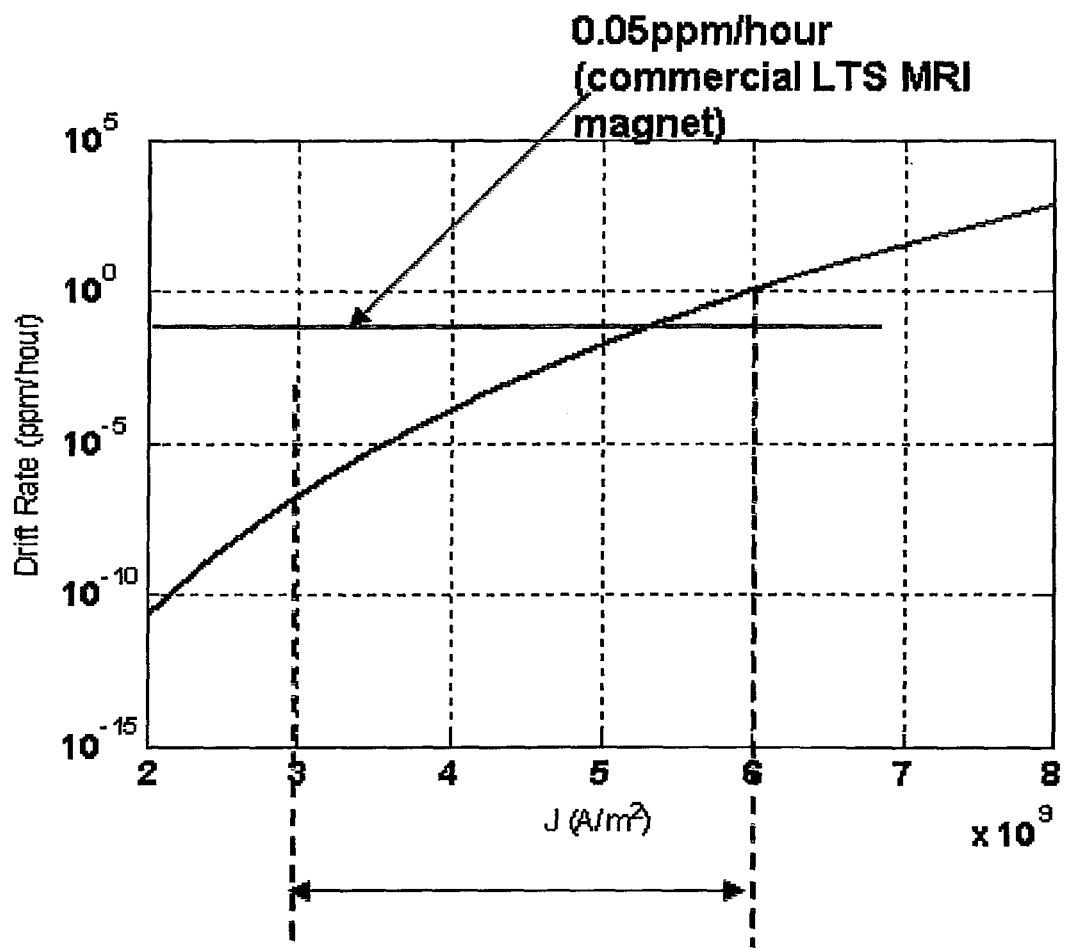
FIG. 63—The drift rate of the system against the current density used in the bulk.

FIG. 63 shows the values of drift rate versus different values of current density for the bulks in the system. The curve is shown between $2 \times 10^9$ A/m$^2$ to $8 \times 10^9$ A/m$^2$. The maximum current density which can be provided by a YBCO sample is about $11 \times 10^9$ A/m$^2$ at 4 K. The current density used in this design varies from $3 \times 10^9$ A/m$^2$ to $6 \times 10^9$ A/m$^2$. In this region, the drift rate varies from $10^{-7}$ ppm/hour to 1 ppm/hour. The drift rate of a commercial Superconducting MRI system is also given in the figure for reference.

SUMMARY

We have investigated using bulk superconductors to build a Dipole Magnet. Initially, the structure of using two groups of magnets (plate magnet and side magnet) to generate a uniform field was established. A two-dimensional model was developed to verify the field distribution on the cross section of the system. Then the tool was extended to a three dimensional model. This model is used to calculate a true 3D image of the field distribution inside the Dipole Magnet.

An optimization method was described to minimize the end effect. This method adjusts the current density in each superconducting bulk individually and applies compensation current to the bulks close to the end of the tunnel to reduce the field drops. The required length of an example of the system is therefore reduced from 10 meters to 1.48 meter. This example system is able to produce a 3 T uniform field in a one meter tunnel with a 3 cm*5 cm cross section. The uniformity of the field in the tunnel is 200 ppm and the integrated uniformity along the axis of the tunnel is 302 ppm.

We also presented the results of the field distribution outside the system. The field profile on the central horizontal slice of the system is plotted from negative infinity to positive infinity. The integrated uniformity from infinity is even better than the integrated uniformity inside the tunnel.

The cost for the YBCO material depends on the length of the system but could be reduced if smaller bulks are used for side magnets. To further reduce the cost a more sophisticated optimization program could take both the uniformities in zx plane and y axis into consideration together. We also investigated the effect on the uniformity of the system of misalignment of the blocks in order to determine the manufacturing tolerances which would be required in order to manufacture the system. Finally the drift rate of the magnet was calculated and shown to be within a limit of 1 ppm/hour or less.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A superconducting magnet system for generating a uniform magnetic field, the system comprising:
    first and second sets of superconducting pucks or solenoids along each of first and second sides of
    the superconducting magnet system;

third and fourth set of superconducting pucks or solenoids along each of third and fourth sides of the superconducting magnet system; and wherein at least one of the said first, second, third and fourth sets of superconducting pucks or solenoids has a magnetisation of said superconducting pucks or solenoids which varies along a longitudinal
- direction of said superconducting magnet system;
- wherein said variation has a waveshape which has an amplitude which increases towards an end
- of said superconducting magnet system;
- wherein said waveshape has the form of a ringing pulse having an amplitude which decays in a
- direction away from said end towards a centre of said superconducting magnet system; and
- wherein said waveshape defines magnetisation values of said superconducting pucks or solenoids at discrete positions at which said superconducting pucks or solenoids are located.

2. A superconducting magnet system as claim 1, wherein each of said first, second, third and fourth
- sets of superconducting pucks or solenoids has a magnetisation of said pucks or solenoids which varies
- along said longitudinal direction of said superconducting magnet system with a said variation defined by
- said waveshape.

3. A superconducting magnet system as claim 1, wherein said wherein said variation has a said
- ringing pulse waveshape which has an amplitude which increases towards each longitudinal end of said
- superconducting magnet system.

4. A method of creating a uniform magnetic field using a superconducting magnet system, the
- method comprising:
- providing a majority of said uniform magnetic field using first and second set of superconducting pucks or solenoids along each of first and second sides of
- the superconducting magnet system, and
- third and fourth set of superconducting pucks or solenoids along each of third and fourth sides of
- the superconducting magnet system; and
- compensating for non-uniformities of said magnetic field in a central region of said
- superconducting magnet system by applying a variation to a magnetisation of at least one of said first, second, third and fourth sets of superconducting pucks or solenoids along a longitudinal direction of said superconducting magnet system, wherein said variation has a waveshape which has an amplitude which increases towards an end of said superconducting magnet system, wherein said waveshape has the form of a ringing pulse having an amplitude which decays in a direction away from said end towards a centre of said superconducting magnet system, and wherein said waveshape defines magnetisation values of said superconducting pucks or solenoids at discrete positions at which said superconducting pucks or solenoids are located.

5. A superconducting magnet system for generating a uniform magnetic field, the system comprising
- at least three magnets in two sets, at least a first of said sets comprising an oppositely disposed pair of
- superconducting magnets, a second of said sets comprising at least one further magnet, wherein said further
- magnet is disposed such that there exists a three dimensional region in which a magnet field produced by
- said further magnet is substantially parallel to a magnetic field produced by said pair of superconducting
- magnets, and wherein one of said sets of magnets is configured to produce first, bulk component of said
- magnetic field in said three dimensional region and a second of said sets of magnets is configured to
- produce a correction to said bulk component of said magnetic field in said three dimensional region to
- reduce a non-uniformity of said bulk component of said magnetic field in said three dimensional (3D) region.

6. A superconducting magnet system as claimed in claim 5, wherein said first of said sets of magnets is configured to produce said bulk component of said magnetic field, and wherein said further magnet is disposed between said oppositely disposed pair of superconducting magnets.

7. A superconducting magnet system as claimed in claim 6, and wherein said 3D region is adjacent said further magnet.

8. A superconducting magnet system as claimed in claim 5, wherein said further magnet is a superconducting magnet and is configured to produce said bulk component of said magnetic field, and wherein said oppositely disposed pair of superconducting magnets is configured to provide said correction to said magnetic field.

9. A superconducting magnet system as claimed in claim 8 wherein said oppositely disposed pair of superconducting magnets is disposed to one side of said further superconducting magnet.

10. A superconducting magnet system as claimed in claim 5, wherein magnetic field lines between said oppositely disposed pair of superconducting magnets define a first direction, wherein said superconducting magnet system extends in a third direction (z) orthogonal to said first direction, wherein edges of said oppositely disposed pair of superconducting magnets and of said further magnet towards said 3D region each define a substantially planar surface, and wherein said planar surfaces defined by said edges of a said oppositely disposed pair of superconducting magnets are substantially orthogonal to said planar surface defined by said edge of said further superconducting magnet.

11. superconducting magnet system as claimed in claim 10, wherein said set of superconducting magnets configured to produce said bulk component of said magnetic field comprises a set of superconducting magnets each extending longitudinally substantially parallel to said field lines and arranged along said third direction.

12. A superconducting magnet system as claimed in claim 11, wherein said longitudinally extending superconducting magnets are generally cylindrical.

13. A superconducting magnet system as claimed in claim 10, wherein said set of superconducting magnets configured to produce said correction to said magnetic field comprises a plurality of magnets disposed perpendicular to said field lines and to perpendicular said third direction.

14. A superconducting magnet system as claimed in claim 5, the system comprising at least three superconducting magnets, and wherein a said further magnet is a superconducting magnet.

15. A superconducting magnet system as claimed in claim 5, wherein each of said first and second sets of magnets comprises at least a pair of oppositely disposed superconducting magnets.

16. A superconducting magnet system comprising first and second oppositely disposed arrays of superconducting magnets to produce a first set of magnetic field lines and at least one further magnet disposed between or to one side of said oppositely disposed arrays.

17. A superconducting magnet system as claimed in claim 16, herein said further magnet is located such that there is at least one region in which field lines from said further magnet are substantially parallel to field lines from said oppositely disposed arrays.

18. A superconducting magnet system as claimed in claim 16, wherein a said further magnet comprises a superconducting magnet.

19. A superconducting magnet system as claimed in claim 16, wherein said further magnet comprises an array of superconducting magnets.

20. A superconducting magnet system as claimed in claim 16, comprising an oppositely disposed pair of said further magnets, and wherein said further magnets comprise superconducting magnets.

* * * * *